(12) United States Patent
Inuzuka

(10) Patent No.: US 11,699,478 B2
(45) Date of Patent: Jul. 11, 2023

(54) SEMICONDUCTOR MEMORY DEVICE IN WHICH DATA WRITING TO CELLS IS CONTROLLED USING PROGRAM PULSES

(71) Applicant: Kioxia Corporation, Tokyo (JP)

(72) Inventor: Yuki Inuzuka, Yokohama (JP)

(73) Assignee: Kioxia Corporation, Tokyo (JP)

( * ) Notice: Subject to any disclaimer, the term of this patent is extended or adjusted under 35 U.S.C. 154(b) by 16 days.

(21) Appl. No.: 17/445,643

(22) Filed: Aug. 23, 2021

(65) Prior Publication Data

US 2022/0208247 A1 Jun. 30, 2022

(30) Foreign Application Priority Data

Dec. 25, 2020 (JP) ................. 2020-217983

(51) Int. Cl.
| | |
|---|---|
| *G11C 8/08* | (2006.01) |
| *G11C 11/408* | (2006.01) |
| *G11C 11/4094* | (2006.01) |
| *G11C 5/06* | (2006.01) |
| *G11C 11/4074* | (2006.01) |
| *G11C 11/4099* | (2006.01) |
| *G11C 16/32* | (2006.01) |
| *G11C 16/04* | (2006.01) |
| *G11C 16/10* | (2006.01) |
| *G11C 16/08* | (2006.01) |
| *G11C 8/14* | (2006.01) |

(52) U.S. Cl.
CPC ............ *G11C 11/4085* (2013.01); *G11C 5/06* (2013.01); *G11C 11/4074* (2013.01); *G11C 11/4094* (2013.01); *G11C 11/4099* (2013.01); *G11C 16/0483* (2013.01); *G11C 16/08* (2013.01); *G11C 16/10* (2013.01); *G11C 16/32* (2013.01); *G11C 8/08* (2013.01); *G11C 8/14* (2013.01)

(58) Field of Classification Search
CPC ...... G11C 16/0483; G11C 16/10; G11C 16/08; G11C 16/26; H01L 27/11556; H01L 27/11524
See application file for complete search history.

(56) References Cited

U.S. PATENT DOCUMENTS

| | | |
|---|---|---|
| 2017/0271021 A1 | 9/2017 | Futatsuyama et al. |
| 2018/0277565 A1 | 9/2018 | Futatsuyama et al. |

(Continued)

FOREIGN PATENT DOCUMENTS

| | | |
|---|---|---|
| JP | 2017-168163 A | 9/2017 |
| JP | 2018-164070 A | 10/2018 |

*Primary Examiner* — Mushfique Siddique
(74) *Attorney, Agent, or Firm* — Oblon, McClelland, Maier & Neustadt, L.L.P.

(57) ABSTRACT

A semiconductor memory device includes a first semiconductor pillar having i first memory cells on a first side and i second memory cells on a second side, a second semiconductor pillar having i third memory cells on a third side and i fourth memory cells on a fourth side, i first word lines (i is an integer of 4 or more) connected to the i first memory cells and the i third memory cells, i second word lines connected to the i second memory cells and the i fourth memory, and a driver. In writing data to the k-th (k is smaller than i and greater than 1) first memory cell, the driver supplies the k-th first word line with a first voltage larger than a reference voltage, and supplies the k-th second word line with a second voltage smaller than the reference voltage.

13 Claims, 30 Drawing Sheets

(56) References Cited

U.S. PATENT DOCUMENTS

| | | | |
|---|---|---|---|
| 2020/0273500 A1* | 8/2020 | Takada | G11C 16/0483 |
| 2020/0303389 A1* | 9/2020 | Nakatsuka | H01L 23/528 |
| 2021/0013227 A1* | 1/2021 | Futatsuyama | G11C 16/26 |
| 2022/0284962 A1* | 9/2022 | Ikegami | G11C 16/3459 |

* cited by examiner

FIG. 18

|     | MG0 | MG1 | MG2 | MG3 |
|-----|-----|-----|-----|-----|
| WL7 | 29  | 30  | 31  | 32  |
| WL6 | 25  | 26  | 27  | 28  |
| WL5 | 21  | 22  | 23  | 24  |
| WL4 | 17  | 18  | 19  | 20  |
| WL3 | 13  | 14  | 15  | 16  |
| WL2 | 9   | 10  | 11  | 12  |
| WL1 | 5   | 6   | 7   | 8   |
| WL0 | 1   | 2   | 3   | 4   |

FIG. 30

|  | MG0 | MG1 | MG2 | MG3 |
|---|---|---|---|---|
| WL7 | 1 | 2 | 3 | 4 |
| WL6 | 5 | 6 | 7 | 8 |
| WL5 | 9 | 10 | 11 | 12 |
| WL4 | 13 | 14 | 15 | 16 |
| WL3 | 17 | 18 | 19 | 20 |
| WL2 | 21 | 22 | 23 | 24 |
| WL1 | 25 | 26 | 27 | 28 |
| WL0 | 29 | 30 | 31 | 32 |

US 11,699,478 B2

SEMICONDUCTOR MEMORY DEVICE IN WHICH DATA WRITING TO CELLS IS CONTROLLED USING PROGRAM PULSES

CROSS-REFERENCE TO RELATED APPLICATION(S)

This application is based upon and claims the benefit of priority from the prior Japanese Patent Application No. 2020-217983, filed on Dec. 25, 2020, the entire contents of which are incorporated herein by reference.

FIELD

One embodiment described herein relates generally to a semiconductor memory device.

BACKGROUND

A NAND flash memory is known as a non-volatile semiconductor memory device.

BRIEF DESCRIPTION OF THE DRAWINGS

FIG. 18 is a diagram showing an example of the order of data writing to a memory cell according to an embodiment;

FIG. 30 is a diagram showing an example of the order of data writing to a memory cell according to an embodiment.

DETAILED DESCRIPTION

Figure 1:
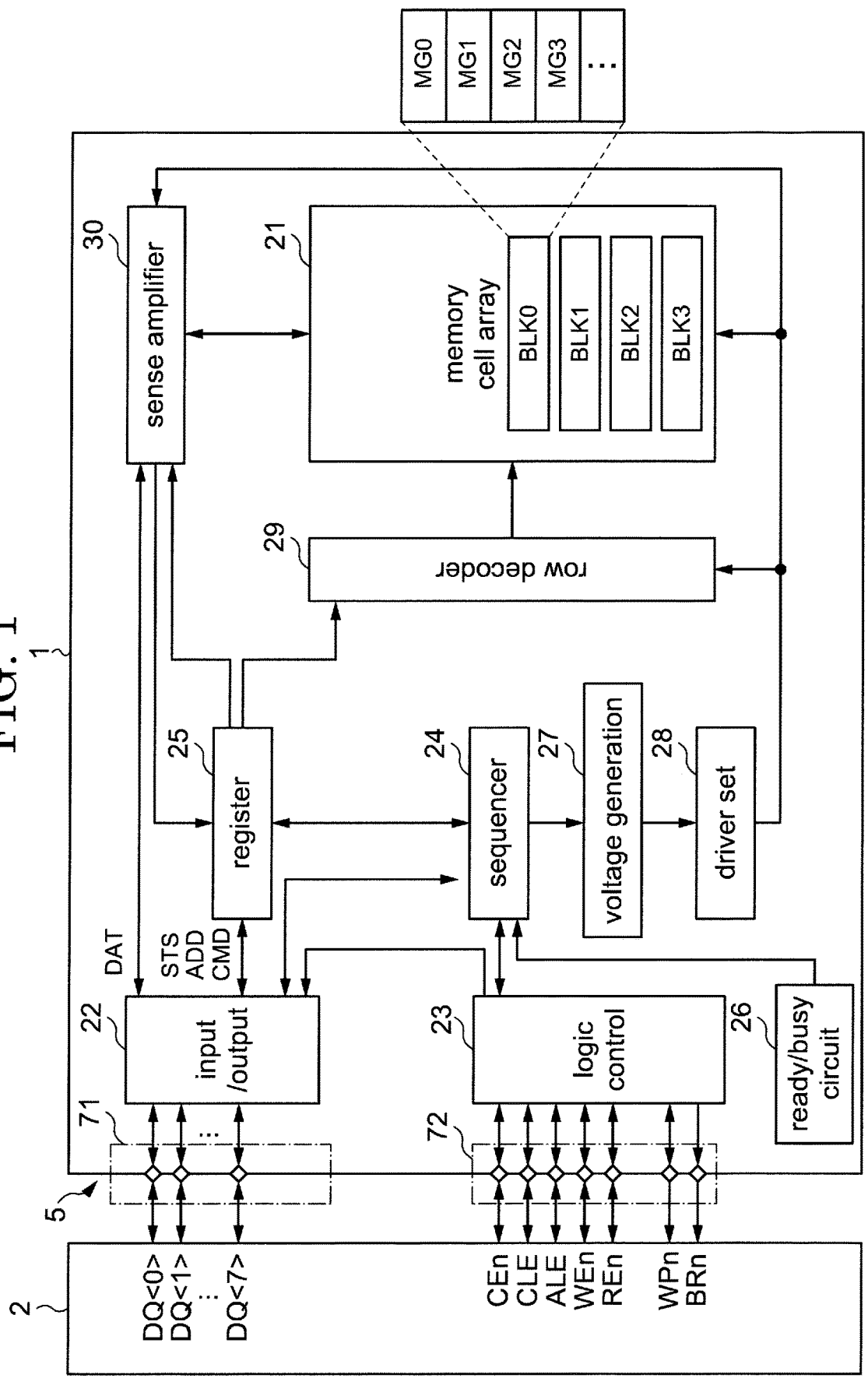
FIG. 1 is a block diagram showing a configuration of a memory system including a semiconductor memory device according to an embodiment.

A semiconductor memory device includes a source line extending in a first direction and a second direction intersecting the first direction, a first semiconductor pillar having a first semiconductor layer extending in a third direction intersecting the first direction and the second direction and electrically connected to the source line, a second semiconductor pillar having a second semiconductor layer extending in the third direction and electrically connected to the source line, i first word lines (i is an integer of 4 or more) stacked in the third direction, i second word lines stacked in the third direction and having the same positions as the i first word lines with respect to the third direction respectively, and a driver, wherein the first semiconductor pillar has a first string provided on a first side and a second string provided on a second side, the first string has i first memory cells, the i first memory cells are electrically connected in series, arranged along the third direction, and connected to the i first word lines respectively, the second string has i second memory cells, the i second memory cells are electrically connected in series, arranged along the third direction, and connected to the i second word lines respectively, the second semiconductor pillar has a third string provided on a third side and a fourth string provided on a fourth side, the third string has i third memory cells, the i third memory cells are electrically connected in series, arranged along the third direction, and connected to the i first word lines respectively, the fourth string has i fourth memory cells, the i fourth memory cells are electrically connected in series, arranged along the third direction, and connected to the i second word lines respectively, a position of the first of the first word line of the i first word lines is closest to a position of the source line, and a position of the i-th of the first word line of the i first word lines is farthest from the position of the source line, a position of the first of the second word line of the i second word lines is closest to the position of the source line, and the position of the i-th of the second word line of the i second word lines is farthest from the position of the source line, the i first memory cells and the i second memory cells share the first semiconductor layer, the i third memory cells and the i fourth memory cells share the second semiconductor layer, when writing data to the k-th (k is an integer smaller than i and greater than 1) first memory cell, in a first operation of the writing operation, the driver supplies the k-th first word line with a first voltage larger than a reference voltage, and supplies the k-th second word line with a second voltage smaller than the reference voltage.

Hereinafter, referring to the drawings, a semiconductor memory device according to an embodiment will be described. In the following description, components having the same or similar functions and configurations are denoted by common reference numerals. When distinguishing multiple components having a common reference numeral, the common reference numeral is distinguished by a subscript (e.g., uppercase or lowercase alphabet).

In the following description, a signal X<n:0> (n is a natural number) is a (n+1) bits signal, and means a set of signals X<0>, X<1>, . . . , and X<n>, each of which is a 1-bit signal. A component Y<n:0> means a set of components Y<0>, Y<1>, . . . , and Y<1> corresponding one-to-one to an input or output of the signal X<0>.

First Embodiment

Hereinafter, a semiconductor memory device 1 according to the first embodiment will be described.
<1. Configuration Example>
<1-1. Memory System>

FIG. 1 is a block diagram showing an example of a configuration of a memory system 3 including the semiconductor memory device 1 according to the first embodiment. The configuration of the memory system 3 including the semiconductor memory device 1 according to an embodiment is not limited to the configuration shown in FIG. 1.

As shown in FIG. 1, the memory system 3 includes the semiconductor memory device 1 and a memory controller 2. The memory system 3 may be, for example, an SSD (solid state drive) or a memory card such as an SDTM card, or the like. The memory system 3 may include a host device (not shown).

The semiconductor memory device 1 is connected to, for example, the memory controller 2. The semiconductor memory device 1 is controlled using the memory controller 2. The memory controller 2 receives, for example, an instruction required for the operation of the semiconductor memory device 1 from the host device and transmits the instruction to the semiconductor memory device 1. The memory controller 2 transmits the instruction to the semiconductor memory device 1 and controls reading of data from the semiconductor memory device 1, writing of data to the semiconductor memory device 1, or erasing of data in the semiconductor memory device 1. In an embodiment, the semiconductor memory device 1 is, for example, a NAND flash memory.

<1-2. Configuration of Semiconductor Memory Device>

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 70, an input/output pad group 71, and a logic control pad group 72. In the semiconductor memory device 1, various operations such as a write operation for storing the write data DAT in the memory cell array 21 and a read operation for reading the read data DAT from the memory cell array 21, and the like are executed. The configuration of the semiconductor memory device 1 according to an embodiment is not limited to the configuration shown in FIG. 1.

The memory cell array 21 is connected to, for example, the sense amplifier 70, the row decoder 29, and the driver set 28. The memory cell array 21 includes blocks BLK0, BLK1, BLKn (n is an integer higher than or equal to 1). As will be described in detail later, each of the blocks BLK includes a plurality of memory groups MG (MG0, MG1, MG2, . . . ). Each of the memory groups MG contains a plurality of non-volatile memory cells associated with a bit line and a word line. The block BLK is, for example, an erasure unit of data. The data held in the memory cell transistors MT (FIG. 2) included in the same block BLK is collectively erased.

In the semiconductor memory device 1, for example, a TLC (Triple-Level cell) method or a QLC (Quadruple Level Cell) method can be applied. In the TLC method, 3-bit data is held in each memory cell, and in the QLC method, 4-bit data is held in each memory cell. Each memory cell may hold 2-bit data or less or may hold 5-bit data or more.

The input/output circuit 22 is connected to, for example, the register 25, the logic control circuit 23, and the sense amplifier 70. The input/output circuit 22 controls the transmission and reception of a data signal DQ<7:0> between the memory controller 2 and the semiconductor memory device 1.

The data signal DQ<7:0> is an 8-bit signal. The data signal DQ<7:0> is an entity of data transmitted and received between the semiconductor memory device 1 and the memory controller 2. The data signal DQ<7:0> includes a command CMD, data DAT, address information ADD, and status information STS. The command CMD includes, for example, an instruction for executing the instruction sent from the host device (the memory controller 2) to the semiconductor memory device 1. The data DAT includes the write data DAT to the semiconductor memory device 1 or the read data DAT from the semiconductor memory device 1. The address information ADD includes, for example, a column address and a row address for selecting the plurality of non-volatile memory cells associated with the bit line and the word line. The status information STS includes, for example, information on the status of the semiconductor memory device 1 regarding the write operation and the read operation.

More specifically, the input/output circuit 22 includes an input circuit and an output circuit which perform the processing described below. The input circuit receives the write data DAT, the address information ADD, and the command CMD from the memory controller 2. The input circuit transmits the received write data DAT to the sense amplifier 70 and transmits the received address information ADD and the command CMD to the register 25. On the other hand, the output circuit receives the status information STS from the register 25 and receives the read data DAT from the sense amplifier 70. The output circuit transmits the received status information STS and the read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the receiving signal.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address data ADD. The write enable signal WEn and the read enable signal REn are, for example, signals for instructing the input and output of the data signal DQ to the input/output circuit 22. The write protect signal WPn is a signal for instructing the semiconductor memory device 1 to prohibit writing and erasing of data.

The sequencer 24 is connected to, for example, the ready/busy control circuit 26, the sense amplifier 70, and the driver set 28. The sequencer 24 controls the operation of the entire semiconductor memory device 1 based on the command CMD held in a command register. For example, the sequencer 24 controls the sense amplifier 70, the row decoder 29, the voltage generation circuit 27, and the driver set 28 and the like to execute various operations such as the write operation and the read operation.

The register 25 includes, for example, a status register (not shown), an address register (not shown), and a command register (not shown) and the like. The status register receives and holds the status information STS from the sequencer 24 and transmits the status information STS to the input/output circuit 22 based on an instruction from the sequencer 24. The address register receives and holds the address information ADD from the input/output circuit 22. The address register transmits the column address in the address information ADD to the sense amplifier 70 and transmits the row address in the address information ADD to the row decoder 29. The command register receives and holds the command CMD from the input/output circuit 22 and transmits the command CMD to the sequencer 24.

The ready/busy control circuit 26 generates a ready/busy signal R/Bn under the control of the sequencer 24 and transmits the generated ready/busy signal R/Bn to the memory controller 2. The ready/busy signal R/Bn is a signal for notifying whether the semiconductor memory device 1 is in a ready state to accept an instruction from the memory controller 2 or in a busy state to not accept an instruction from the memory controller 2.

The voltage generation circuit 27 is connected to, for example, the driver set 28 or the like. The voltage generation circuit 27 generates a voltage used for the write operation and the read operation or the like based on the control by the sequencer 24 and supplies the generated voltage to the driver set 28.

Figure 7:
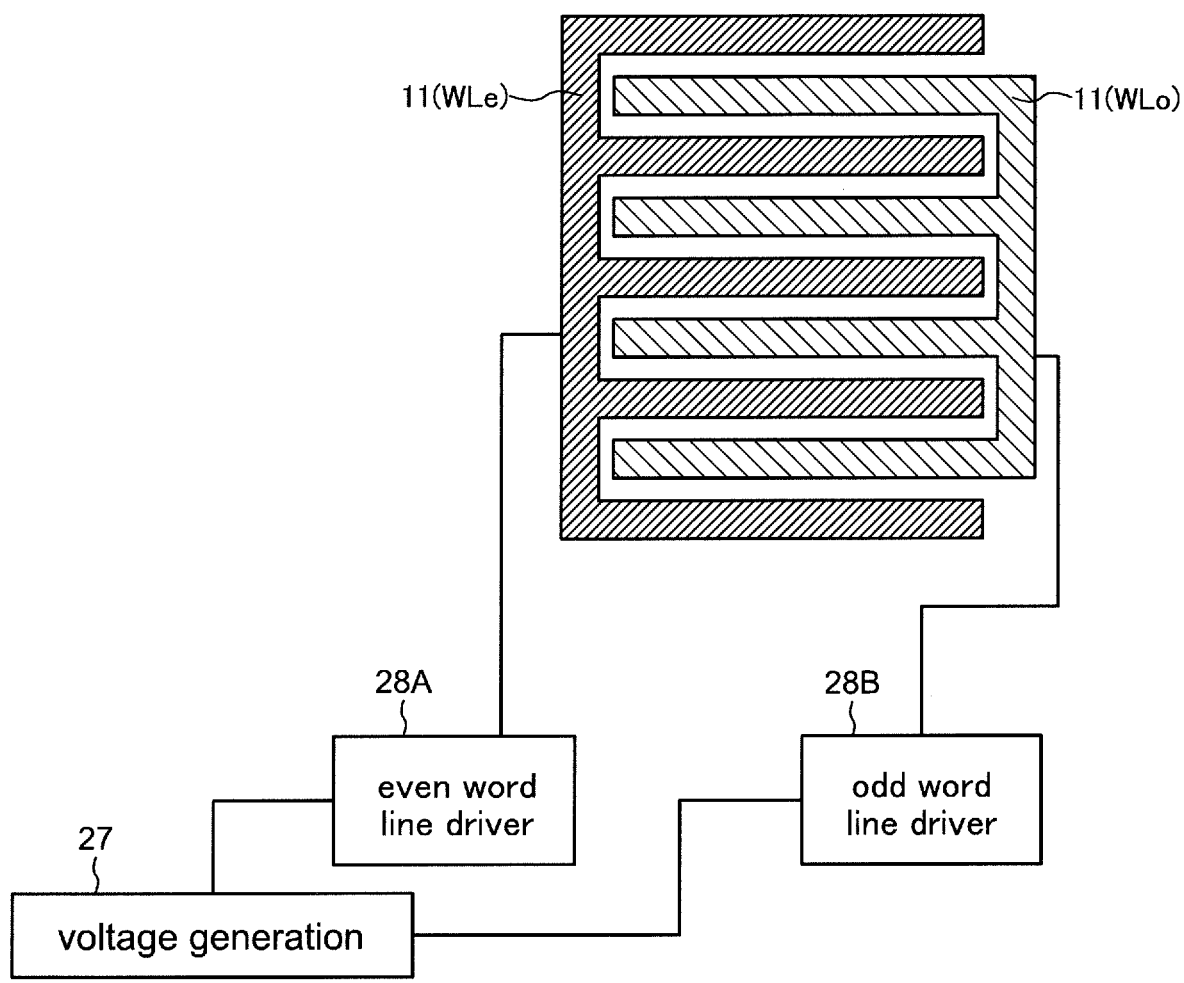
FIG. 7 is a diagram for explaining an electrical connection of a voltage generation circuit, a driver set, a select gate line, or a word line according to an embodiment.

The driver set 28 includes, for example, an even word line driver 28A (FIG. 7) and an odd word line driver 28B (FIG. 7). The driver set 28 is connected to the memory cell array 21, the sense amplifier 70, and the row decoder 29. Based on the voltage supplied from the voltage generation circuit 27, the driver set 28 generates, for example, various voltages to be applied to a select gate line SGD (FIG. 2), a word line WL (FIG. 2), and a source line SL (FIG. 2) or the like in various operations such as the read operation and write operation. The driver set 28 supplies the generated voltage to the even word line driver 28A, the odd word line driver 28B, the sense amplifier 70, the row decoder 29, and the source line SL, or the like.

The row decoder 29 receives the row address from the address register and decodes the received row address. Based on the decoded result, the row decoder 29 selects the block BLK on which various operations such as the read operation and write operation are to be executed. The row decoder 29 can supply the selected block BLK with the voltage supplied from the driver set 28.

The sense amplifier 70 receives, for example, the column address from the address register and decodes the received column address. The sense amplifier 70 executes the transmission and reception operation of the data DAT between the memory controller 2 and the memory cell array 21 based on the decoded result. The sense amplifier 70 includes, for example, a sense amplifier unit (not shown) provided for each bit line. The sense amplifier 70 makes it possible to supply a voltage to a bit line BL by using the sense amplifier unit. For example, the sense amplifier 70 may use the sense amplifier unit to supply a voltage to the bit line. The sense amplifier 70 senses the data read from the memory cell array 21 and generates the read data DAT. Furthermore, the sense amplifier 70 transmits the generated read data DAT to the memory controller 2 via the input/output circuit 22. Further, the sense amplifier 70 receives the write data DAT from the memory controller 2 via the input/output circuit 22. Further, the sense amplifier 70 transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transfers the chip enable signal CEn, the command latch enable signal CLE, the address latch enable signal ALE, the write enable signal WEn, and the read enable signal REn received from the memory controller 2 to the logic control circuit 23. The logic control pad group 72 transfers the ready/busy signal R/Bn received from the ready/busy control circuit 26 to the memory controller 2.

<1-3. Memory Cell Array>

Figure 2:
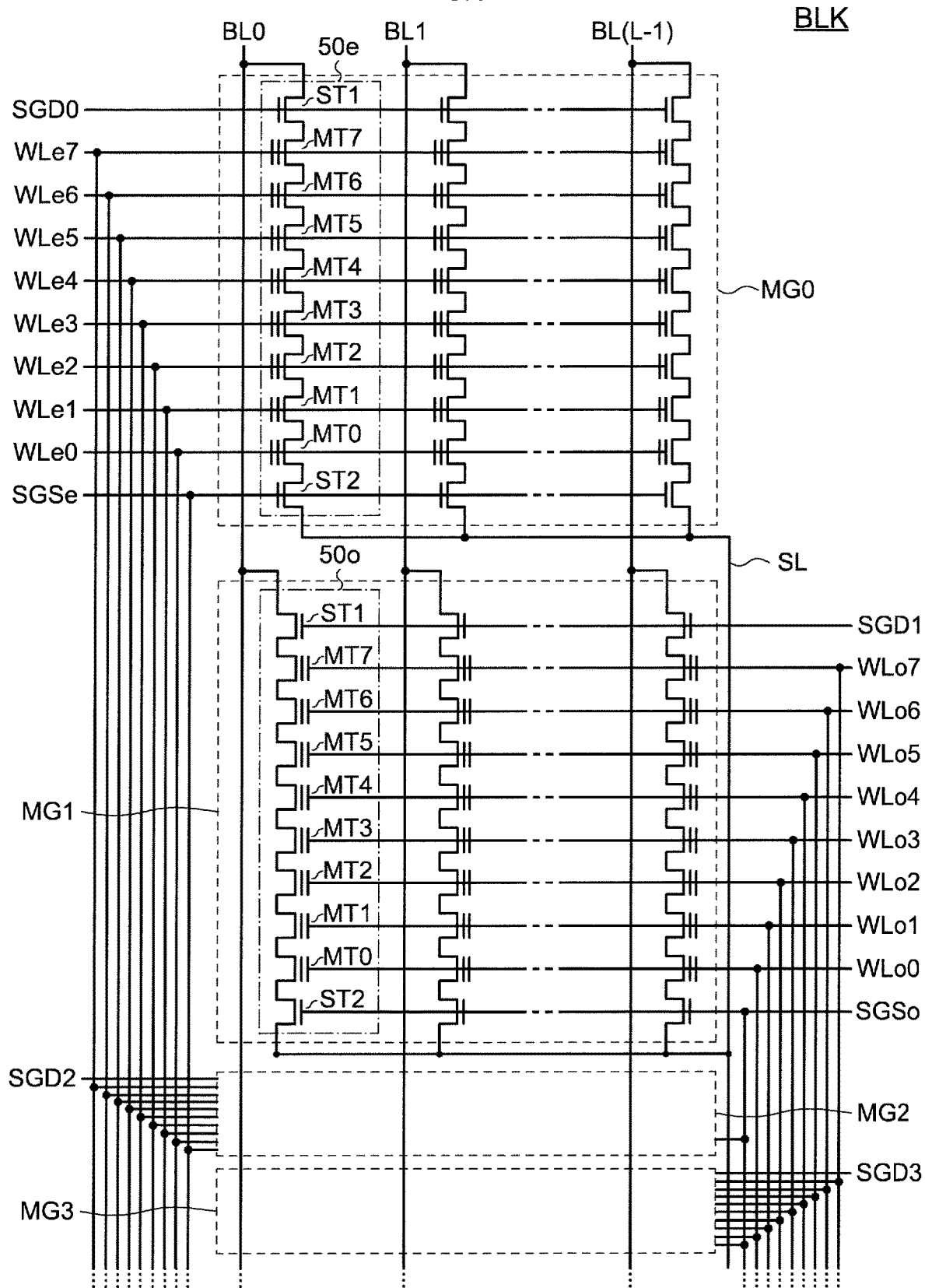
FIG. 2 is a diagram showing a circuit configuration of a memory cell array in a semiconductor memory device according to an embodiment.

FIG. 2 shows an example of a circuit configuration of the memory cell array 21 shown in FIG. 1. FIG. 2 is a diagram showing a circuit configuration of one block BLK among a plurality of blocks BLK included in the memory cell array 21. For example, each of the plurality of blocks BLK included in the memory cell array 21 has the circuit configuration shown in FIG. 2. The configuration of the memory cell array 21 according to an embodiment is not limited to the configuration shown in FIG. 2. In the description of FIG. 2, descriptions of the same or similar components as those of FIG. 1 may be omitted.

As shown in FIG. 2, the block BLK includes the plurality of memory groups MG (MG0, MG1, MG2, MG3). In an embodiment, the write operation and the read operation are executed in units of the memory group MG (page). Each of the memory groups MG includes a plurality of NAND strings 50. For example, the memory groups MG0 and MG2 include a plurality of NAND strings 50e, and the memory groups MG1 and MG3 include a plurality of NAND strings 50o.

Each of the NAND strings 50 includes, for example, eight memory cell transistors MT (MT0 to MT7) and select transistors ST1 and ST2. The memory cell transistor MT includes a control gate and a charge storage layer to hold the data in a non-volatile manner. The memory cell transistor MT is connected in series between the source of the select transistor ST1 and a drain of the select transistor ST2.

Gates of the select transistor ST1 in each of the memory groups MG are respectively connected to the select gate lines SGD (SGD0, SGD1, . . . ). The select gate line SGD is independently controlled by the row decoder 29. Gates of the select transistor ST2 in each of even-numbered memory groups MGe (MG0, MG2, . . . ) are connected to, for example, even select gate lines SGSe. Gates of the select transistor ST2 in each of odd-numbered memory groups MGo (MG1, MG3, . . . ) are connected to, for example, odd select gate lines SGSo. The even select gate line SGSe and the odd select gate line SGSo may be connected to each other and controlled similarly, for example. The even select gate line SGSe and the odd select gate line SGSo may be provided independently and can be controlled independently, for example.

The control gates of the memory cell transistors MT (MT0 to MT7) included in the memory groups MGe in the same block BLK are respectively commonly connected to word lines WLe (WLe0 to WLe7). The control gates of the memory cell transistors MT (MT0 to MT7) included in the memory groups MGo in the same block BLK are respectively commonly connected to word lines WLo (WLo0 to WLo7). The select gate line WLe and the select gate line WLo are independently controlled by the row decoder 29.

A drain of the select transistor ST1 of the NAND string 50 in the same column in the memory cell array 21 is commonly connected to the bit lines BL (BL0 to BL (L−1), where (L−1) is a natural number of 2 or higher). That is, the bit line BL is commonly connected to the NAND string 50 among the plurality of memory groups MG. The source of the plurality of select transistors ST2 is commonly connected to the source line SL. The source line SL is electrically connected to the driver set 28, for example. Under the control of the voltage generation circuit 27 and the driver set 28 using the sequencer 24, the source line SL is supplied with a voltage from the voltage generation circuit 27 or the driver set 28. The semiconductor memory device 1 according to an embodiment may include a plurality of source lines SL. For example, each of the plurality of source lines SL is electrically connected to the driver set 28. Under the control of the voltage generation circuit 27 and the driver set 28 using the sequencer 24, each of the plurality of source lines SL may be supplied with different voltages from each other from the voltage generation circuit 27 or the driver set 28.

The memory group MG includes the plurality of NAND strings 50 connected to different bit lines BL and to the same select gate line SGD. The block BLK includes the plurality of memory groups MG sharing the word line WL. The memory cell array 21 includes a plurality of blocks BLK sharing the bit line BL. In the memory cell array 21, the above-described select gate line SGS, the word line WL, and the select gate line SGD are stacked on a source wire layer, and the memory cell transistor MT is three-dimensionally laminated in three dimensions.

<1-4. Planar Layout of Memory Cell Array>

Figure 3:
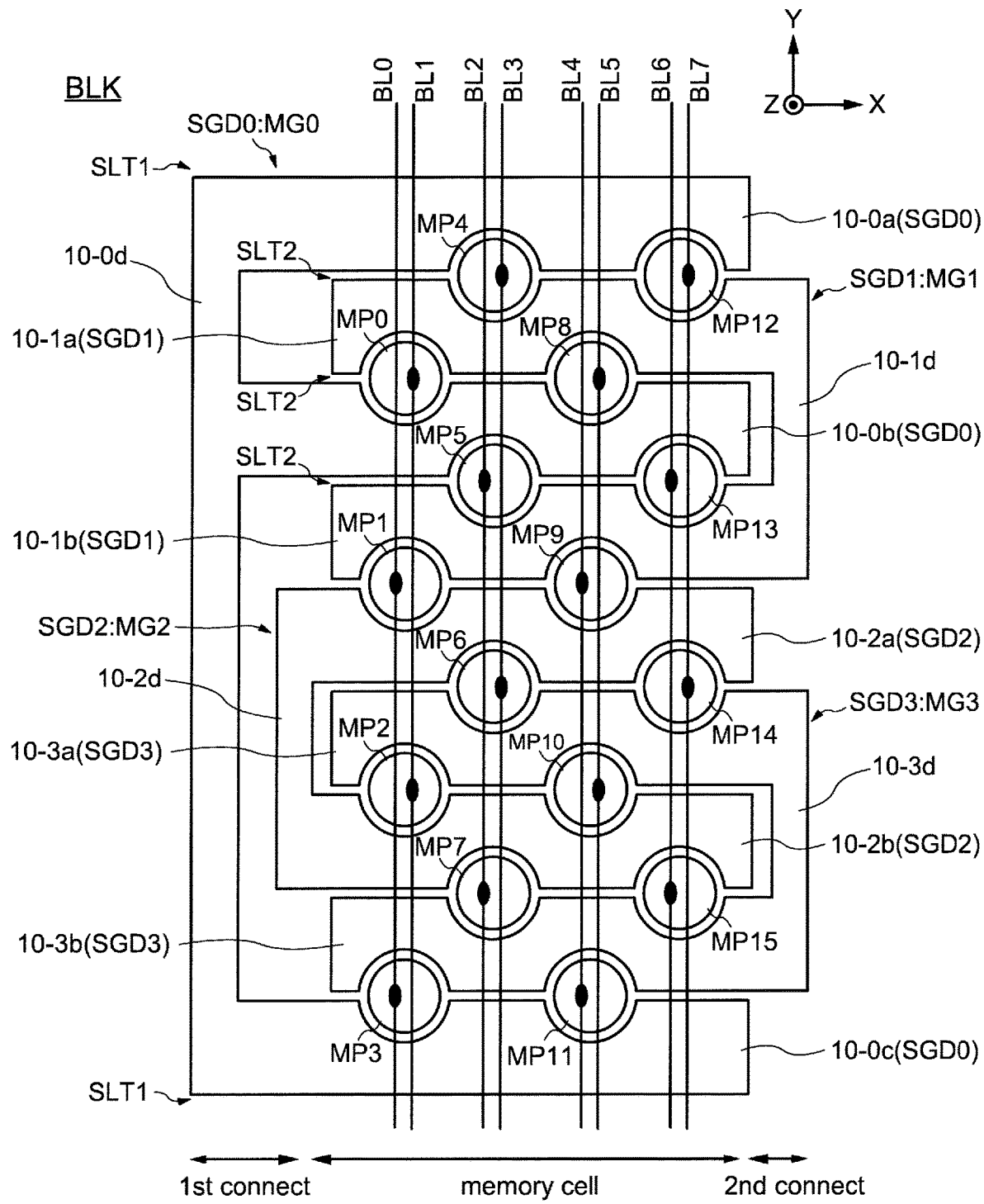
FIG. 3 is a diagram showing a planar layout of select gate lines, bit lines, and memory pillars according to an embodiment.

FIG. 3 is a diagram showing a planer layout of the select gate line SGD in a plane parallel to the source wire layer of a block BLK (X-Y plane). As shown in FIG. 3, in the semiconductor memory device 1 according to an embodiment, for example, four select gate lines SGD are included in one block BLK. The planar layout of the select gate line SGD according to an embodiment is not limited to the layout shown in FIG. 3. In the description of FIG. 3, descriptions of the same or similar components as those of FIGS. 1 and 2 may be omitted.

As shown in FIG. 3, in the semiconductor memory device 1 according to an embodiment, for example, three wiring layers 10-0a, 10-0b, and 10-0c extending in the X-direction are connected using a first connect 10-0d extending in the Y-direction. The wiring layer 10-0a and the wiring layer 10-0c are located at both ends in the Y-direction. The wiring layer 10-0a and the wiring layer 10-0b are adjacent to each other in the Y-direction with one other wiring layer (a wiring layer 10-1a) sandwiched between them. The first connect 10-0d is located at one end in the X-direction. Three wiring layers 10-0a, 10-0b, and 10-0c function as the select gate line SGD0. In an embodiment, for example, the Y-direction is a direction orthogonal to or substantially orthogonal to the X-direction.

The wiring layer 10-1a and a wiring layer 10-1b extending in the X-direction are connected using a second connect 10-1d extending in the Y-direction. The wiring layer 10-1a is located between the wiring layer 10-0a and the wiring layer 10-0b. The wiring layer 10-1b is located between the wiring layer 10-0b and the other one wiring layer (a wiring layer 10-2a). The second connect 10-1d is located at the other end opposite to the first connect 10-0d in the X-direction. Two wiring layers 10-la and 10-1b function as the select gate line SGD1.

The wiring layer 10-2a and a wiring layer 10-2b extending in the X-direction are connected by a first connect 10-2d extending in the Y-direction. Similarly, a wiring layer 10-3a and a wiring layer 10-3b extending in the X-direction are connected by a second connect 10-3d extending in the Y-direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The first connect 10-2d is located at one end on the same side as the first connect 10-0d in the X-direction. The second connect 10-3d is located at the other end opposite to the first connect 10-0d in the X-direction. Two wiring layers 10-2a, 10-2b function as a select gate line SGD2. Two wiring layers 10-3a, 10-3b function as a select gate line SGD3.

In an embodiment, a configuration wherein each wiring layer is connected using the first connect 10-0d and the first connect 10-2d, or the second connect 10-1d and the second connect 10-3d is exemplified but is not limited to this configuration. For example, each wiring layer is independent and is controlled so that the same voltage is supplied to the wiring layer 10-0a, the wiring layer 10-0b, and the wiring layer 10-0c, the same voltage is supplied to the wiring layer 10-1a and the wiring layer 10-1b, the same voltage is supplied to the wiring layer 10-2a and the wiring layer 10-2b, and the same voltage is supplied to the wiring layer 10-3a and the wiring layer 10-3b.

The memory group MG including a memory pillar MP adjacent to the wiring layer 10-0a, the wiring layer 10-0b, and the wiring layer 10-0c is referred to as MG0. The memory group MG including the memory pillar MP adjacent to the wiring layers 10-1a, 10-1b is referred to as MG1. The memory group MG including the memory pillar MP adjacent to the wiring layer 10-2a and the wiring layer 10-2b is referred to as MG2. The memory group MG including the memory pillar MP adjacent to the wiring layer 10-3a and the wiring layer 10-3b is referred to as MG3.

The wiring layers 10 adjacent to each other in the Y-direction in the block BLK are insulated. An area that insulates the adjacent wiring layers 10 is referred to as a slit SLT2. In the slit SLT2, for example, an area from a plane parallel to the source wire layer to the layer where at least the wiring layer 10 is provided is embedded using an insulating film (not shown). In the memory cell array 21, for example, the plurality of blocks BLK shown in FIG. 3 is arranged in the Y-direction. Similar to the adjacent wiring layers 10 in the Y-direction in the block BLK, the space between the adjacent blocks BLK in the Y-direction is embedded using an insulating film (not shown). The space between the adjacent blocks BLK in the Y-direction are also insulated. An area for insulating the adjacent blocks BLK is referred to as a slit SLT1. Similar to the slit SLT2, in the slit SLT1, the insulating film embeds an area from the plane parallel to the source wire layer to the layer where at least the wiring layer 10 is provided.

A plurality of memory pillars MP (MP0 to MP15) is provided between the adjacent wiring layers 10 in the Y-direction. The plurality of memory pillars MP is provided in a memory cell. Each of the plurality of memory pillars MP is provided along the Z-direction. In an embodiment, for example, the Z-direction is a direction orthogonal to or substantially orthogonal to the XY-direction, and orthogonal to or substantially orthogonal to the plane parallel to the source wire layer.

Specifically, the memory pillar MP4 and the memory pillar MP12 are provided between the wiring layer 10-0a and the wiring layer 10-1a. The memory pillar MP0 and the memory pillar MP8 are provided between the wiring layer 10-1a and the wiring layer 10-0b. The memory pillar MP5 and the memory pillar MP13 are provided between the wiring layers 10-0b, 10-1b. The memory pillar MP1 and the memory pillar MP9 are provided between the wiring layer 10-1b and the wiring layer 10-2a. The memory pillar MP6 and the memory pillar MP14 are provided between the wiring layer 10-2a and the wiring layer 10-3a. The memory pillar MP2 and the memory pillar MP10 are provided between the wiring layer 10-3a and the wiring layer 10-2b. The memory pillar MP7 and the memory pillar MP15 are provided between the wiring layer 10-2b and the wiring layer 10-3b. The memory pillars MP3, MP11 are provided between the wiring layer 10-3b and the wiring layer 10-0c.

The memory pillar MP is a structure forming the select transistor ST1, the select transistor ST2, and the memory cell transistor MT. A detailed structure of the memory pillar MP will be described later.

The memory pillars MP0 to MP3 are arranged along the Y-direction. The memory pillars MP8 to MP11 are arranged along the Y-direction at positions adjacent to the memory pillars MP0 to MP3 in the X-direction. That is, the memory pillars MP0 to MP3 and the memory pillars MP8 to MP11 are arranged in parallel.

The respective memory pillars MP4 to MP7 and MP12 to MP15 are arranged along the Y-direction. The memory pillars MP4 to MP7 are located in the X-direction between the memory pillars MP0 to MP3 and the memory pillars MP8 to MP11. The memory pillars MP12 to MP15 are located in the X-direction so as to sandwich the memory pillars MP8 to MP11 together with the memory pillars MP4 to MP7. That is, the memory pillars MP4 to MP7 and the memory pillars MP12 to MP15 are arranged in parallel.

Two bit lines BL0 and BL1 are provided above the memory pillars MP0 to MP3. The bit line BL0 is commonly connected to the memory pillars MP1 and MP2. The bit line BL1 is commonly connected to the memory pillars MP0 and MP3. Two bit lines BL2 and BL3 are provided above the memory pillars MP4 to MP7. The bit line BL2 is commonly connected to the memory pillars MP4 and MP5. The bit line BL3 is commonly connected to the memory pillars MP6 and MP7.

Above the memory pillars MP8 to MP11, two bit lines BL4 and BL5 are provided. The bit line BL4 is commonly connected to the memory pillars MP9 and MP10. Above the memory pillars MP12 to MP15, two bit lines BL6 and BL7 are provided. The bit line BL6 is commonly connected to the memory pillars MP12 and MP13. The bit line BL7 is commonly connected to the memory pillars MP14 and MP15.

As described above, the memory pillar MP is provided at the position straddling the two wiring layers 10 in the Y-direction. The memory pillar MP is provided so as to be embedded in a part of one slit SLT2 of the plurality of slits SL2. One slit SLT2 is provided between the memory pillars MP adjacent to each other in the Y-direction.

The memory pillar MP is not provided between the wiring layer 10-0a and the wiring layer 10-0b adjacent to each other with the slit SLT1 sandwiched therebetween.

Figure 4:
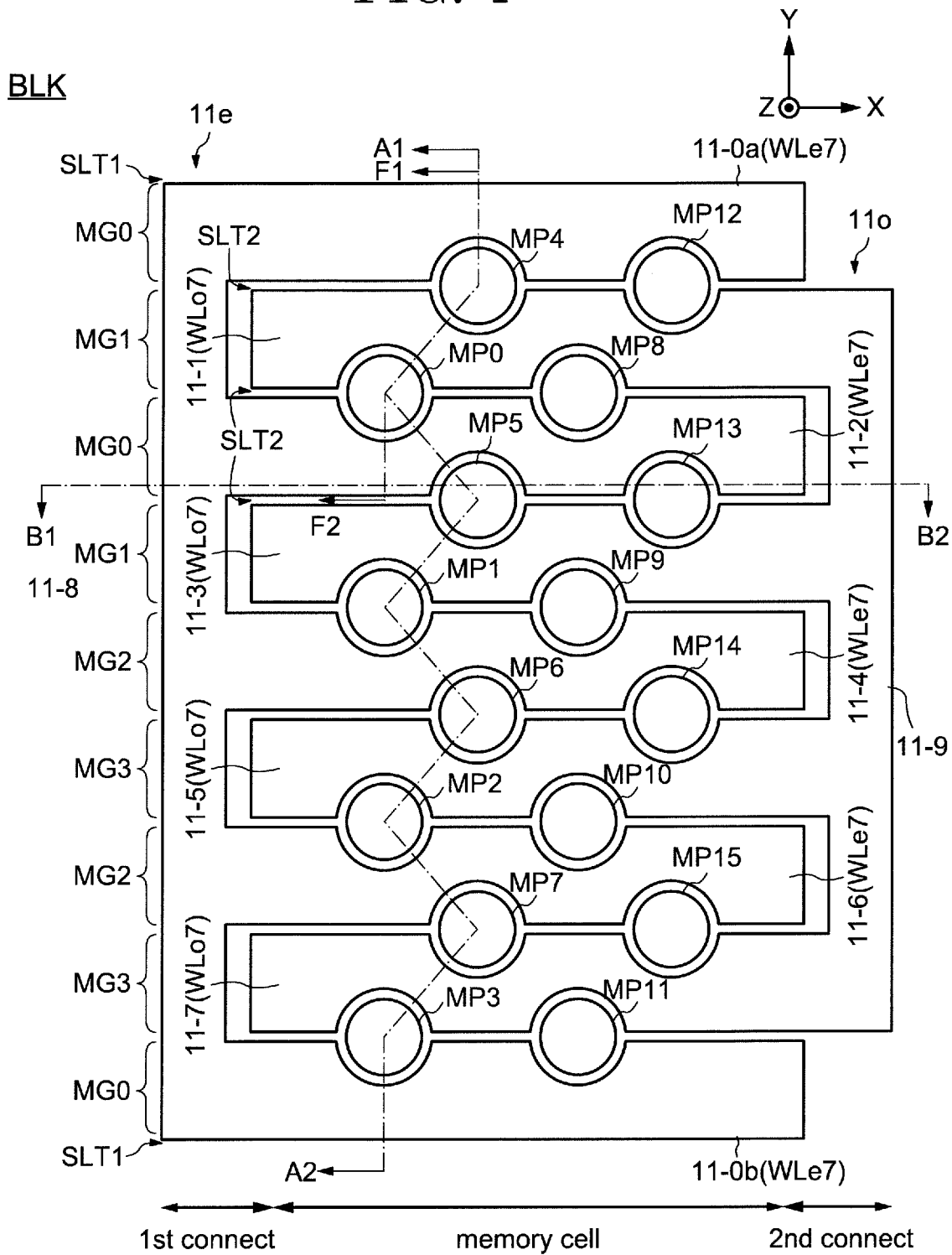
FIG. 4 is a diagram showing a planar layout of word lines and memory pillars according to an embodiment.

FIG. 4 is a diagram showing a planar layout of the word lines WL in the X-Y plane. The layout shown in FIG. 4 corresponds to the layout of an area for one block in FIG. 3 and is a layout of a wiring layer 11 provided in a lower layer than the wiring layer 10 shown in FIG. 3. The planar layout of the word lines WL according to an embodiment is not limited to the layout shown in FIG. 4. In the description of FIG. 4, descriptions of the same or similar components as those of FIGS. 1 to 3 may be omitted.

As shown in FIG. 4, nine wiring layers 11 (wiring layers 11-0 to wiring layer 11-7, where the wiring layer 11-0 includes a wiring layer 11-0a and a wiring layer 11-0b) extending in the X-direction are arranged along the Y-direction. Each wiring layer 11-0 to 11-7 is arranged in the below layer of each wiring layer 10-0 to 10-7 in the Z-direction. Insulating films are provided between the wiring layers 11-0 to 11-7 and the wiring layers 10-0 to 10-7. The wiring layers 11-0 to 11-7 and the wiring layers 10-0 to 10-7 are insulated from each other.

The wiring layer 11 functions as a word line WL7. Other word lines WL0 to WL6 have the same configuration and function as the word line WL7. In the example shown in FIG. 4, the wiring layer 11-0a, the wiring layer 11-2, the wiring layer 11-4, the wiring layer 11-6, and the wiring layer 11-0b function as the word line WLe7. The wiring layer 11-0a, the wiring layer 11-2, the wiring layer 11-4, the wiring layer 11-6, and the wiring layer 11-0b are connected using a first connect 11-8 extending in the Y-direction. The first connect 11-8 is provided at one end in the X-direction. In the first connect 11-8, the wiring layer 11-0a, the wiring layer 11-2, the wiring layer 11-4, the wiring layer 11-6, and the wiring layer 11-0b are connected to the row decoder 29. In an embodiment, the first connect 11-8 and the wiring layer 11-0a, the wiring layer 11-2, the wiring layer 11-4, the wiring layer 11-6, and the wiring layer 11-0b may be collectively referred to as a wiring layer 11e.

The wiring layer 11-1, the wiring layer 11-3, the wiring layer 11-5, and the wiring layer 11-7 function as the word line WLo7. The wiring layer 11-1, the wiring layer 11-3, the wiring layer 11-5, and the wiring layer 11-7 are connected using a second connect 11-9 extending in the Y-direction. The second connect 11-9 is provided on the other end opposite to the first connect 11-8 in the X-direction. In the second connect 11-9, the wiring layer 11-1, the wiring layer 11-3, the wiring layer 11-5, the wiring layer 11-7 are connected to the row decoder 29. In an embodiment, the second connect 11-9 and the wiring layer 11-1, the wiring layer 11-3, the wiring layer 11-5, and the wiring later 11-7 may be collectively referred to as a wiring layer 11o.

A memory cell is provided between the first connect 11-8 and the second connect 11-9. In the memory cell, the wiring layers 11 adjacent to each other in the Y-direction are isolated by the slit SLT2 shown in FIG. 3. The wiring layers 11 between the blocks BLK adjacent to each other in the Y-direction are isolated by the slit SLT1, as is the slit SLT2. The memory cell portion includes the memory pillars MP0 to MP15 as in FIG. 3.

The select gate line SGS and the word lines WL0 to WL6 have the same configuration as the word line WL7 shown in FIG. 4.

<1-5. Structure of End of a Cutting Area of Memory Cell Array>

Figure 5:
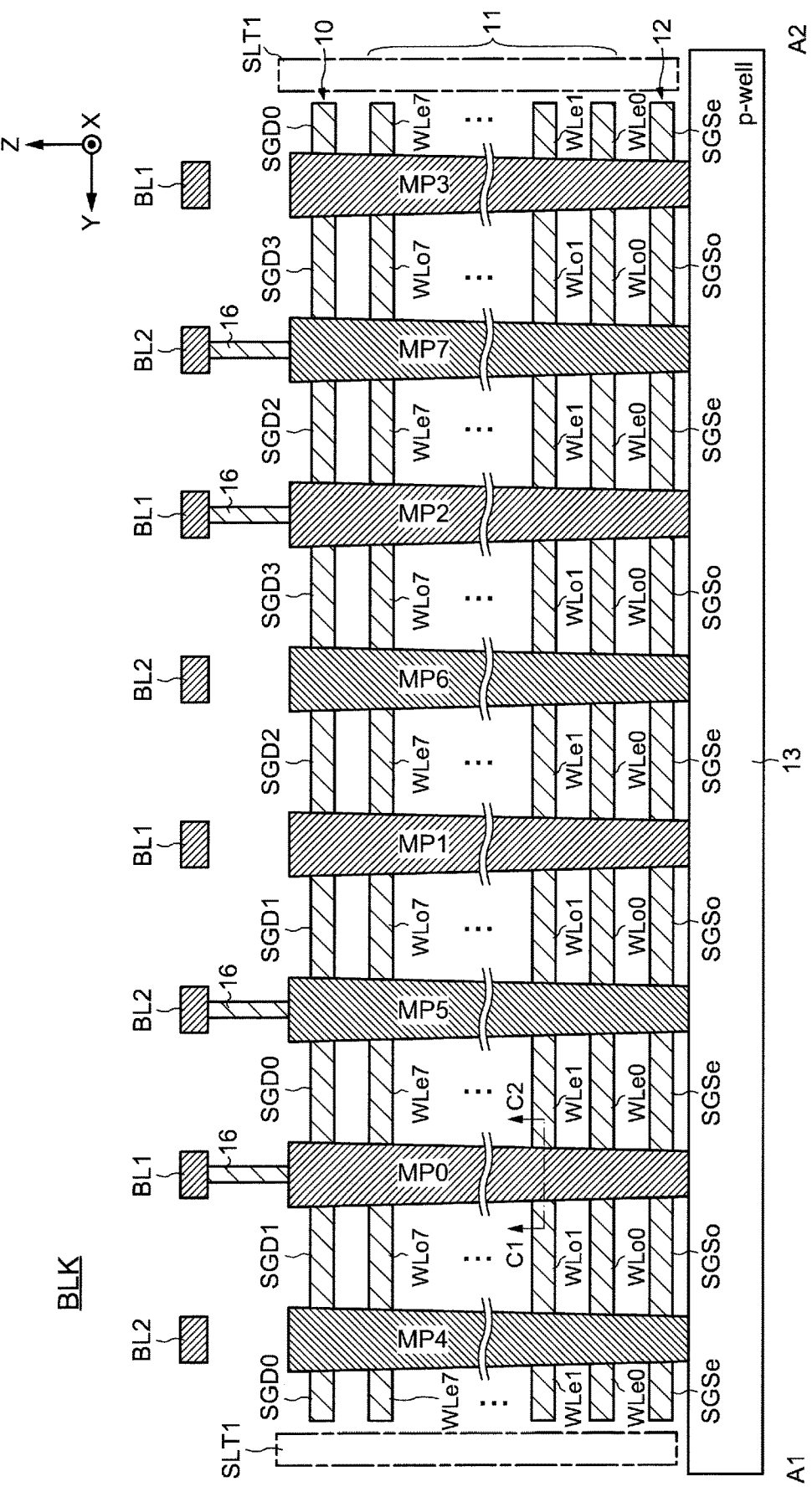
FIG. 5 is an end view of a cutting area A1-A2 of a semiconductor memory device shown in FIGS. 3 and 4.
Figure 6:
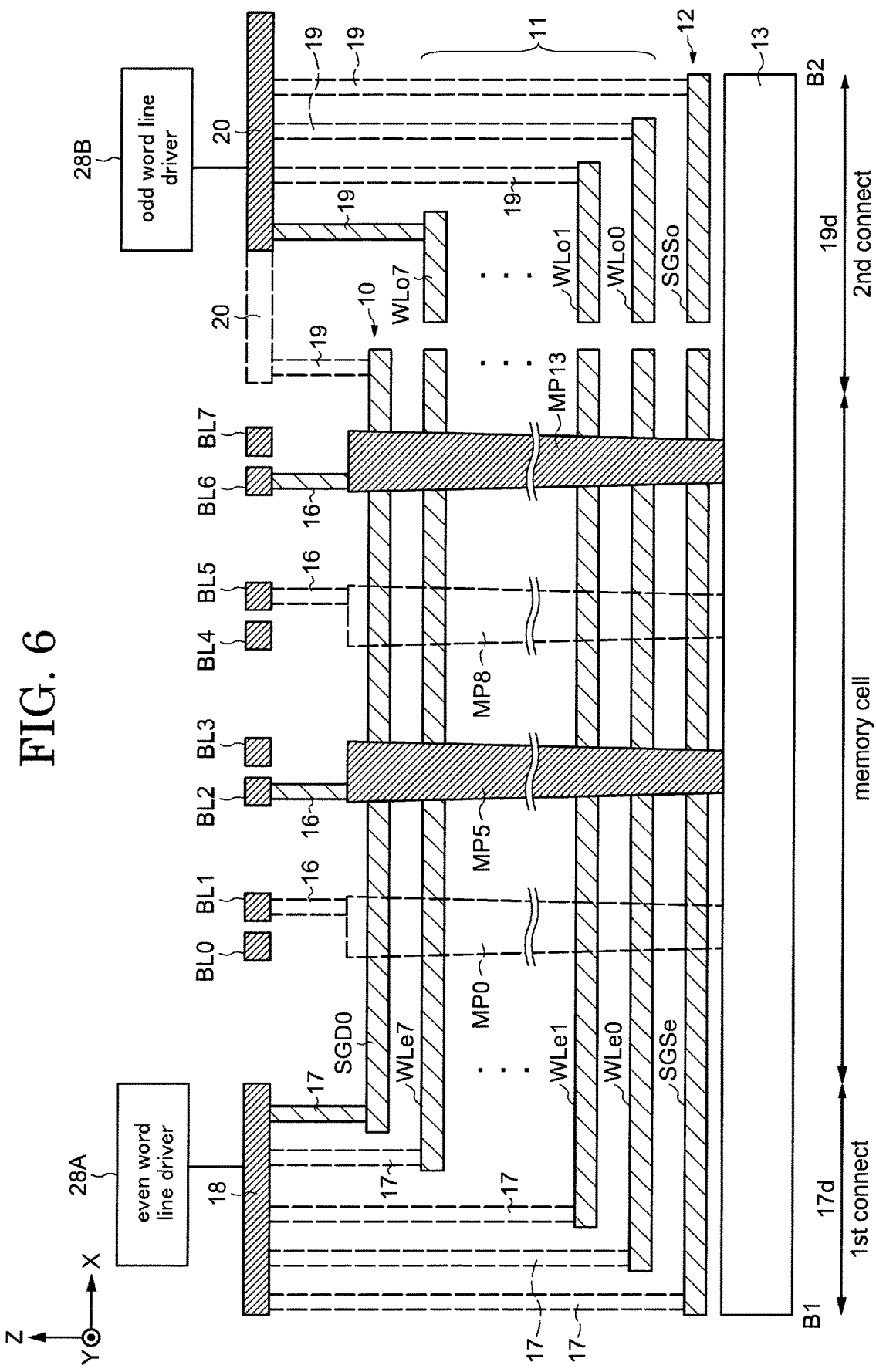
FIG. 6 is an end view of a cutting area B1-B2 of a semiconductor memory device shown in FIGS. 3 and 4.

FIG. 5 is a diagram showing an end view of a cutting area A1-A2 shown in FIG. 6. The end view of a cutting area of the block BLK according to an embodiment is not limited to the end view of a cutting area shown in FIG. 5. In the description of FIG. 5, descriptions of the same or similar components as those of FIGS. 1 to 4 may be omitted.

As shown in FIG. 5, a wiring layer 12 is provided above a source line layer 13 along the Z-direction. The source line layer 13 functions as the source line SL. The wiring layer 12 may be provided on a p-type well (p-well) area in a semiconductor substrate instead of the source line layer 13 shown in FIG. 5. In this case, the source line SL is electrically connected to the p-type well area in a semiconductor substrate. The wiring layer 12 functions as the select gate line SGS. Eight wiring layers 11 are laminated over the wiring layer 12 along the Z-direction. The wiring layer 11 functions as the word line WL. Eight wiring layers 11 correspond one-to-one to the word lines WL0 to WL7. FIG. 4 is a diagram showing a planar layout of the wiring layer 11 functioning as the word line WL, FIG. 3 is a diagram showing a planar layout of the wiring layer 10 functioning as the select gate line SGD. A planar layout of the wiring layer 12 functioning as the select gate line SGS, for example, is a layout that the wiring layer 10 functioning as the select gate line SGD shown in FIG. 3 is replaced with the wiring layer 12 functioning as the select gate line SGS. The plurality of word lines WL stacked above the wiring layer 12 along the Z-direction may be referred to as i layer word lines WL or "i-th word line", "i-th of the word line", "k-th word line" or "k-th of the word line". For example, the i word lines WLe0 to WLe7 may be referred to as the "the i word line", the "i-th of the word line", "the k word line", or the "k-th of the word line", and the i word lines WLo0 to WLo7 may be referred to as "i-th of the word line", "k-th word line" or "k-th of the word line". For example, the coefficient i is an integer greater than or equal to 2, and in one embodiment, the coefficient i is an integer greater than or equal to 4. The coefficient k is an integer greater than 1 and less than i. In one embodiment, the case where the coefficient i is 8 is illustrated, and the coefficient k is 3 is illustrated.

The wiring layer 12 functions as the even select gate line SGSe or the odd select gate line SGSo. The even select gate line SGSe and the odd select gate line SGSo are alternately arranged in the Y-direction through a slit SY2. The memory pillar MP is provided between the even select gate line SGSe and the odd select gate line SGSo which are adjacent to each other in the Y-direction.

The wiring layer 11 functions as an even word line WLe or an odd word line WLo. The even word line WLe and the odd word line WLo are alternately arranged in the Y-direction through the slit SY2. The memory pillar MP is provided between the even word line WLe and the odd word line WLo adjacent to each other in the Y-direction. The Memory cells described later are provided between the memory pillar MP and the even word line WLe and between the memory pillar MP and the odd word line WLo.

The slit SLT1 is provided between the blocks BLK adjacent to each other in the Y-direction. As described above, the slit SLT1 is provided with an insulation layer. However, a contact plug or grooved structure formed using a conductor may be provided in the slit SLT1 which is an insulator. If a contact plug or grooved structure formed using a conductor is provided in the slit SLT1, a voltage may be applied in the source line layer 13. The width along the Y-direction of the slit SLT1 is higher than the width along the Y-direction of the slit SLT2.

As shown in FIGS. 3 and 5, the memory pillar MP is electrically connected to the bit line BL. For example, the memory pillar MP0 and the bit line BL1 are connected via a contact plug 16. The memory pillar MP1 and the bit line BL0 are connected via the contact plug 16, the memory pillar MP2 and the bit line BL1 are connected via the contact plug 16, and the memory pillar MP3 and the bit line BL0 are connected via the contact plug 16. Similar to each of the memory pillars MP0 to MP3, each of the memory pillars MP4 to MP7 is connected to the bit line BL2 or BL3, the memory pillars MP8 to MP11 are connected to the bit line BL4 or BL5, and the memory pillars MP12 to MP15 are connected to the bit line BL6 or BL7.

FIG. 6 is a diagram showing an end view of a cutting area B1-B2 of the semiconductor memory device shown in FIG. 3. The end view of a cutting area of the block BLK according to an embodiment is not limited to the end view of a cutting area shown in FIG. 6. In the description of FIG. 6, descriptions of the same or similar components as those of FIGS. 1 to 5 may be omitted. Since the configuration of a stacked structure and the memory cell of the source line layer 13, the wiring layer 12, the wiring layer 11, and the wiring layer 10 is as described with reference to FIG. 5, a description thereof will be omitted. In FIG. 6, the configuration existing in the depth direction of the end view of a cutting area B1-B2 is drawn by a dotted line.

As shown in FIG. 6, in a first connect area 17d, the wiring layer 10, the wiring layer 11, and the wiring layer 12 are provided, for example, in a stepped shape and are drawn from the source line layer 13. That is, when viewed in the X-Y plane, the upper surfaces of each end portion of the wiring layer 10, the eight wiring layers 11, and the wiring layer 12 are exposed in the first connect area 17*d*. Contact plugs 17 are provided on the upper surfaces of each end portion of the wiring layer 10, eight wiring layers 11, and the wiring layer 12 exposed in the first connect area 17*d*. The contact plug 17 is connected to a metal wiring layer 18. For example, by using the metal wiring layer 18, the wiring layer 10 functioning as the even-numbered select gate lines SGD0 and SGD2, the wiring layer 11 functioning as the even-numbered word line WLe, and the wiring layer 12 functioning as the even select gate line SGSe are electrically connected to the even word line driver 28A via the row decoder 29 (FIG. 1).

Similar to the first connect area 17*d*, in a second connect area 19*d*, the wiring layer 10, the wiring layer 11, and the wiring layer 12 are provided, for example, in a stepped shape and are drawn from the source line layer 13. When viewed in the X-Y plane, the upper surfaces of each end portion of the wiring layer 10, eight wiring layers 11, and the wiring layer 12 are exposed in the second connect area 19*d*. A contact plug 19 is provided on the upper surface of the end portion of the wiring layer 10 exposed in the second connect area 19*d*, and on the upper surfaces of each end portion of the eight wiring layers 11 and the wiring layer 12, and the contact plug 19 is connected to a metal wiring layer 20. For example, by using the metal wiring layer 20, the odd-numbered select gate lines SGD1 and SGD3, the wiring layer 11 functioning as the odd word line WLo, and the wiring layer 12 functioning as the odd select gate line SGSo are electrically connected to the odd word line driver 28B via the row decoder 29 (FIG. 1).

The wiring layer 10 may be electrically connected to the row decoder 29 or the even word line driver 28A and the odd word line driver 28B via the second connect area 19*d* instead of the first connect area 17*d*. The wiring layer 10 may also be electrically connected to the row decoder 29 or the even word line driver 28A and the odd word line driver 28B via both the first connect area 17*d* and the second connect area 19*d*.

FIG. 7 is a diagram for explaining an electrical connection of the voltage generation circuit 27, the driver set 28, the select gate line SGD, or the word line WL according to an embodiment. The electrical connection of the voltage generation circuit 27, the driver set 28, the select gate line SGD, or the word line WL according to an embodiment is not limited to the plane shown in FIG. 7. In the description of FIG. 7, descriptions of the same or similar components as those of FIGS. 1 to 6 may be omitted.

As shown in FIG. 7, the wiring layer 11 functioning as the even word line WLe may be connected to the even word line driver 28A, and the wiring layer 11 functioning as the odd word line WLo may be electrically connected to the odd word line driver 28B. As described above, the even word line driver 28A and the odd word line driver 28B are included in the driver set 28. The driver set 28 is electrically connected to the voltage generation circuit 27. The even word line driver 28A and the odd word line driver 28B may generate various voltages using voltages supplied from the voltage generation circuit 27. The even word line driver 28A may supply the generated voltage to the even word line WLe, and the odd word line driver 28B may supply the generated voltage to the odd word line WLo.

<1-6. Structure of End of Cutting Area of Memory Pillar MP and Memory Cell Transistor MT>

<1-6-1. First Example>

Figure 8:
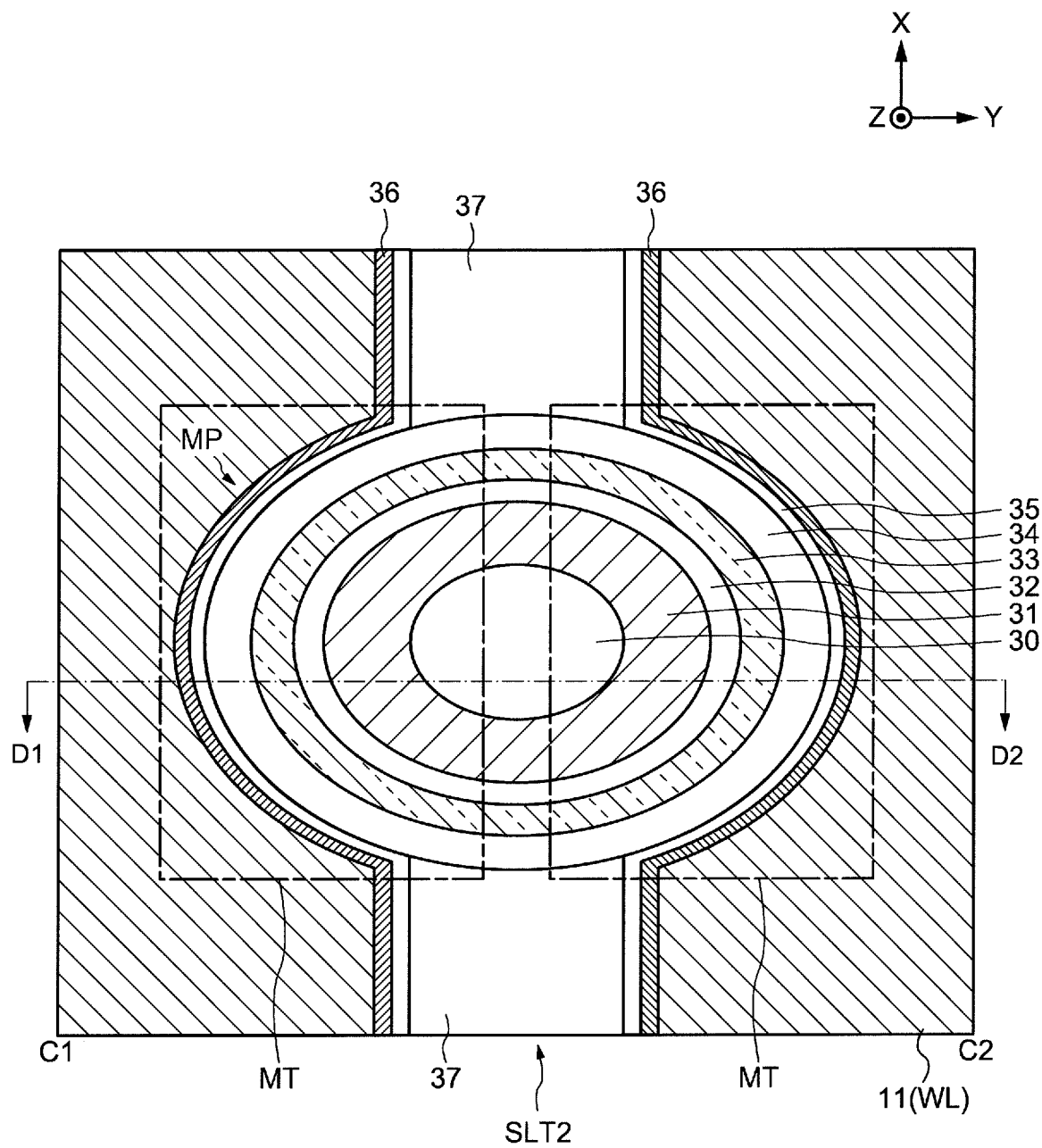
FIG. 8 is an end view of a cutting area C1-C2 of a memory cell transistor shown in FIG. 5.
Figure 9:
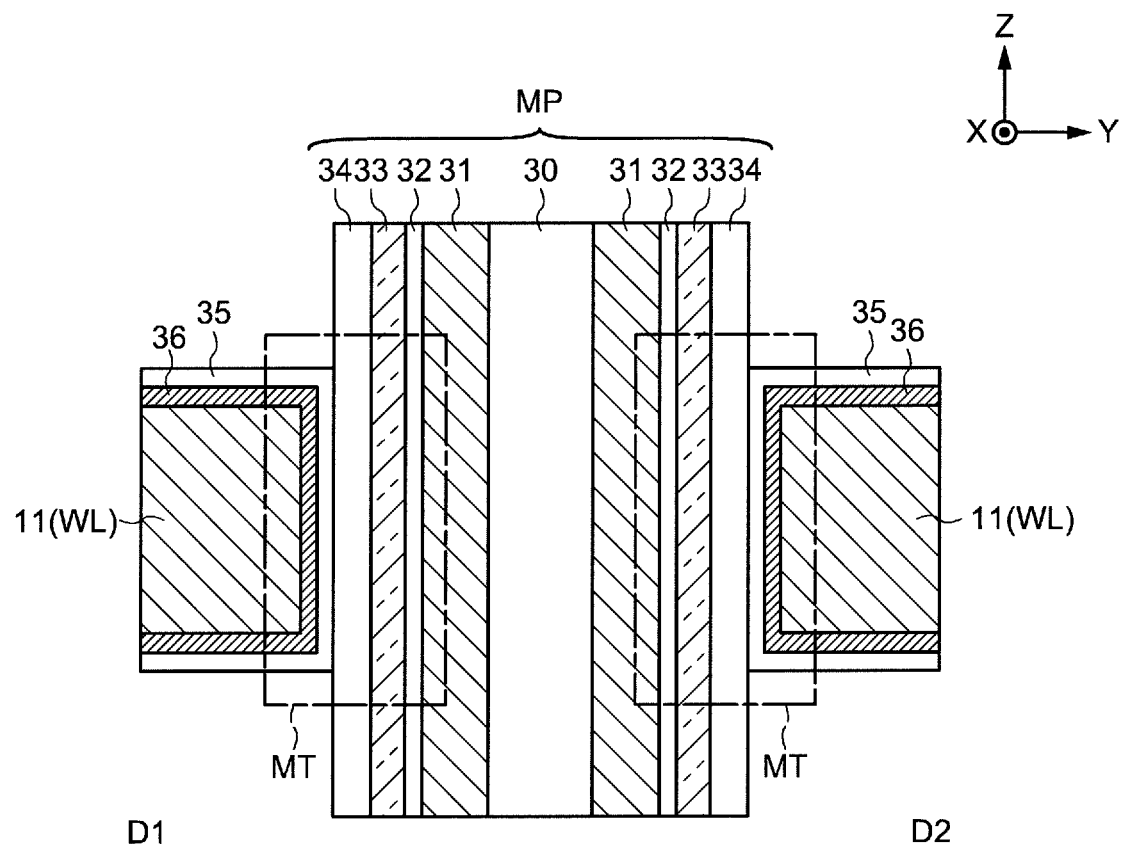
FIG. 9 is an end view of a cutting area D1-D2 of a memory cell transistor shown in FIG. 8.

FIG. 8 is a diagram showing an end view of a cutting area C1-C2 of a memory cell transistor according to an embodiment, and FIG. 9 is a diagram showing an end view of a cutting area D1-D2 of the memory cell transistor shown in FIG. 8. FIGS. 8 and 9 are end views of a cutting area showing an area including two memory cell transistors MT. In the first example, the charge storage layer included in the memory cell transistor MT is an insulating film. The first example of the memory cell transistor according to an embodiment is not limited to the structures shown in FIGS. 8 and 9. In the descriptions of FIGS. 8 and 9, descriptions of the same or similar components as those of FIGS. 1 to 7 may be omitted.

As shown in FIGS. 8 and 9, the memory pillar MP includes an insulation layer 30, a semiconductor layer 31, and insulation layers 32 to 34 provided along the Z-direction. The insulation layer 30 is formed using, for example, a silicon oxide film. The semiconductor layer 31 is provided to surround the periphery of the insulation layer 30 and functions as an area in which a channel of the memory cell transistor MT is formed. The semiconductor layer 31 is formed using, for example, a polycrystalline silicon layer. The semiconductor layer 31 is not separated between the memory cell transistors MT in the same memory pillar MP but is provided continuously. Therefore, the channels formed in each of the two memory cell transistors MT share a part of the memory pillar MP.

As described above, the semiconductor layer 31 is continuous between two facing memory cell transistors MT. Therefore, the channels formed in each of the two facing memory cell transistors MT share a part of the memory pillar MP. Specifically, in FIGS. 8 and 9, in the memory cell transistor MT on the left side (a first memory cell) and the memory cell transistor MT on the right side (the second memory cell) facing each other, the channel formed in the first memory cell (a first channel) and the channel formed in the second memory cell (a second channel) share a part of the memory pillar MP. The two channels share a part of the memory pillar MP means that the two channels are formed by the same memory pillar MP and that the two channels are partially overlapped. In an embodiment, the above configuration may be referred to as a structure in which the two memory cell transistors MT are sharing the channels or the two memory cell transistors MT are facing each other.

The insulation layer 32 is provided to surround the periphery of the semiconductor layer 31, and functions as a gate insulation film of the memory cell transistor MT. the insulation layer 32 is formed using, for example, a stacked structure of a silicon oxide film and a silicon nitride film. The insulation layer 33 is provided to surround the periphery of the semiconductor layer 31 and functions as the charge storage layer of the memory cell transistor MT. The insulation layer 33 is formed using, for example, a silicon nitride film. The insulation layer 34 is provided to surround the periphery of the insulation layer 33 and functions as a block insulation film of the memory cell transistor MT. The insulation layer 34 is formed using, for example, a silicon oxide film. An insulation layer 37 is embedded in the slit SLT2 except for the memory pillar MP. The insulation layer 37 is formed using, for example, a silicon oxide film.

An AlO layer 35 is provided around the memory pillar MP according to an embodiment, for example. A barrier metal layer 36 is provided around the AlO layer 35, for example. The barrier metal layer 36 is formed using, for example, a TiN film. The wiring layer 11 functioning as the word line WL is provided around the barrier metal layer 36. The wiring layer 11 is formed using, for example, a film made of tungsten.

One memory pillar MP according to an embodiment includes two memory cell transistors MT along the Y-direction. Similar to one memory pillar MP, the select transistors ST1 and ST2 also include two transistors along the Y-direction.

<1-6-2. Second Example>

Figure 10:
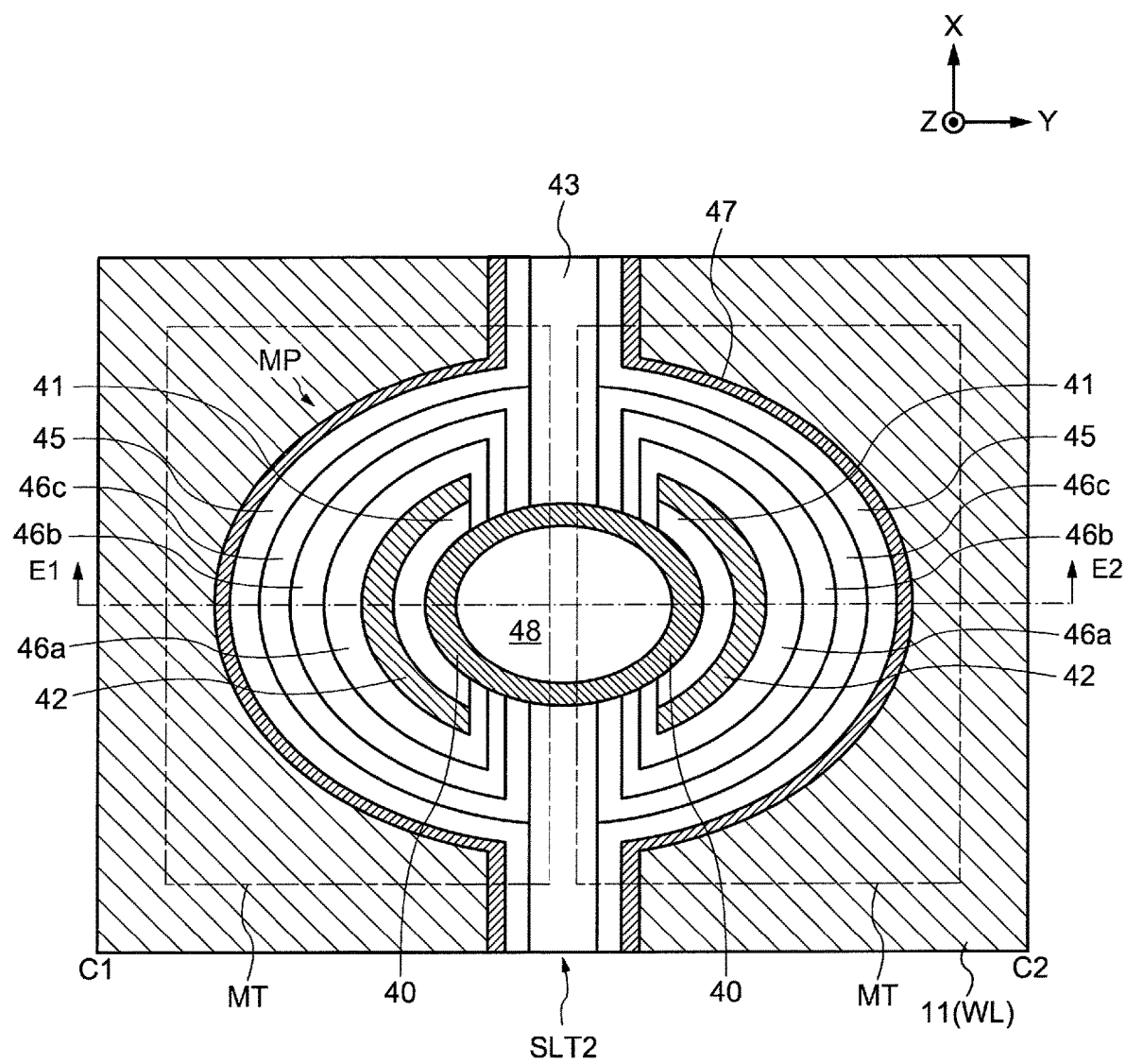
FIG. 10 is an end view of a cutting area showing a modification of a memory cell transistor shown in FIG. 8.
Figure 11:
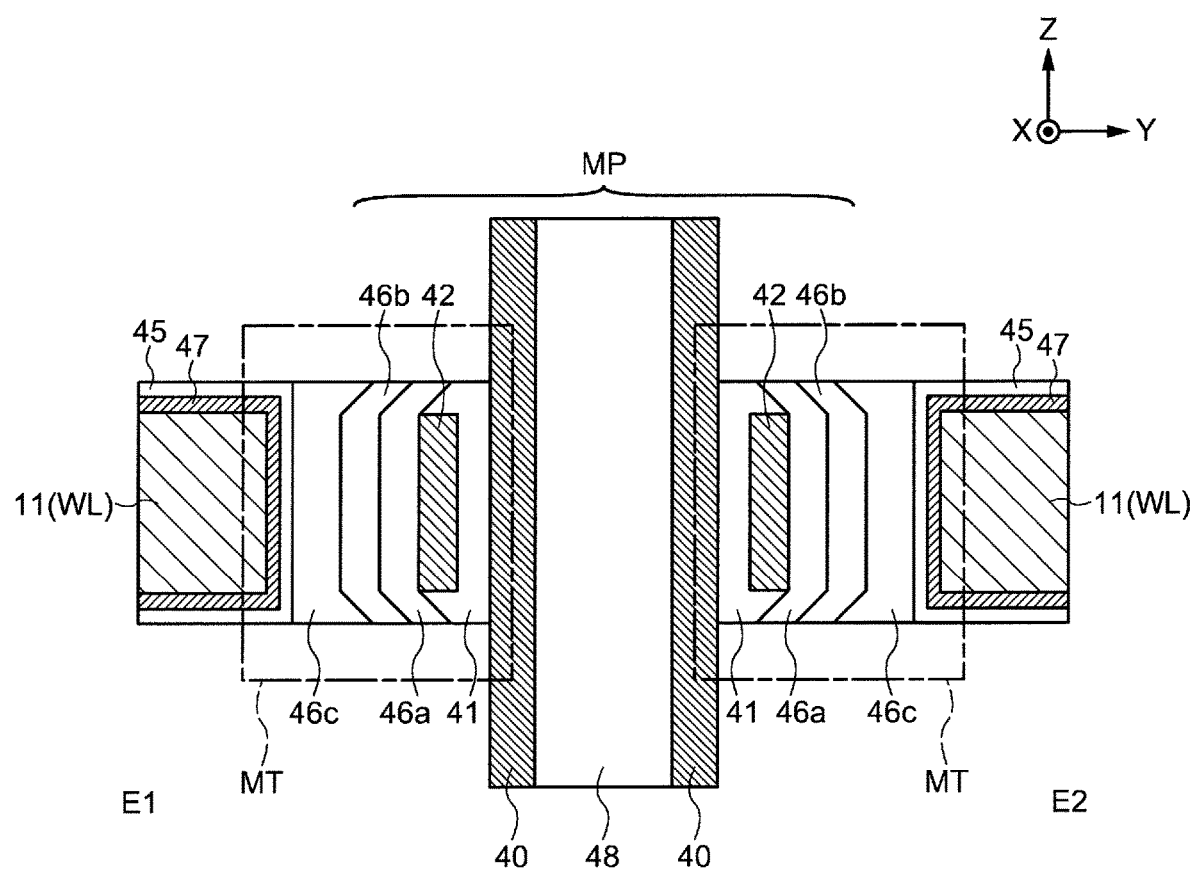
FIG. 11 is an end view of a cutting area E1-E2 of a memory cell transistor shown in FIG. 10.

FIG. 10 is a diagram showing a modification of the memory cell transistor shown in FIG. 8, and shows an end view of a cutting area C1-C2 of the memory cell transistor shown in FIG. 5. FIG. 11 is a diagram showing an end view of a cutting area E1-E2 of the memory cell transistor shown in FIG. 10. FIGS. 10 and 11 are end views of a cutting area showing an area including two memory cell transistors MT. In the second example, the charge storage layer included in the memory cell transistor MT is a conductive film. The second example of the memory cell transistor according to an embodiment is not limited to the structure shown in FIGS. 10 and 11. In the descriptions of FIGS. 10 and 11, descriptions of the same or similar components as those of FIGS. 1 to 9 may be omitted.

As shown in FIGS. 10 and 11, the memory pillar MP includes an insulation layer 48 and a semiconductor layer 43, a semiconductor layer 40, an insulation layer 41, a conductive layer 42, and insulation layers 46a to 46c provided along the Z-direction. The insulation layer 48 is formed using, for example, a silicon oxide film. The semiconductor layer 40 is provided to surround the periphery of the insulation layer 48. The semiconductor layer 40 functions as an area where the channel of the memory cell transistor MT is formed. The semiconductor layer 40 is formed using, for example, a polycrystalline silicon layer. Similar to the first example of the memory pillar MP shown in FIG. 8, the semiconductor layer 40 is not separated between the memory cell transistors MT in the same memory pillar MP but is provided continuously.

The insulation layer 41 is provided around the semiconductor layer 40 and functions as a gate insulation film of each memory cell transistors MT. The insulation layer 41 is separated into two areas in the X-Y plane shown in FIG. 10. Each of the insulation layers 41 separated into two areas functions as the gate insulation film of the two memory cell transistors MT in the same memory pillar MP. The insulation layer 41 is formed using, for example, a stacked structure of the silicon oxide film and the silicon nitride film.

The conductive layer 42 is provided around the insulation layer 41 and is separated into two areas along the Y-direction by the insulation layer 43. Each of the conductive layers 42 separated into two areas functions as the charge storage layer of each of the two memory cell transistors MT. The conductive layer 42 is formed using, for example, a polycrystalline silicon layer.

The insulation layer 43 is formed using, for example, a silicon oxide film. The insulation layer 46a, the insulation layer 46b, and the insulation layer 46c are provided sequentially around the conductive layer 42 from the side closer to the conductive layer 42. The insulation layers 46a and 46c are formed using, for example, a silicon oxide film, and the insulation layer 46b is formed using, for example, a silicon nitride film. The insulation layer 46a, the insulation layer 46b, and the insulation layer 46c function as the block insulation film of the memory cell transistor MT. The insulation layer 46a, the insulation layer 46b, and the insulation layer 46c are separated into two areas along the Y-direction. The insulation layer 43 is provided between the insulation layer 46c which is separated into two areas. Also, the insulation layer 43 is embedded in the slit SLT2. The insulation layer 43 is formed using, for example, a silicon oxide film.

An AIO layer 45 is provided around the second example of the memory pillar MP according to an embodiment, for example. A barrier metal layer 47 is provided around the AIO layer 45, for example. The barrier metal layer 47 is formed using, for example, a TiN film. The wiring layer 11 functioning as the word line WL is provided around the barrier metal layer 47. Similar to the first example of the memory pillar MP according to the embodiment, the wiring layer 11 of the second example of the memory pillar MP according to an embodiment is formed using, for example, a film made of tungsten.

Similar to the first example of the memory pillar MP according to the embodiment, in the second example of the memory pillar MP according to an embodiment, one memory pillar MP includes two memory cell transistors MT along the Y-direction and includes two select transistors ST1 and ST2 along the Y-direction. Although not shown, an insulation layer is provided between the adjacent memory cell transistors in the Z-direction. The insulation layer, the insulation layer 43, and the insulation layer 46 provided between adjacent memory cell transistors in the Z-direction insulate the conductive layer 42 for each individual memory cell transistor.

<1-7. Equivalent Circuit of a String>

Figure 12:
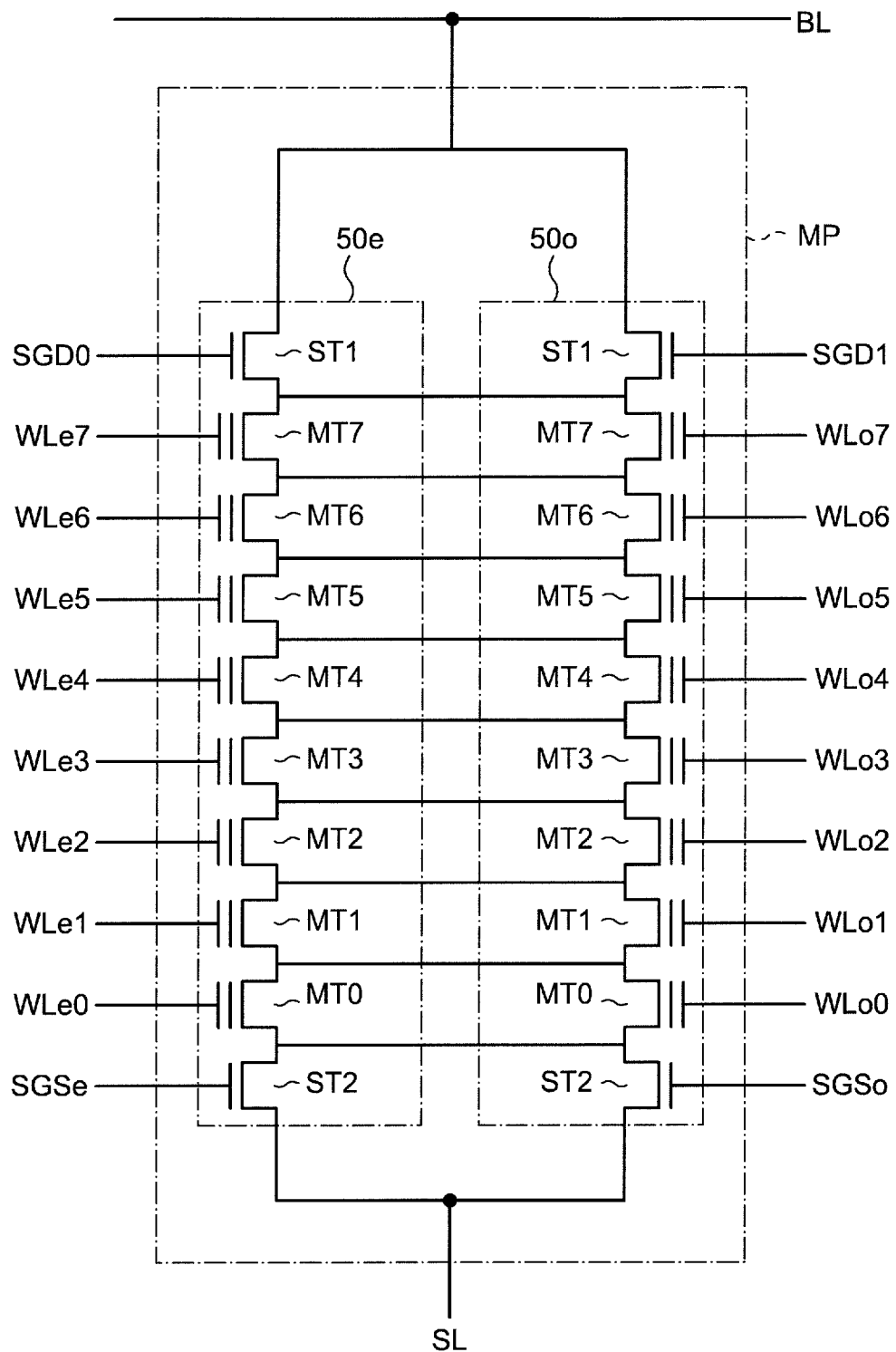
FIG. 12 is a diagram showing an equivalent circuit of adjacent strings in a semiconductor memory device according to an embodiment.

FIG. 12 is an equivalent circuit diagram of adjacent strings in the semiconductor memory device 1 according to an embodiment. The equivalent circuit diagram of the string according to an embodiment is not limited to the equivalent circuit diagram shown in FIG. 12. In the description of FIG. 12, descriptions of the same or similar components as those of FIGS. 1 to 11 may be omitted.

As shown in FIG. 12, the two NAND strings 50e and 50o are formed in one memory pillar MP. Each of the NAND string 50e and the NAND string 50o has the select transistor ST1, the memory cell transistors MT0 to MT7, and the select transistor ST2 electrically connected in series. The NAND string 50e and the NAND string 50o are provided so as to face each other. Therefore, the select transistor ST1, the memory cell transistors MT0 to MT7, and the select transistor ST2 included in the NAND string 50e and the select transistor ST1, the memory cell transistors MT0 to MT7, and the select transistor ST2 included in the NAND string 50o are provided so as to face each other one-to-one. Specifically, the select transistor ST1 included in the NAND string 50e and the select transistor ST1 included in the NAND string 50o are provided so as to face each other, the memory cell transistors MT0 to MT7 included in the NAND string 50e and the memory cell transistors MT0 to MT7 included in the NAND string 50o are provided so as to face each other one-to-one, and the select transistor ST2 included in the NAND string 50e and the select transistor ST2 included in the NAND string 50o are provided so as to face each other.

In the following description, mainly, an example including two memory pillars MP of the first memory pillar MP (e.g., MP4 in FIG. 4) and the second memory pillar MP (e.g., MP0 in FIG. 4) is described. The second memory pillar MP is adjacent to the first memory pillar MP. The first memory pillar MP may be referred to as a "first semiconductor pillar," the NAND string 50e provided in the first memory pillar MP may be referred to as a "first string," the memory cell transistors MT0 to MT7 included in the first string may be referred to as the "first memory cell," the side provided with the first string may be referred to as the "first side," the NAND string 50o provided in the first memory pillar MP may be referred to as a "second string," the memory cell transistors MT0 to MT7 included in the second string may be referred to as the "second memory cell," and the side provided with the second string may be referred to as the "second side." Similar to the first memory pillar MP, the second memory pillar MP may be referred to as the "second semiconductor pillar", the NAND string 50e provided in the second memory pillar MP may be referred to as a "third string", the memory cell transistors MT0 to MT7 included in the third string may be referred to as a "third memory cell", the side provided with the third string may be referred to as the "third side", the NAND string 50o provided in the third memory pillar MP may be referred to as a "fourth string", the memory cell transistor MT0 included in the fourth string may be referred to as a "fourth memory cell", and the side provided with the fourth string may be referred to as the "fourth side". In the cross-sectional view, the second side is opposite to the first side of the first memory pillar MP, and the fourth side is opposite to the third side of the second memory pillar MP. The memory cells electrically connected to each of the i word lines WL may be referred to as "i memory cells", "i-th memory cell", or "k-th memory cell". For example, the memory cells electrically connected to the i word lines WLe0 to WLe7 may be referred to as "i first memory cell", "i first memory cell", "k first memory cell", "i third memory cell", "i third memory cell", or "k third memory cell", and the memory cells electrically connected to the i word lines WLo0 to WLo7 may be referred to as "i second memory cell," "i-th second memory cell," "k second memory cell," "i fourth memory cell," "i-th fourth memory cell," and "k fourth memory cell.

The select transistors ST1 of the NAND string 50e provided in the first memory pillar MP and the second memory pillar MP are connected to, for example, the common select gate line SGD0. The select transistors ST1 of the NAND string 50o provided in the first memory pillar MP and the second memory pillar MP are connected to, for example, the common select gate line SGD1, respectively. The memory cell transistors MT0 to MT7 of the NAND string 50e provided in the first memory pillar MP and the second memory pillar MP are connected to the common word lines WLe0 to WLe7, respectively. The memory cell transistors MT0 to MT7 of the NAND string 50o provided in the first memory pillar MP and the second memory pillar MP are connected to the common word lines WLo0 to WLo7, respectively. The select transistors ST2 of the NAND string 50e provided in the first memory pillar MP and the second memory pillar MP are connected to, for example, the common even select gate line SGSe, respectively. The select transistors ST2 of the NAND string 50o provided in the first memory pillar MP and the second memory pillar MP are connected to, for example, the common odd select gate line SGSo, respectively.

The common word lines WLe0 to WLe7 connected to the memory cell transistors MT0 to MT7 (the first memory cell and the third memory cell) included in the NAND string 50e (the first string and the third string) provided in the first memory pillar MP and the second memory pillar MP may be referred to as a "first word line", and the word lines WLo0 to WLo7 connected to the memory cell transistors MT0 to MT7 (the second memory cell and the fourth memory cell) included in the NAND string 50o (the second string and the fourth string) provided in the first memory pillar MP and the second memory pillar MP may be referred to as a "second word line". The second word line is provided between the second memory cell on the second side and the fourth memory cell on the fourth side, with the second side facing the fourth side.

In the NAND string 50e and the NAND string 50o, the sources and drains of the facing select transistors ST1 are electrically connected, the sources and drains of the memory cell transistors MT0 to MT7 facing each other are electrically connected, and the sources and drains of the facing select transistors ST2 are electrically connected. The electrical connections described above are due to the channels formed in the facing transistors sharing a part of the memory pillar MP.

Two NAND strings, NAND string 50e and NAND string 50o, in the same memory pillar MP are connected to the same bit line BL and the same source line SL.

<2. Operation Example>
<2-1. Overview of Write and Read Operations>

The embodiment in which the select gate line SGD is selected will be described with reference to FIGS. 3 and 4. When any of the select gate lines SGD0 to SGD3 is selected, a voltage that turns on the select transistor ST1 is supplied to one wiring layer 10-0 to 10-3 corresponding to each select gate line. For example, when the wiring layer 10-1 is selected, the eight select transistors ST provided in the memory pillar MP0, the memory pillar MP1, the memory pillar MP4, the memory pillar MP5, the memory pillar MP8, the memory pillar MP9, the memory pillar MP12 and the memory pillar MP13 are turned on. Thus, the eight memory cell transistors MT belonging to the above memory pillars are selected. That is, one page is formed by the above-mentioned eight memory cell transistors MT. An operation when the wiring layer other than the above wiring layer 10-1 is selected is the same as described above, and the description here is omitted.

In an embodiment, as a writing method of the memory cell transistor MT, for example, a TLC method is applied. The plurality of memory cell transistors MT to which the TLC method is applied form eight threshold distributions (write levels). The eight threshold distributions are referred to as, for example, "eR" level, "A" level, "B" level, "C" level, "D" level, "E" level, "F" level, and "G" level in order from the lowest threshold voltage. One different data of the 3-bit data is assigned to each of "eR" level, "A" level, "B" level, "C" level, "D" level, "E" level, "F" level, and "G" level. The distribution width of the threshold voltage of the memory cell between the "eR" level and the "G" level, i.e., the distribution range of the threshold voltage from the "A" level to the "F" level, is called a threshold window (Vth window), for example.

The semiconductor memory device 1 according to an embodiment executes program loops repeatedly in the write operation. The program loops include, for example, a program operation and a verify operation. The program operation is an operation that raises the threshold voltage of the selected memory cell transistor MT by injecting electrons into the charge storage layer in the selected memory cell transistor MT. Alternatively, the program operation is an operation that maintains the threshold voltage of the selected memory cell transistor MT by inhibiting the injection of electrons into the charge storage layer. The verify operation is an operation that confirms whether or not the threshold voltage of the selected memory cell transistor MT has reached the target level by an operation that reads using the verify voltage following the program operation. The selected memory cell transistor MT whose threshold voltage has reached the target level is then write-inhibited.

In the semiconductor memory device 1 according to an embodiment, the threshold voltage of the selected memory cell transistor MT is raised to the target voltage level by executing the program loops including the program operation and the verify operation as described above repeatedly.

The electrons stored in the charge storage layer may be stored in an unstable state. Therefore, with the passage of time from the time when the program operation described above is completed, the electrons stored in the charge storage layer of the memory cell transistor MT may exit the charge storage layer. When the electrons exit the charge storage layer, the threshold voltage of the memory cell transistor MT drops. Therefore, in the read operation executed after completion of the write operation, in order to cope with such a decrease in the threshold voltage of the memory cell transistor that may occur over time, the read operation is performed using a read voltage lower than the verify voltage. The read operation may include the verify operation.

An example of an operation described below is an example of the write operation of the semiconductor memory device 1 according to an embodiment. In an embodiment, the write operation may be referred to as a data write operation, a data writing operation, or the like. Further, in the drawing referred to in the explanation of the write operation of the semiconductor memory device 1 according to an embodiment, white arrows and symbols X (cross mark) may be used. The white arrow is a symbol that schematically indicates, for example, the supply path of the voltage (current) or the supplied area of the voltage (current). Further, for example, an area below the symbol X (cross mark) with respect to the Z-direction, or an area above the symbol X (cross mark) with respect to the Z-direction is an area schematically showing an area or the like that is difficult to supply a voltage (current).

<2-2. Example of Write Operation>

Figure 13:
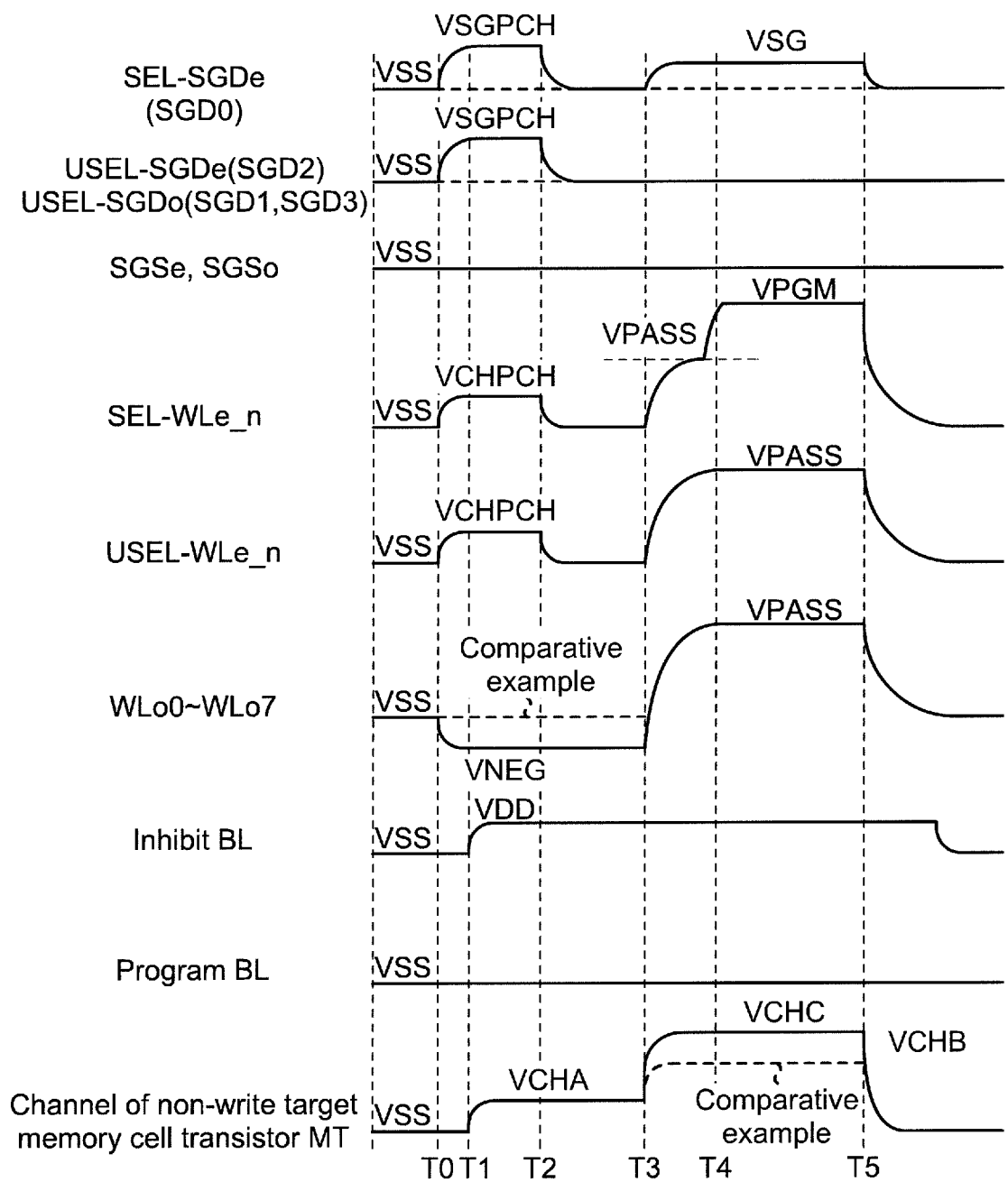
FIG. 13 is a diagram showing timing charts of various signals at the time of a data write operation in a semiconductor memory device according to an embodiment.
Figure 14:
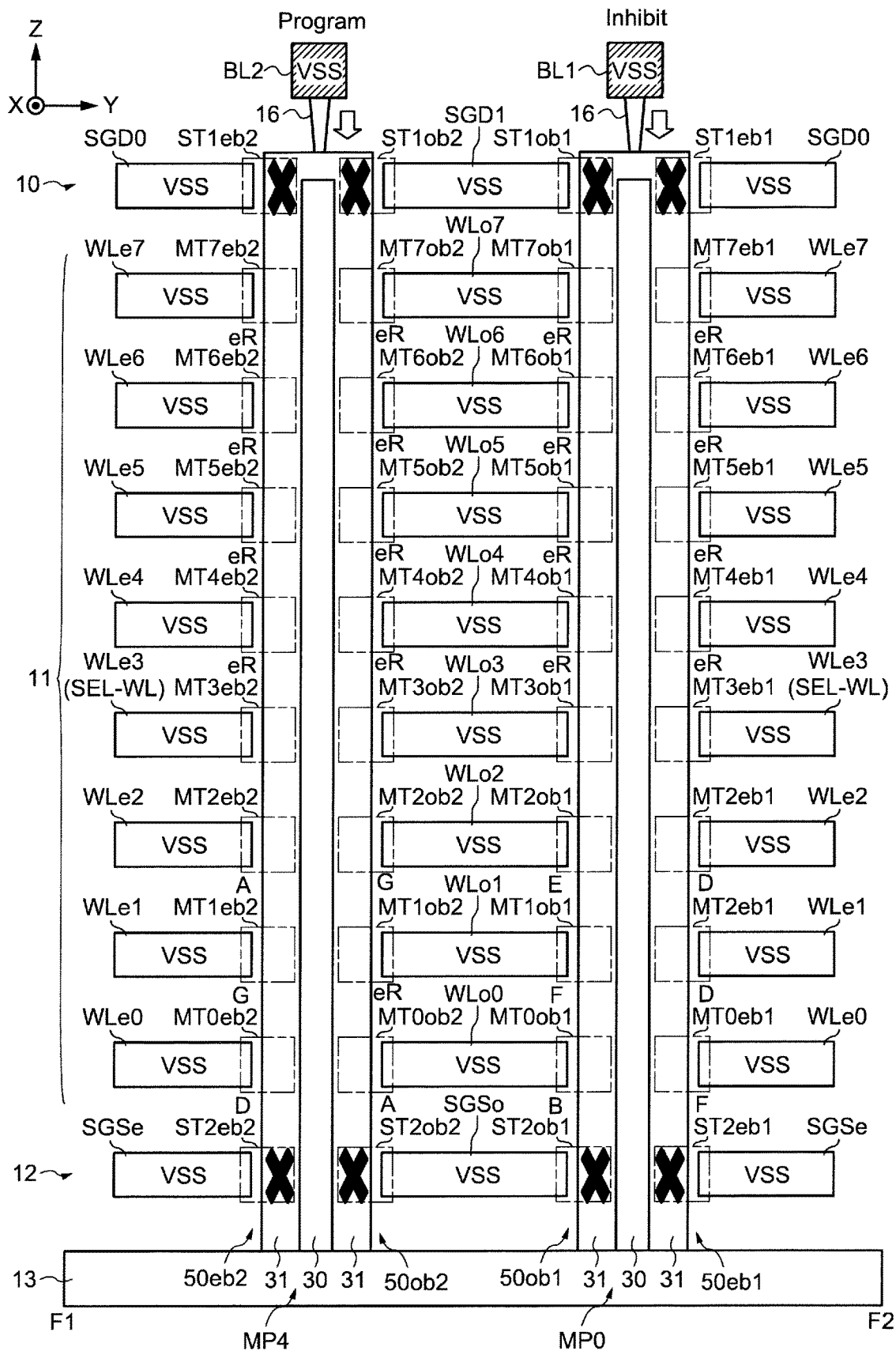
FIG. 14 is an end view of a cutting area of a semiconductor memory device according to an embodiment for explaining voltages supplied to various signal lines at time T0 shown in a timing chart shown in FIG. 13.
Figure 15:
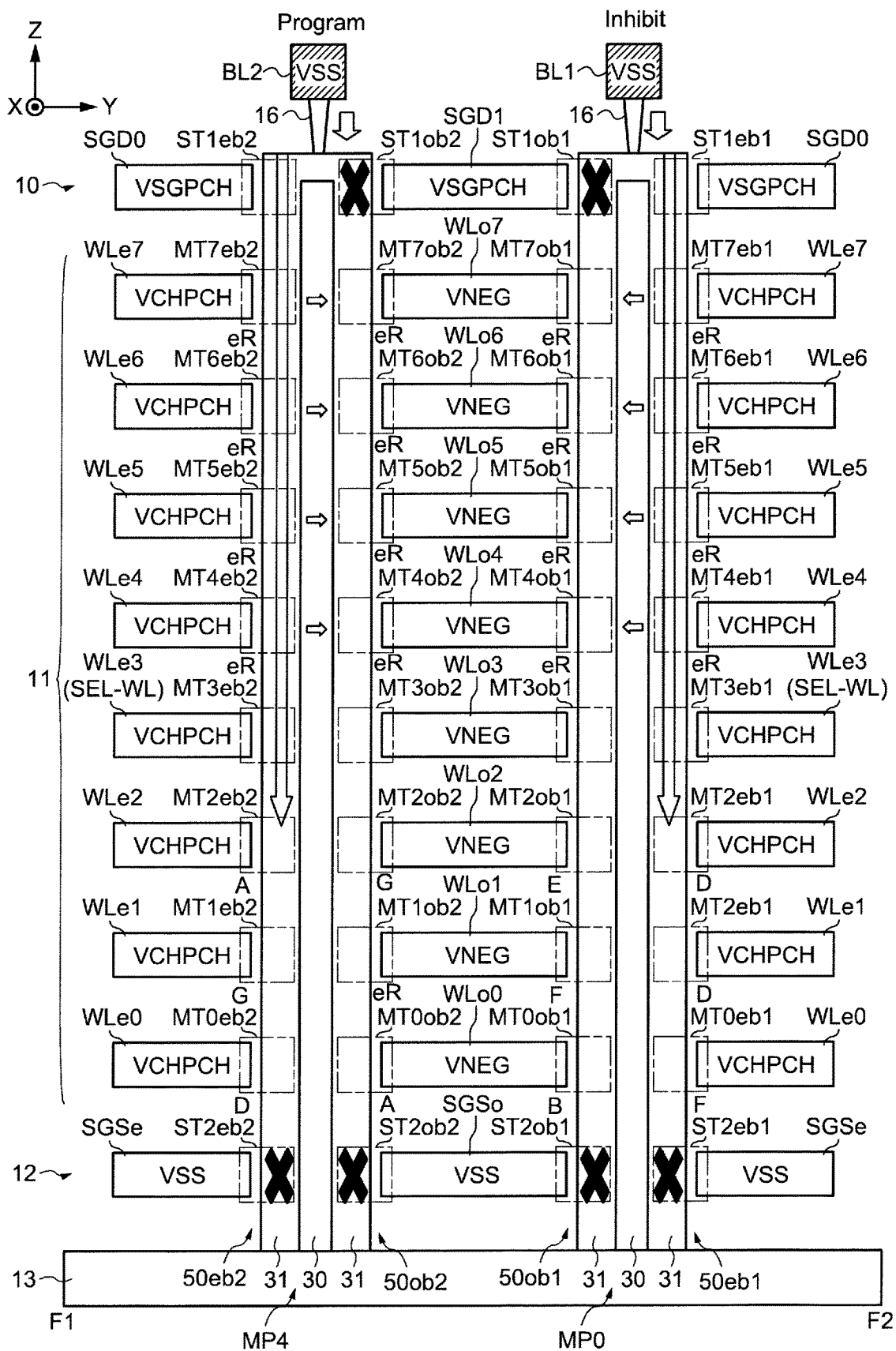
FIG. 15 is an end view of a cutting area of a semiconductor memory device according to an embodiment for explaining voltages supplied to various signal lines at time T1 shown in a timing chart shown in FIG. 13.
Figure 16:
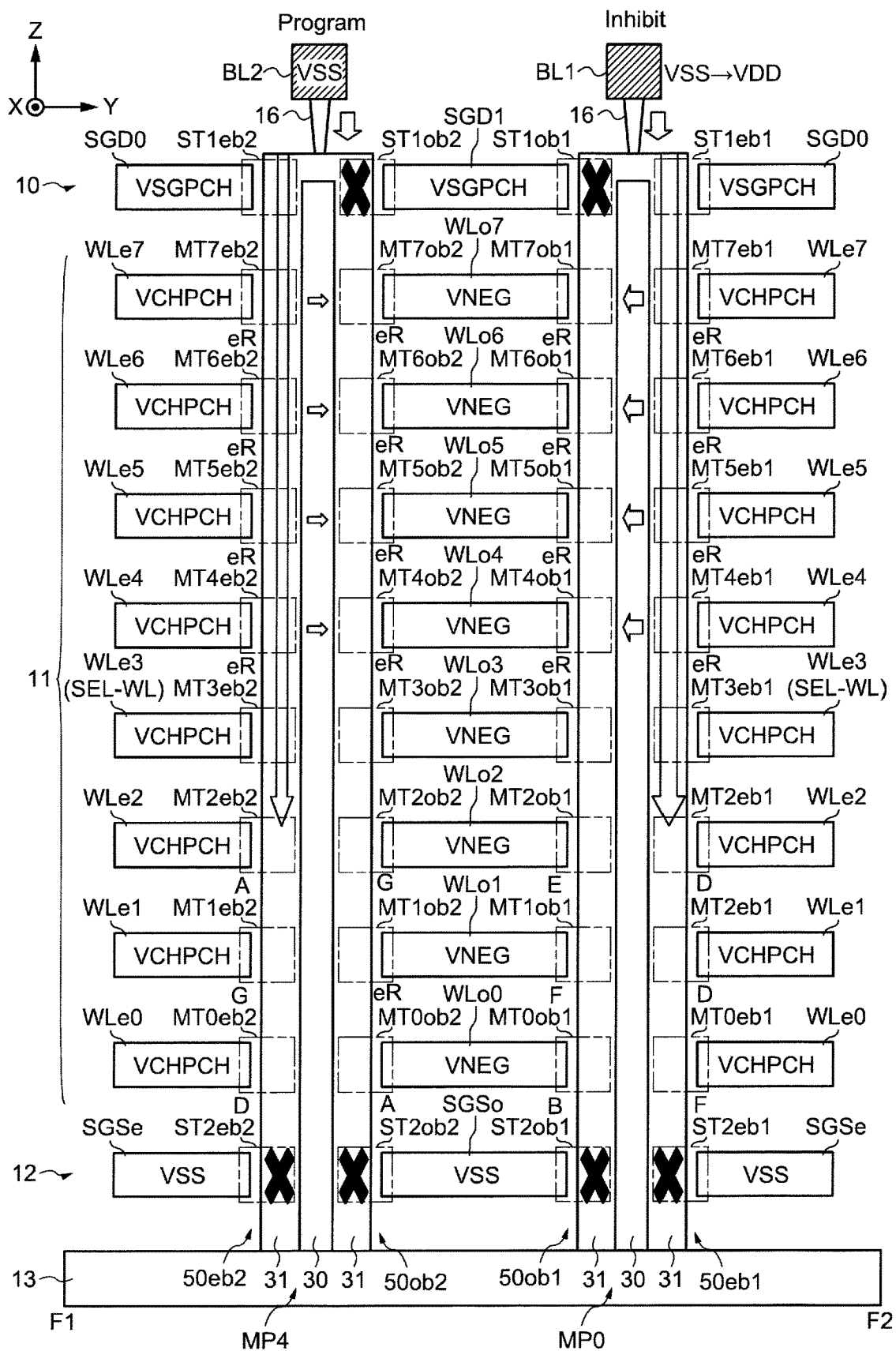
FIG. 16 is an end view of a cutting area of a semiconductor memory device according to an embodiment for explaining voltages supplied to various signal lines at times T1 to T2 shown in a timing chart shown in FIG. 13.
Figure 17:
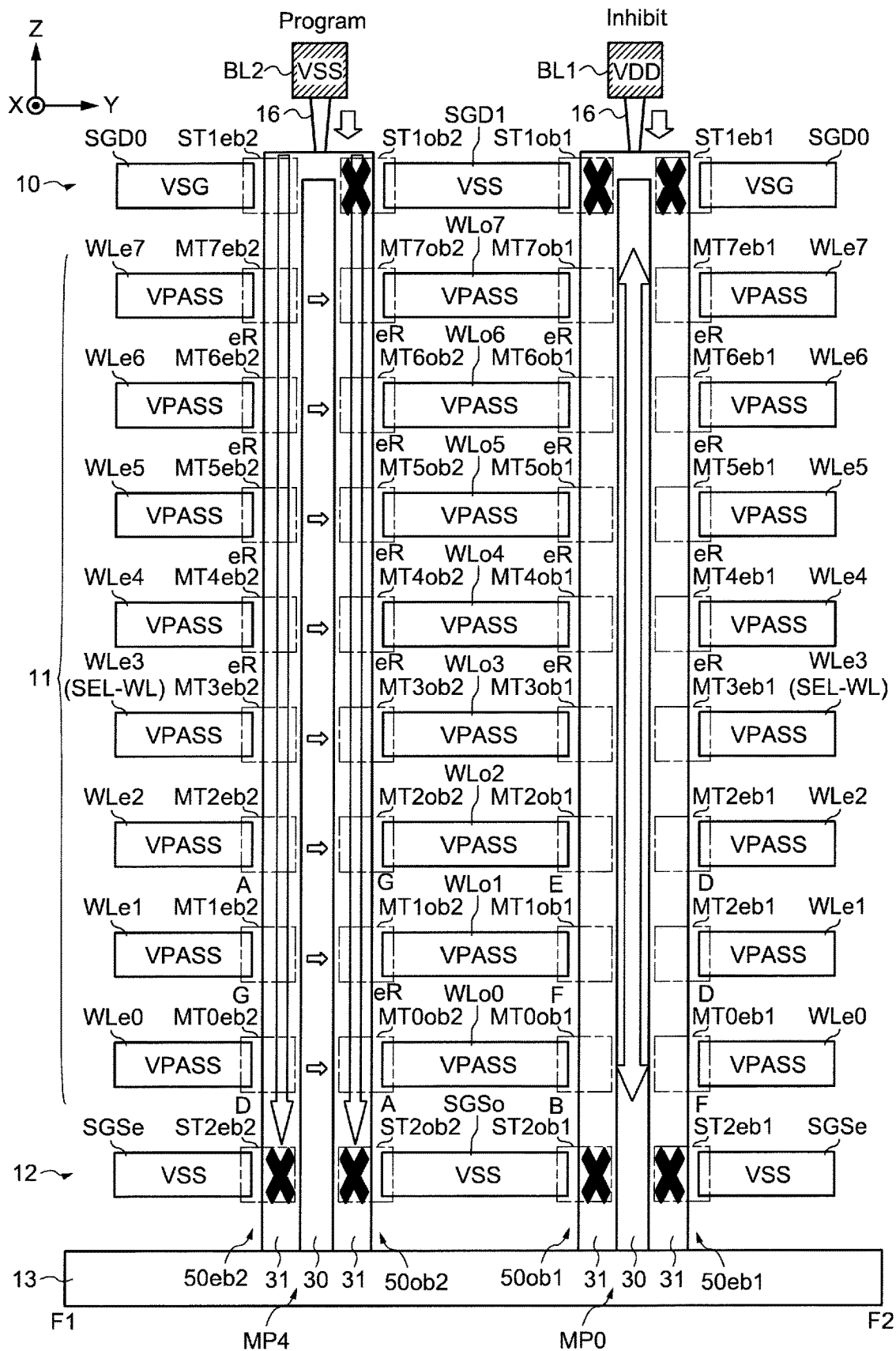
FIG. 17 is an end view of a cutting area of a semiconductor memory device according to an embodiment for explaining voltages supplied to various signal lines at times T3 to T4 shown in a timing chart shown in FIG. 13.

FIG. 13 is a diagram showing a schematic diagram of timing charts of various signals at the time of a data write operation of the semiconductor memory device 1 according to an embodiment. FIG. 14 is an end view of a cutting area of the semiconductor memory device 1 for explaining the voltage supplied to the various signal lines at time T0 in FIG. 13. FIG. 15 is an end view of a cutting area of the semiconductor memory device 1 for explaining the voltage supplied to the various signal lines at time T1 of FIG. 13. FIG. 16 is an end view of a cutting area of the semiconductor memory device 1 for explaining the voltage supplied to various signal lines at time T1 to time T2 of FIG. 13. FIG. 17 is an end view of a cutting area of the semiconductor memory device 1 for explaining the voltage supplied to the various signal lines at time T3 to time T4 of FIG. 13. FIG. 18 is a diagram showing an example of the order of data writing to the memory cell according to an embodiment. The timing chart of the semiconductor memory device 1 according to the embodiment and the configuration according to the timing chart are not limited to the timing chart and the configuration according to the timing chart shown in FIGS. 13 to 18. In the descriptions of FIGS. 13 to 18, descriptions of the same or similar components as those of FIGS. 1 to 12 may be omitted.

The end views of a cutting area shown in FIGS. 14 to 17 are diagrams showing schematics of the structure of an end view of a cutting area F1-F2 of the semiconductor memory device 1 shown in FIG. 4. The structures of the end views of a cutting area of the memory cell transistor MT and the select transistor ST shown in FIGS. 14 to 17 are structures showing schematics of the end views of a cutting area of the memory cell transistor shown in FIG. 9. In the structures of the end views of a cutting area of the memory cell transistor MT and the select transistor ST shown in FIGS. 14 to 17, the illustrations other than the word line WL, the semiconductor layer 31, and the insulation layer 30 are omitted.

In the following explanation, the memory cell transistor MT belonging to the memory group MG (page) to be operated is facing the even word line WLe. In this case, the even word line WLe is called a selected word line, and the odd word line WLo is called an unselected word line. For example, the word line corresponding to the memory group MG that is the target of operation is called a selected even word line SEL-WLe_n, and the other word line in the same block BLK is called an unselected even word line USEL-WLe or the odd word line WLo other than the selected even word line SEL-WLe_n. For example, the select gate line SGD for selecting the memory group MG (page) to be the target of the operation is referred to as a selected even select gate line SEL-SGDe, the other select gate lines are referred to as an unselected even select gate line USEL-SGDe or an unselected odd select gate line SGDo. For example, among the select gate lines SGS, the select gate line SGS electrically connected to the NAND string to be selected is referred to as a selected select gate line SEL-SGS, other select gate lines SGS are referred to as an unselected select gate line USEL-SGS. However, when there is no need to distinguish between the two, it is simply referred to as the select gate line SGS. For example, the bit line BL electrically connected to the NAND string including a selected memory cell transistor MT (a memory cell transistor MT to which data is written) in the memory group MG (page) to be a target of the operation is referred to as a bit line Program BL, and the bit line BL electrically connected to the NAND string including the memory cell transistor MT (the memory cell transistor MT to which data is not written) other than the selected memory cell transistor MT in the memory group MG (page) to be a target of the operation is referred to as a bit line Inhibit BL.

In the following explanation, for example, a configuration having end views of a cutting area of the semiconductor memory device 1 shown in FIGS. 14 to 17 will be described as an example.

For example, in the end view of a cutting area (cross-sectional view) shown in FIG. 14, the semiconductor memory device 1 has two memory pillars MP, the memory pillar MP4 and the memory pillar MP0 adjacent to the memory pillar MP4. The memory pillar MP4 has a NAND string 50eb2 and a NAND string 50ob2, and the memory pillar MP0 has a NAND string 50eb1 and a NAND string 50ob1. The NAND string 50eb2 and the NAND string 50ob2 are electrically connected to the same bit line BL2 by using the contact plug 16. The NAND string 50eb1 and the NAND string 50ob1 are electrically connected to the same bit line BL1 by using the contact plug 16. The NAND string 50eb2, the NAND string 50ob2, the NAND string 50eb1, and the NAND string 50ob1 are electrically connected to the same source line SL. The NAND string 50eb2 includes memory cell transistors MT0eb2 to MT7eb2, the NAND string 50ob2 includes memory cell transistors MT0ob2 to MT7ob2, the NAND string 50eb1 includes memory cell transistors MT0eb1 to MT7eb1, and the NAND string 50ob1 includes memory cell transistors MT0ob1 to MT7ob1.

A select transistor ST1eb2 of the NAND string 50eb2, and a select transistor ST1eb1 of the NAND string 50eb1 are electrically connected to, for example, the common select gate line SGD0 (the selected even select gate line SEL-SGDe). A select transistor ST1ob2 of the NAND string 50ob2, and a select transistor ST1ob1 of the NAND string 500b 1 are electrically connected to, for example, the common select gate line SGD1 (the unselected odd select gate line SGDo facing the selected even select gate line SEL-SGDe).

Each of the memory cell transistors MT0eb2 to MT7eb2 and each of the memory cell transistors MT0eb1 to MT7eb1 are electrically connected to the common word lines WLe0 to WLe7, respectively. Each of the memory cell transistors MT0ob2 to MT7ob2 and each of the memory cell transistors MT0ob1 to MT7ob1 are electrically connected to the common word lines WLo0 to WLo7, respectively. For example, a memory cell transistor MT2eb2 and a memory cell transistor MT2eb1 are electrically connected to the common word line WLe2, the memory cell transistor MT5eb2 and the memory cell transistor MT5eb1 are electrically connected to the common word line WLe5, a memory cell transistor MT3ob2 and a memory cell transistor MT3ob1 are electrically connected to the common word line WLo3, and the memory cell transistor MT6ob2 and the memory cell transistor MT6ob1 are electrically connected to the common word line WLo6.

A select transistor ST2eb2 of the NAND string 50eb2, and a select transistor ST2eb1 of the NAND string 50eb1 are electrically connected to, for example, the common select gate line SGS (the even select gate line SGSe or the selected select gate line SEL-SGS). A select transistor ST2ob2 of the NAND string 50ob2, and a select transistor ST2ob1 of the NAND string 50ob1 are electrically connected to, for example, the common select gate line SGD1 (the odd select gate line SGSo or the unselected select gate line USEL-SGS).

In FIGS. 14 to 17, the selected even select gate line SEL-SGDe is the select gate line SGD0, the unselected odd select gate line SGDo facing the selected even select gate line SEL-SGDe is the select gate line SGD1, the selected even word line SEL-WLe_n is the select word line WLe3 (n=3), the unselected even word line USEL-WLe is the word lines WLe0 to WLe2 and WLe4 to WLe7, the odd word line is the odd word lines WLo0 to WLo7, the bit line Inhibit BL is the bit line BL1, the bit line Program BL is the bit line BL2, the selected select gate line SEL-SGS is the even select gate line SGSe, and the unselected select gate line USEL-SGS is the odd select gate line SGSo.

Further, in FIGS. 14 to 17, the voltages supplied to the various signal lines are shown in figures showing the bit line BL, the wiring layer 10, the wiring layer 11, the wiring layer 12, the source line layer 13, and the like functioning as various signal lines such as the bit lines BL the select gate lines SDG, the word lines WL, the select gate lines SGS, the source line SL, and the like.

Further, in FIGS. 14 to 17, the threshold voltage written to (stored in) each memory cell transistor MT is shown downwardly relative to the Z-direction of each memory cell transistor MT. Specifically, the threshold voltage "eR" level is written to memory cell transistors MT4eb2 to MT7eb2, a memory cell transistor MT1ob2, the memory cell transistors MT4ob2 to MT7ob2, the memory cell transistors MT4eb1 to MT7eb1, and memory cell transistors MT4ob1 to MT7ob1, the threshold voltage "A" level is written to the memory cell transistor MT2eb2 and the memory cell transistor MT0ob2, a threshold voltage "B" level is written to the memory cell transistor MT0ob1, a threshold voltage "D" level is written to the memory cell transistor MT0eb2 and memory cell transistors MT1eb1 to MT2eb1, the threshold voltage "E" level is written to a memory cell transistor MT2ob1, the threshold voltage "F" level is written to a memory cell transistor MT1ob1 and the memory cell transistor MT0eb1, and the threshold voltage "G" level is written to the memory cell transistor MT1eb2.

In the write operation according to the present embodiment, as an example, a write operation for writing predetermined data into a memory cell transistor MT3eb2 electrically connected to a selected even word line SEL-WLe-n (at the selected word line WLe3 (n=3)) will be described. The state of the memory cell transistor MT to which data has already been written is the state in which data has been written using the write operation.

In an embodiment, as described above, for example, the memory controller 2 uses the write protect signal WPn to transmit a signal instructing the write operation to the semiconductor memory device 1. When the semiconductor memory device 1 receives the write protect signal WPn, the sequencer 24 controls the sense amplifier 70, the row decoder 29, the voltage generation circuit 27, and the driver set 28 on the basis of a command that instructs the write operation of data included in the write protect signal WPn. The semiconductor memory device 1 executes the write operation. For example, the supply of a voltage to the word line WL, the select gate line SGD, select gate line, the source line SL, and source line CELSR, and the like is executed by the control of the voltage generation circuit 27 and the driver set 28 and the row decoder 29 using the sequencer 24. The supply of a voltage to the bit line BL is executed by the control of the voltage generation circuit 27 and the driver set 28 and the sense amplifier 70 using the sequencer 24.

<2-2-1. Example of Write Operation Up to Time T0>

The write operation up to time T0 will be described with reference to FIGS. 13 and 14. The write operation up to time T0 is, for example, an operation for setting the state of the semiconductor memory device 1 to the standby state. The standby state is, for example, a state waiting for data writing. As shown in FIG. 13, up to time T0, the selected even select gate line SEL-SGDe (SGD0), the unselected even select gate line USEL-SGDe (SGD2) and the unselected odd select gate line USEL-SGDo (SGD1, SGD3), the selected even word line SEL-WLe_n, the unselected even word line USEL-WLe other than the selected even word line SEL-WLe_n, the odd word lines WLo0 to WLo7, and the bit line Inhibit BL are supplied with the voltage VSS. The voltage VSS is supplied to the unselected even select gate USEL-SGDe, the odd select gate line SGDo other than the odd select gate line SGSo facing the even select gate line SGSe, the even select gate line SGSe, the odd select gate line SGDo, and the bit line Program BL while the semiconductor memory device 1 executes the data write operation according to an embodiment. In an embodiment, the voltage VSS is, for example, a voltage that can define other voltages with reference to the voltage VSS. The voltage VSS may be referred to as a reference voltage, and may be 0V, and may be ground.

As shown in FIG. 14, the select gate line SGD0, the select gate line SGD1, the select word line WLe3, the word lines WLe0 to WLe2 and WLe4 to WLe7, the odd word lines WLo0 to WLo7, the bit line BL1, the bit line BL2, the even select gate line SGSe, and the odd select gate line SGSo are supplied with the voltage VSS. Each memory cell transistor MT is in the off-state. The symbol X (cross mark) in FIG. 14 and the like also indicates that the corresponding transistor is turned off.

<2-2-2. Example of Write Operation at Time T1>

The write operation from times T0 to T1 will be described with reference to FIGS. 13 and 15. The write operation at times T0 to T1 is, for example, an operation for supplying a voltage VNEG to the odd word lines WLo0 to WLo7. In other words, the write operation at times T0 to T1 is the operation that supplies the voltage VNEG to the odd word lines WLo0 to WLo2 and WLo4 to WLo7 and the odd word line WLo3. The channel of the memory cell transistor MT is supplied with the voltage VSS from the bit line. As shown in FIG. 13, from times T0 to T1, the selected even select gate line SEL-SGDe (SGD0), the unselected even select gate line USEL-SGDe (SGD2) and an unselected odd select gate line USGDo (SGD1, SGD3) are supplied with a voltage VSGPCH from the voltage VSS, the selected even word line SEL-WLe_n, and the unselected even word line USEL-WLe_n other than the selected even word line SEL-WLe_n are supplied with a voltage VCHPCH (a first voltage) from the voltage VSS, the odd word lines WLo0 to WLo7 are supplied with the voltage VNEG (a second voltage) from the voltage VSS, and the bit line Inhibit BL, the channels of each of the memory cell transistors MT, the even select gate line SGSe, and the odd select gate line SGSo are supplied with the voltage VSS. The numerical value n is a positive integer, e.g., 3 or 4. For example, when the numerical value n is 3, the selected even word line SEL-WLe-n is an even word line SEL-WLe3. The even word line SEL-WLe 3 is the third even word line SEL-WLe3 among the plurality of even word lines SEL-WLe. For example, when the numerical value n is 4, the selected even word line SEL-WLe-n is the fourth even word line SEL-WLe4 among the plurality of even word lines SEL-WLe. The configuration of an odd word line WLo_n (WLo_n) is the same as that of the even word line WLe_n (WLe_n) described above. In an embodiment, the numerical value n may be referred to as the value k. The voltage VSGPCH may be a voltage higher than the voltage VCHPCH and may be a voltage of the same magnitude as the voltage VCHPCH.

In an embodiment, the voltage VCHPCH (the first voltage) is higher than the voltage VSS (e.g., 0V, or the reference voltage), the voltage VNEG (the second voltage) is smaller than the voltage VSS (e.g., 0V, or the reference voltage). The voltage VCHPCH is smaller than the voltage level for reading the threshold voltage equal to or higher than the "A" level.

As shown in FIG. 15, at time T1, the select gate line SGD0, the select gate line SGD1 are supplied with the voltage VSGPCH, the selected word line WLe3 (the first word line), the word lines WLe4 to WLe7 are supplied with the voltage VCHPCH, the select transistors ST1$eb$2, ST1$ob$2, ST1$ob$1, ST1$eb$1, the memory cell transistors MT3$eb$2 to MT7$eb$2, and memory cell transistors MT3$eb$1 to MT7$eb$1 are turned on. Although the word lines WLe0 to WLe2 are supplied with the voltage VCHPCH, the memory cell transistors MT0$eb$2 to MT2$eb$2 and the memory cell transistors MT0$eb$1 to MT2$eb$1 are turned off because the voltage VCHPCH is smaller than the voltage level for reading the threshold voltage equal to or higher than the "A" level. The odd word lines WLo0 to WLo2 and WLo4 to WLo7 and the odd word line WLo3 (the second word line) are supplied with the voltage VNEG, and the memory cell transistors MT0$ob$2 to MT7$ob$2 and MT0$ob$1 to MT7$ob$7 keep the off-state. The even select gate line SGSe, and the odd select gate line SGSo are supplied with the voltage VSS, the select transistors ST2$eb$2, ST2$ob$2, ST2$ob$1, ST2$eb$1 keep the off-state. The bit line BL1 and the bit line BL2 are supplied with the voltage VSS.

Consequently, as shown in FIG. 15, the voltage VSS supplied to the bit line BL2 is supplied to the semiconductor layer 31 that functions as respective channels (the first channel) of the select transistor ST1$eb$2 and the memory cell transistors MT3$eb$2 to MT7$eb$2 (the first memory cell). The voltage VSS supplied to the bit line BL1 is supplied to the semiconductor layer 31 that functions as respective channels (the third channel) of the select transistor ST1$eb$1 and the memory cell transistors MT3$eb$1 to MT7$eb$1 (the third memory cell).

A part of respective channels (the second channel) of the memory cell transistors MT3$ob$2 to MT7$ob$2 (the second memory cell) is shared with the respective channels (the first channel) of the memory cell transistors MT3$eb$2 to MT7$eb$2 (the first memory cell). A part of respective channels (a fourth channel) of the memory cell transistors MT3$ob$1 to MT7$ob$1 (the fourth memory cell) is shared with the respective channels (the third channel) of the memory cell transistors MT3$eb$1 to MT7$eb$1 (third memory cell).

As a result, by using the memory cell transistors MT3$eb$2 to MT7$eb$2 (the first memory cell), a voltage of a part of the respective channels (the second channel) of the memory cell transistors MT3$ob$2 to MT7$ob$2 (the second memory cell) is fixed to the voltage VSS. By using the memory cell transistors MT3$eb$1 to MT7$eb$1 (the third memory cell), a voltage of a part of the respective channels (the fourth channel) of the memory cell transistors MT3$ob$1 to MT7$ob$1 (the fourth memory cell) is fixed to the voltage VSS.

<2-2-3. Example of Write Operation at Time T2>

The write operation from times T1 to T2 will be described with reference to FIGS. 13 and 16. The write operation at times T1 to T2 is, for example, an operation in which the bit line Inhibit BL is supplied with a voltage VDD after the odd word lines WLo0 to WLo2 and WLo4 to WLo7 and the odd word line WLo3 (the second word line) are supplied with the voltage VNEG. In other words, the write operation at times T1 to T2 is an operation that supplies the voltage VDD to the bit line Inhibit BL and pre-charges the channels of the memory cell transistor MT electrically connected (not to be written) to the bit line Inhibit BL to the voltage VDD or a voltage VCHA. As shown in FIG. 13, from time T1 to time T2, the selected even select gate line SEL-SGDe (SGD0), the unselected even select gate line USEL-SGDe (SGD2) and the unselected odd select gate line USEL-SGDo (SGD1, SGD3) are supplied with the voltage VSGPCH from the voltage VSS, the selected even world line SEL-WLe_n and the unselected even word line USEL-WLe_n other than the selected even word line SEL-WLe_n are supplied with the voltage VCHPCH, the odd word lines WLo0 to WLo7 are supplied with the voltage VNEG, the bit line Inhibit BL is supplied with the voltage VDD (a third voltage) from the voltage VSS, the channel of the non-write target memory cell transistor MT electrically connected to the bit line Inhibit BL is supplied with the voltage VCHA (a fourth voltage) from the voltage VSS, and the even select gate line SGSe and the odd select gate line SGS0 are supplied with the voltage VSS.

In an embodiment, the voltage VDD (the third voltage) is higher than the voltage VSS (e.g., 0V, or the reference voltage), the same or substantially the same as the voltage VCHPCH (the first voltage), and the voltage VCHA (the fourth voltage) is higher than the voltage VSS (e.g., 0V, or the reference voltage), the same or substantially the same as the voltage VDD (the third voltage).

As shown in FIG. 16, at times T1 to T2, the select gate line SGD0, the select gate line SGD1, and the select gate line SGC3 are supplied with the voltage VSGPCH, the select word line WLe3 (the first word line), and the word lines WLe4 to WLe7 are supplied with the voltage VCHPCH, and the select transistors ST1$eb$2, ST1$ob$2, ST1$ob$1, ST1$eb$1, the memory cell transistors MT3$eb$2 to MT7$eb$2, and the memory cell transistors MT3$eb$1 to MT7$eb$1 keep the on-state. The word lines WLe0 to WLe2 are supplied with the voltage VCHPCH, and the memory cell transistors MT0eb2 to MT2eb2 and the memory cell transistors MT0eb1 to MT2eb1 keep the off-state. The odd word lines WLo0 to WLo2 and WLo4 to WLo7 and the odd word line WLo3 (the second word line) are supplied with the voltage VNEG, and the memory cell transistors MT0ob2 to MT7ob2 and MT0ob1 to MT7ob7 keep the off-state. The even select gate line SGSe and the odd select gate line SGSo are supplied with the voltage VSS, the select transistors ST2eb2, ST2ob2, ST2ob1, ST2eb1 keep the off-state. The bit line BL1 is supplied with the voltage VDD from the voltage VSS, and the bit line BL2 is supplied with the voltage VSS.

Consequently, as shown in FIG. 16, the voltage VSS supplied to the bit line BL2 continues to be supplied to the semiconductor layer 31 that functions as the respective channels (the first channel) of the select transistor ST1eb2 and the memory cell transistors MT3eb2 to MT7eb2 (the first memory cell). The voltage VCHA corresponding to the voltage VDD supplied to the bit line BL1 is supplied to the semiconductor layer 31 that functions as respective channels (the third channel) of the select transistor ST1eb1 and the memory cell transistors MT3eb1 to MT7eb1 (the third memory cell).

Therefore, by using the memory cell transistors MT3eb2 to MT7eb2 (the first memory cell), a voltage of a part of the respective channels (the second channel) of the memory cell transistors MT3ob2 to MT7ob2 (the second memory cell) is fixed to the voltage VSS. By using the memory cell transistors MT3eb1 to MT7eb1 (the third memory cell), a voltage of a part of the respective channels (the fourth channel) of the memory cell transistors MT3ob1 to MT7ob1 (the fourth memory cell) is fixed to the voltage VCHA higher than the voltage VSS.

From time T2 to time T3, as shown in FIG. 13, the selected even select gate line SEL-SGDe (SGD0), the unselected even select gate line USEL-SGDe (SGD2) and the unselected odd select gate line USGDo (SGD1, SGD3), the selected even word line SEL-WLe_n, and the unselected even word line USEL-WLe other than the selected even word line SEL-WLe_n are supplied with voltage VSS from the voltage VCHPCH, the odd word lines WLo0 to WLo7 are supplied with the voltage VNEG, the bit line Inhibit BL is supplied with the voltage VDD, the even select gate line SGSe and the odd select gate line SGSo are supplied with the voltage VSS. From time T2 to time T3, each memory cell transistor MT is in the off-state, and the channels of the memory cell transistor MT not to be written, which is electrically connected to the bit line Inhibit BL, hold the voltage VCHA (the fourth voltage).

<2-2-4. Example of Write Operation at Times T3 to T4>

The write operation at times T3 to T4 will be described with reference to FIGS. 13 and 17. The write operation at times T3 to T4 is, for example, an operation of boosting the channels of the non-write target memory cell transistor MT from the voltage VCHA (the fourth voltage) to a voltage VCHC (a sixth voltage). That is, the write operation at times T3 to T4 is the operation to boost the channels. As shown in FIG. 13, at the times T3 to T4, the selected even select gate line SEL-SGDe is supplied with a voltage VSG from the voltage VSS, the unselected even select gate line USEL-SGDe (SGD2) and the unselected odd select gate line USEL-SGDo (SGD1, SGD3) are supplied with the voltage VSS, the selected even word line SEL-WLe_n, and the unselected even word line USEL-WLe word line other than the selected even word line SEL-WLe_n are supplied with a voltage VPASS (a fifth voltage) from the voltage VSS, the odd word lines WLo0 to WLo7 are supplied with the voltage VPASS (the fifth voltage) from the voltage VNEG (the second voltage), the bit line Inhibit BL is supplied with the voltage VDD (the third voltage), and the even select gate line SGSe and the odd select gate line SGSo are supplied with the voltage VSS.

As described above, the bit line Program BL here is supplied with the voltage VSS. The voltage VSS supplied to the bit line Program BL is sufficiently lower than the voltage VSG supplied to the selected even select gate line SEL-SGDe. Therefore, the select transistor ST1 included in the NAND string 50 connected to the bit line Program BL is turned on, and the voltage VSS of the bit line Program BL is supplied to the channels. On the other hand, the voltage VDD supplied to the bit line Inhibit BL is sufficiently higher than the voltage VSG supplied to the selected even select gate line SEL-SGDe (SGD0). Therefore, the gate voltage of the select transistor ST1 included in the NAND string 50 connected to the bit line Inhibit BL is relatively low, and the select transistor ST1 is turned off. As a result, the bit line Inhibit BL and the channels are electrically disconnected. Then, the channels change from the voltage VCHA (the fourth voltage) to the voltage VCHC (the sixth voltage) due to the capacitive coupling with the unselected even word line USEL-WLe and the odd word lines WLo0 to WLo7.

In an embodiment, the voltage VGS is smaller than the voltage VSGPCH, the voltage VPASS (the fifth voltage) is higher than the voltage VCHPCH (the first voltage), and the voltage VCHC (the sixth voltage) is higher than the voltage VCHA (the fourth voltage).

As shown in FIG. 17, at times T3 to T4, the select gate line SGD0 is supplied with the voltage VSG from the voltage VSS, the bit line BL2 is supplied with the voltage VSS, and the select transistors ST1eb2, ST1eb1 are turned on. The select gate line SGD1 is supplied with the voltage VSS, the bit line BL1 is supplied with the voltage VDD, and the select transistors ST1ob2, ST1ob1 are turned off. The select word line WLe3 (the first word line), the word lines WLe4 to WLe7, and the word lines WLe0 to WLe2 are supplied with the voltage VPASS from the voltage VSS, the memory cell transistors MT3eb2 to MT7eb2, the memory cell transistors MT3eb1 to MT7eb1, and the memory cell transistors MT0eb2 to MT2eb2, and the memory cell transistors MT0eb1 to MT2eb1 are turned on. The odd word lines WLo0 to WLo2 and WLo4 to WLo7 and the odd word line WLo3 (the second word line) are supplied with the voltage VPASS from the voltage VNEG, and the memory cell transistors MT0ob2 to MT7ob2 and the memory cell transistors MT0ob1 to MT7ob7 are turned on. The even select gate line SGSe, and the odd select gate line SGSo are supplied with the voltage VSS, and the select transistors ST2eb2, ST2ob2, ST2ob1, ST2eb1 are kept in the off-state.

As a result, as shown in FIG. 17, the voltage VSS supplied to the bit line BL2 is supplied to the semiconductor layer 31 that functions as the respective channels (the first channel) of each of the select transistor ST1eb2 and the memory cell transistors MT0eb2 to MT7eb2 (the first memory cell), and the respective channels (the second channel) of each of the select transistor ST1ob2 and the memory cell transistors MT0ob2 to MT7ob2 (the second memory cell).

The semiconductor layer 31 that functions as the respective channels (the third channel) of the memory cell transistors MT0eb1 to MT7eb1 (the third memory cell) and the respective channels (the fourth channel) of the memory cell transistors MT0ob1 to MT7ob1 (the fourth memory cell) holds the voltage VCHA, and the odd word lines WLo0 to WLo2 and WLo4 to WLo7 and the odd word line WLo3 (the second word line) are supplied with the voltage VPASS from the voltage VNEG. That is, the semiconductor layer 31 functioning as the respective channel (the third channel) of each of the memory cell transistors MT0eb1 to MT7eb1 (the third memory cell) and the respective channels (the fourth channel) of each of the memory cell transistors MT0ob1 to MT7ob1 (the fourth memory cell) is in a floating state in which the voltage VCHA is held, and the odd word lines WLo0 to WLo2 and WLo4 to WLo7 and the odd word lines WLo3 (the second word line) are supplied with the voltage VPASS from the voltage VNEG.

Consequently, by coupling the voltage VCHA supplied to the semiconductor layer 31 with the odd word line WLo3 (the second word line) including the odd word lines WLo0 to WLo7, the voltage of the semiconductor layer 31 is increased from the voltage VCHA to the voltage VCHC higher than the voltage VCHA. That is, the respective channels (the third channel) of the memory cell transistors MT0eb1 to MT7eb1 (the third memory cell) and the respective channels (the fourth channel) of the memory cell transistors MT0ob1 to MT7ob1 (the fourth memory cell) are boosted.

A comparative example will be described here. As shown in FIG. 13, in the comparative example, the odd word lines WLo0 to WLo2 and WLo4 to WLo7 and the odd word line WLo3 are supplied with the voltage VSS up to time T3. From time T3 to time T4, the odd word lines WLo0 to WLo2 and WLo4 to WLo7 and the odd word line WLo3 are supplied with the voltage VPASS from the voltage VSS. A voltage VCHB is supplied to the semiconductor layer 31 which functions as the respective channels (the third channel) of the select transistor ST1eb1 and the memory cell transistors MT0eb1 to MT7eb1 (the third memory cell) and the respective channels (the fourth channel) of the select transistor ST1ob1 and the memory cell transistors MT0ob1 to MT7ob1 (the fourth memory cell).

That is, in the comparative examples, the timing at which the voltage VDD is supplied to the data write protected bit line (the bit line Inhibit BL) is the timing at which the odd word lines WLo0 to WLo2 and WLo4 to WLo7 and the odd word line WLo3 are supplied with a constant voltage (the voltage VSS). Therefore, at times T3 to T4, when the voltage supplied to the word line WL changes from the voltage VSS to the voltage VPASS, the semiconductor layer 31 functioning as the channel is boosted from the voltage VCHA to the voltage VCHB. For example, in the semiconductor memory device, erroneous writing to the memory cell transistor MT electrically connected to the data write-protected bit line (the bit line Inhibit BL) may be increased by the voltage (e.g., the voltage VCHB) obtained by boosting the semiconductor layer serving as the channel. In order to suppress erroneous writing, it is necessary to increase the boosted voltage.

As shown in FIG. 13, the disclosed semiconductor memory device 1 supplies the voltage VPASS higher than the voltage VNEG after supplying the voltage VNEG to the odd word lines WLo0 to WLo2 and WLo4 to WLo7 and the odd word line WLo3 in the write operation. As a result, by coupling the semiconductor layer 31 functioning as the channel with the odd word lines WLo0 to WLo7 including the odd word line WLo3 (the second word line), the voltage of the semiconductor layer 31 functioning as the channel becomes the voltage VCHC higher than the voltage VCHB in the comparative example.

That is, by using the write operation of the semiconductor memory device 1 of the present disclosure, it is possible to boost the respective channels (the third channel) of the memory cell transistors MT0eb1 to MT7eb1 (the third memory cell) and the respective channels (the fourth channel) of the memory cell transistors MT0ob1 to MT7ob1 (the fourth memory cell) to the voltage VCHC higher than the voltage VCHB in the comparative example. As a result, the semiconductor memory device 1 of the present disclosure can effectively suppress erroneous writing to the memory cell transistor MT electrically connected to the bit line Inhibit BL.

<2-2-5. Example of Write Operation at Times T4 to T5>

The write operation at times T4 to T5 will be described with reference to FIG. 13. The write operation from time T4 to time T5 is an operation for writing a predetermined voltage to the selected memory cell transistor MT. As shown in FIG. 13, at times T4 to T5, the selected even select gate line SEL-SGDe (the select gate line SGD0) is supplied with the voltage VSG, the bit line Program BL (the bit line BL2) is supplied with the voltage VSS, and the select transistors ST1eb2, ST1eb1 is kept in the on-state. The unselected odd select gate line USEL-SGDo (the select gate line SGD1) is supplied with the voltage VSS, the bit line Inhibit BL (the bit line BL1) is supplied with the voltage VDD, and the select transistors ST1ob2, ST1ob1 are turned off. The selected even word line SEL-WLe-n (the select word line WLe3 (the first word line)) is supplied with a voltage VPRG (a seventh voltage) from the voltage VPASS (the fifth voltage), and the memory cell transistor MT3eb2 and the memory cell transistor MT3eb1 are turned on. The unselected even word line USEL-WLe (the word lines WLe4 to WLe7, and the word lines WLe0 to WLe2) other than the selected even word line SEL-WLe_n, and the odd word lines WLo0 to WLo7 are supplied with the voltage VPASS (the fifth voltage), and the memory cell transistors MT4eb2 to MT7eb2, the memory cell transistors MT4eb1 to MT7eb1, the memory cell transistors MT0eb2 to MT2eb2, and the memory cell transistors MT0eb1 to MT2eb1 are turned on. The channels of the memory cell transistor MT electrically connected to the bit line Inhibit BL keep the voltage VCHC (the sixth voltage). The even select gate line SGSe and the odd select gate line SGSo are supplied with the voltage VSS, and the select transistors ST2eb2, ST2ob2, ST2ob1, ST2eb1 are kept in the off-state.

In an embodiment, the voltage VPRG (the seventh voltage) is higher than the voltage VPASS (the fifth voltage) and the voltage VCHA (the sixth voltage). The voltage VCHC (the sixth voltage) is smaller than the voltage VPASS (the fifth voltage) and higher than the voltage VCHPCH (the first voltage).

As described above, the selected even word line SEL-WLe_n (the selected word line WLe3 (the first word line)) is supplied with the voltage VPRG (the seventh voltage), and in a state where the memory cell transistor MT3eb2 and the memory cell transistor MT3eb1 are turned on, for example, the bit line Program BL (the bit line BL2) is supplied with the predetermined voltage from the voltage VSS. The predetermined voltage is, for example, a voltage corresponding to "eR" level, "A" level, "B" level, "C" level, "D" level, "E" level, "F" level, and "G" level. The voltage VPRG (the seventh voltage) is a voltage sufficiently higher than the predetermined voltage. Thus, the memory cell transistor MT3eb2 is written with the predetermined voltage. In an embodiment, the voltage VPRG (the seventh voltage) may also be referred to as a write voltage.

On the other hand, the channel of the memory cell transistor MT3eb1 is one of the channels of the memory cell transistor MT electrically connected to the bit line Inhibit BL. Therefore, the channel of the memory cell transistor MT3eb1 is kept with the voltage VCHC (the sixth voltage).

That is, the memory cell transistor MT3eb1 is effectively suppressed from erroneous writing.

The potential difference between the voltage VCHC (the sixth voltage) supplied to the channels of the memory cell transistor MT3eb1 and the voltage VPRG (the seventh voltage) supplied to the selected word line WLe3 (the first word line) electrically connected to the memory cell transistor MT3eb1 is smaller than the potential difference between the voltage VCHB and the voltage VPRG (the seventh voltage) of the comparative example. In the semiconductor memory device 1 according to an embodiment, the voltage VCHC (the sixth voltage) is a boost voltage, the voltage VPRG (the seventh voltage) is the write voltage. Therefore, by using the write operation of the semiconductor memory device 1 according to an embodiment, it is possible to reduce the potential difference between the boost voltage and the write voltage. When the boost voltage is small, the potential difference between the boost voltage and the write voltage becomes large, and erroneous writing to the memory cell transistor MT corresponding to the bit line Inhibit BL increases, so that the threshold window may become small. On the other hand, by using the write operation of the semiconductor memory device 1 according to an embodiment, the boost voltage is increased, and the potential difference between the boost voltage and the write voltage can be reduced, so that the threshold window can be enlarged.

In the write operation of the semiconductor memory device 1 according to an embodiment, the operation up to time T2 may be referred to as a "first operation" and the operation from time T3 to time T5 may be referred to as a "second operation".

<2-2-6. Example of Order of Data Writing to Memory Cell Transistor MT>

An example of the order of data writing operation to the memory cell transistor MT according to an embodiment will be described with reference to FIG. 18. For example, the semiconductor memory device 1 according to an embodiment includes the memory group MG0, the memory group MG1, the memory group MG2, and the memory group MG3. Each of the memory groups MG has the memory cell transistors MT0 to MT7 electrically connected to each of the word lines WL0 to WL7. For example, the word line WL0 is electrically connected to the memory cell transistor MT0, and the word line WL5 is electrically connected to the memory cell transistor MT5.

As shown in FIG. 18, for example, the word line WL0 to the word line WL7 are selected sequentially. When the word line WL0 is selected, the memory cell transistor MT0 included in the memory group MG0 and electrically connected to the word line WL0 is the first to be written with data. Next, the memory cell transistor MT0 included in the memory group MG1 and electrically connected to the word line WL0 is the second to be written with data. Next, the memory cell transistor MT0 included in the memory group MG2 and electrically connected to the word line WL0 is the third to be written with data, and the memory cell transistor MT0 included in the memory group MG3 and electrically connected to the word line WL0 is fourth to be written with data.

Subsequently, when the word line WL1 is selected, the memory cell transistor MT0 included in the memory group MG0 and electrically connected to the word line WL1 is the fifth to be written with data. The memory cell transistor MT1 included in the memory group MG1 and electrically connected to the word line WL1 is the sixth to be written with data. Next, the memory cell transistor MT1 included in the memory group MG2 and electrically connected to the word line WL1 is the seventh to be written with data, and the memory cell transistor MT1 included in the memory group MG3 and electrically connected to the word line WL1 is the eighth to be written with data.

After the word line WL0 and the word line WL1, the word line WL2 is selected, and the ninth to twelfth memory cell transistors MT2 are written with data in the same manner as the word line WL0 and the word line WL1. In the same manner as for the data writing operation of the word lines WL0 to WL2 the word line WL3 to the word line WL7 are selected sequentially, the 13th to 16th memory cell transistors MT3 are written with data, the 17th to 20th memory cell transistors MT4 are written with data, the 21st to 24th memory cell transistors MT5 are written with data, the 25th to 28th memory cell transistors MT6 are written with data, and the 29th to 32th memory cell transistors MT7 are written with data.

<2-3. First Modification of Write Operation (Modification 1)>

The first modification of the data write operation in the semiconductor memory device 1 according to an embodiment will be described. In the modification 1, mainly, the voltage supplied to a part of the odd word lines WLo_n is different from the example of the data write operation of the semiconductor memory device 1 according to an embodiment described above. In the description of the modification 1 of the write operation, differences are mainly described with respect to the example of the data write operation of the semiconductor memory device 1 according to the embodiment, and duplicate descriptions are added when necessary.

Figure 19:
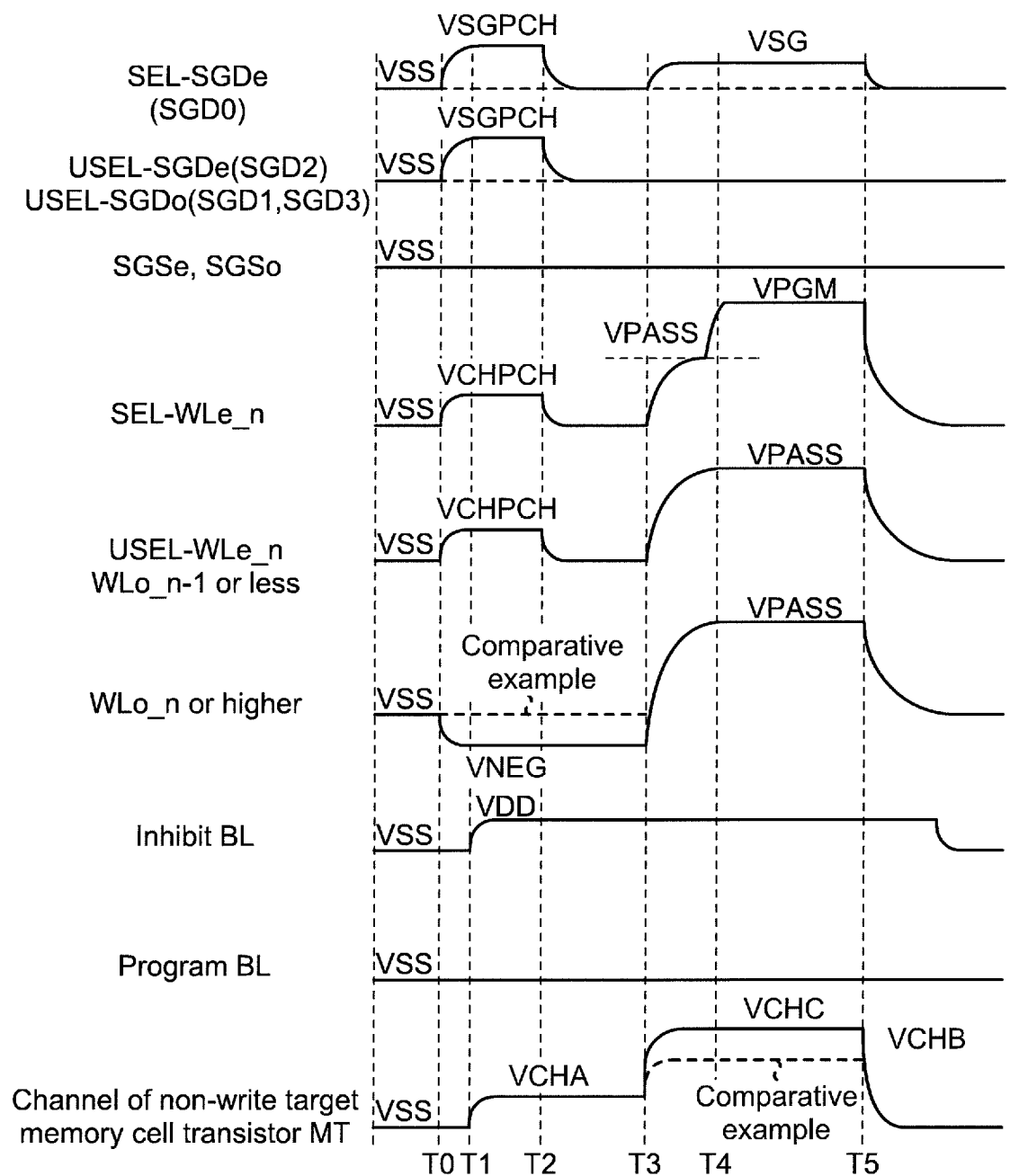
FIG. 19 is a diagram showing a first modification (modification 1) of the timing charts of various signals at the time of a data write operation in a semiconductor memory device according to an embodiment.
Figure 20:
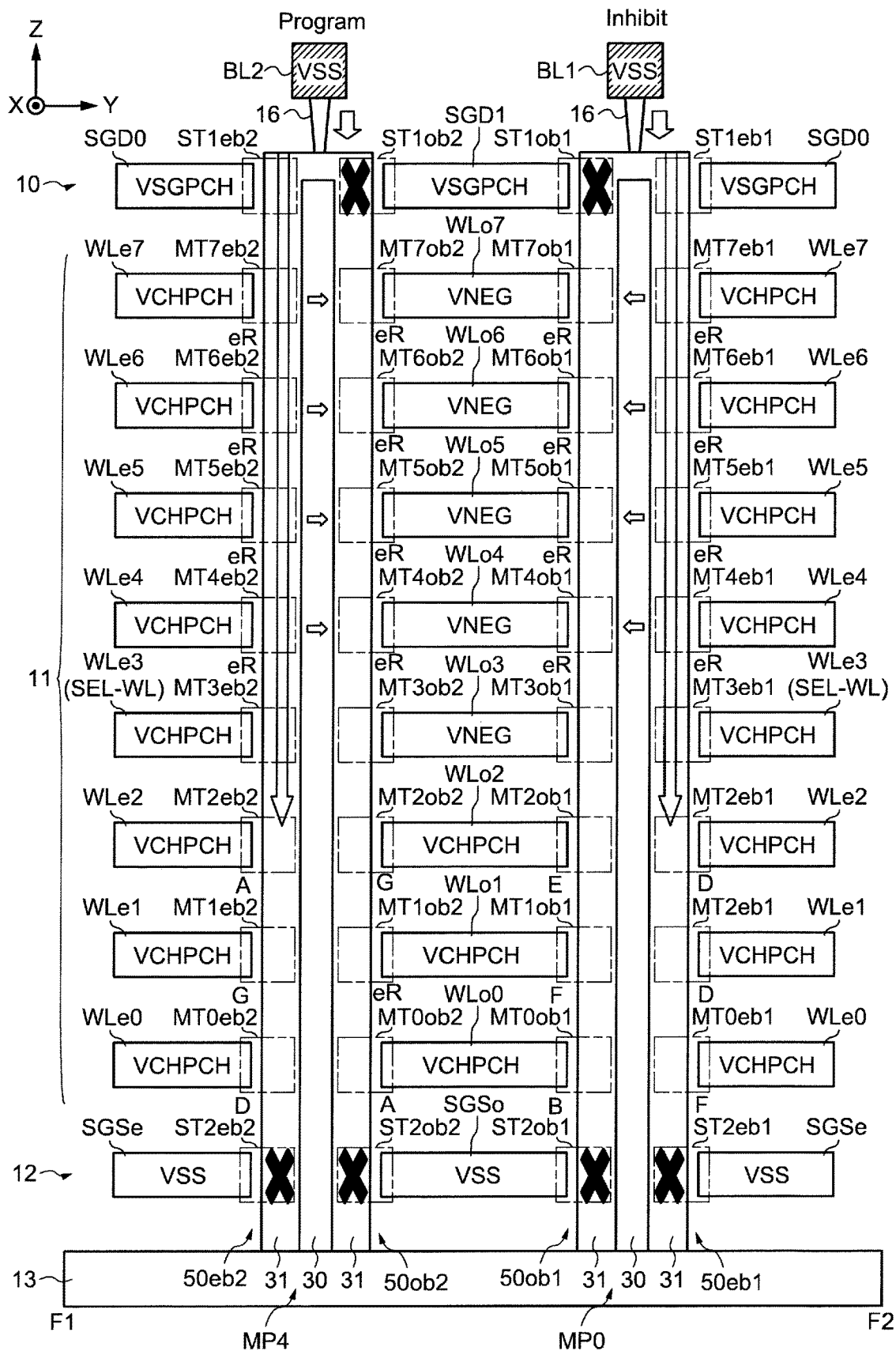
FIG. 20 is an end view of a cutting area of a semiconductor memory device according to an embodiment for explaining voltages supplied to various signal lines at time T1 shown in a timing chart shown in FIG. 19.
Figure 21:
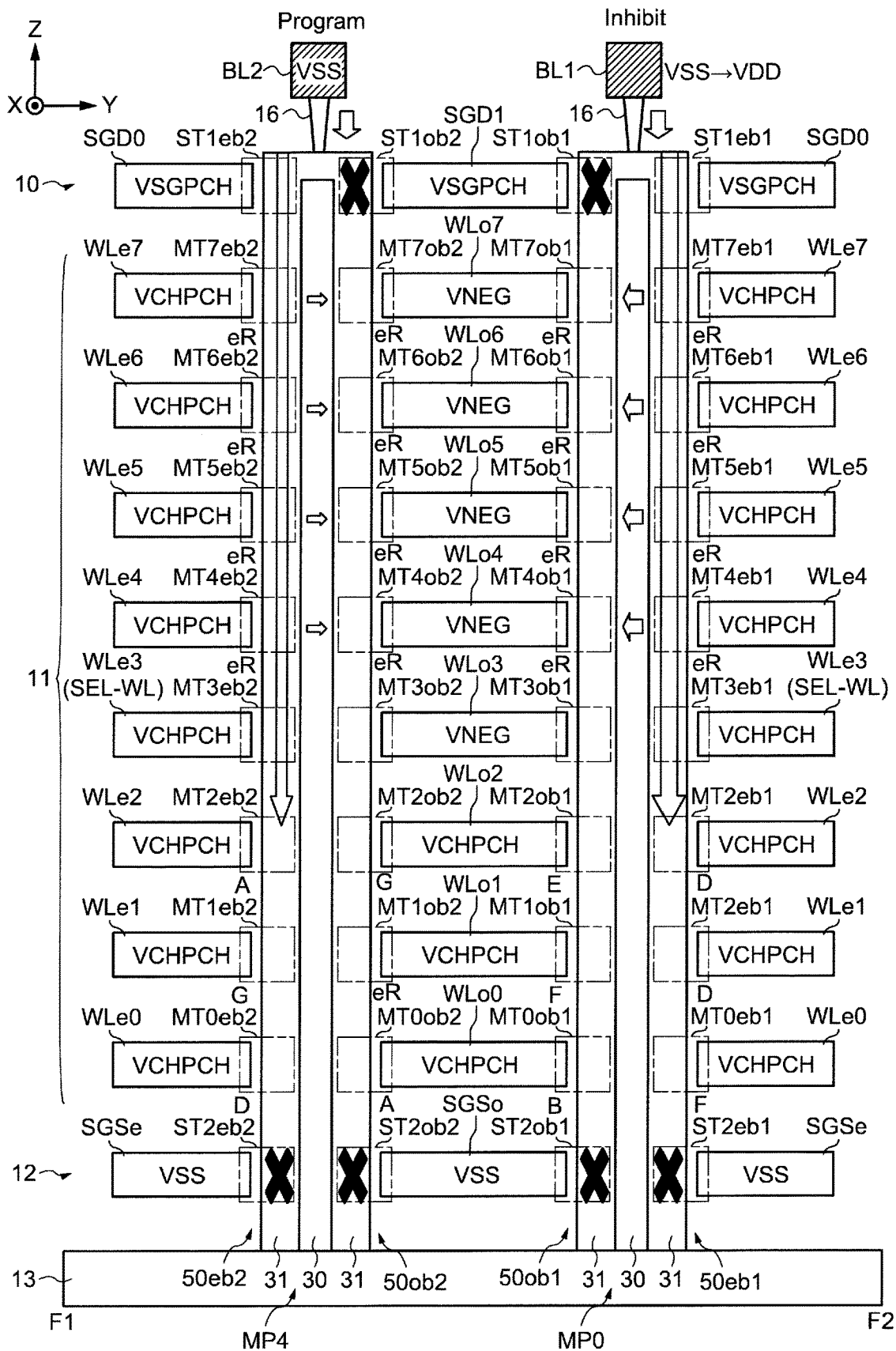
FIG. 21 is an end view of a cutting area of a semiconductor memory device according to an embodiment for explaining voltages supplied to various signal lines at times T1 to T2 shown in a timing chart shown in FIG. 19.

FIG. 19 is a diagram showing the modification 1 of the timing chart of various signals at the time of the data write operation in the semiconductor memory device 1 according to an embodiment, FIG. 20 is an end view of a cutting area of the semiconductor memory device for explaining the voltages supplied to the various signal lines at time T1 of FIG. 19, and FIG. 21 is an end view of a cutting area of the semiconductor memory device 1 for explaining the voltages supplied to various signal lines at time T1 to time T2 of FIG. 19. The timing chart of the first modification of the data write operation according to the embodiment and the configuration according to the timing chart is not limited to the timing chart of the data write operation shown in FIGS. 19 to FIG. 21 and the configuration according to the timing chart. In the descriptions of FIG. 19 to FIG. 21, descriptions of the same or similar structures as those of FIG. 1 to FIG. 18 may be omitted.

Since the structure or function of the end view of a cutting area shown in FIG. 20 to FIG. 21 is similar to the structure or function of the end view of a cutting area shown in FIG. 14 to FIG. 17, the description herein of the content that overlaps with the description of the structure or function of the end view of a cutting area shown in FIG. 14 to FIG. 17 is omitted.

In the write operation in the modification 1, an odd word line WLo_n−1 or lower (WLo_n−1 or lower) whose numerical value n is equal to or lower than the numerical value n−1 is operated in the same manner as the unselected even word line USEL-WLe other than the selected even word line SEL-WLe_n, with respect to the example of the data write operation of the semiconductor memory device 1 according to an embodiment described above. The odd word line WLo_n or higher (WLo_n or higher) whose numerical value n is equal to or higher than the numerical value n is operated in the same manner as the odd word lines WLo0 to WLo7. The operation such as the signal line except for the part of the odd word lines WLo_n is the same as the data write operation of the semiconductor memory device 1 according to an embodiment described above.

In an embodiment, for example, the odd word line WLo_n is a word line WL facing the selected even word line SEL-WLe_n. For example, as shown in FIG. 19, in the write operation from times T0 to T1 in the modification 1, the odd word line WLo_n−1 or lower (WLo_n−1 or lower) whose numerical value n is n−1 or lower is supplied with the voltage VCHPCH (the first voltage) from the voltage VSS, similar to the unselected even word line USEL-WLe other than the selected even word line SEL-WLe_n. The odd word line WLo_n or higher (WLo_n or higher) whose numerical value n is numerical value n or higher is supplied with the voltage VNEG (the second voltage) from the voltage VSS.

As shown in FIG. 19, in the write operation from time T1 to time T2 in the modification 1, the odd word line WLo_n−1 or lower (WLo_n−1 or lower) whose numerical value n is equal to or lower than the numerical value n−1 keeps the voltage VCHPCH (the first voltage) in the same manner as the unselected even word line USEL-WLe other than the selected even word line SEL-WLe_n. The odd word line WLo_n or higher (WLo_n or higher) whose numerical value n is the numerical value n or higher keeps the voltage VNEG (the second voltage).

For example, as shown in FIGS. 20 to 21, when the numerical value n is 3, the odd word line WLo_n or higher (WLo_n or higher) is the odd word line WLo_3 or higher (WLo3 or higher), and the odd word line WLo_n−1 or lower (WLo_n−1 or lower) is the odd word line WLo_2 or lower (WL2 or lower). The odd word line WLo_3 or higher (WLo3 or higher) is the odd word lines WLo3 to WLo7 of the third odd word line WLo3 or higher, and the odd word line WLo_2 or lower (WLo2 or lower) is the odd word lines WLo0 to WLo2 of the second odd word line WLo2 or lower.

As shown in FIG. 20, at time T1, the odd word lines WLo3 to WLo7 equal to or higher than the odd word line WLo3 facing the selected even word line WLe3 (the first word line) are supplied with the voltage VNEG (the second voltage), and the memory cell transistors MT3*eb*1 to MT7*eb*7 and the memory cell transistors MT3*ob*1 to MT7*ob*7 are kept in the off-state. The odd word lines WLo0 to WLo2 of the odd word line WLo_2 or lower (WLo2 or lower) are supplied with the voltage VCHPCH (the first voltage). Since the voltage VCHPCH (the first voltage) is smaller than the voltage level for reading the threshold voltage equal to or higher than the "A" level, the memory cell transistors MT0*ob*2 to MT2*ob*2 and the memory cell transistors MT0*eb*1 to MT2*eb*1 are turned off.

Next, as shown in FIG. 21, at times T1 to T2, the odd word lines WLo3 to WLo7 equal to or higher than the odd word line WLo3 facing the selected even word line WLe3 (the first word line) keep the voltage VNEG (the second voltage), and the memory cell transistors MT3*eb*1 to MT7*eb*7 and the memory cell transistors MT3*ob*1 to MT7*ob*7 are kept in the off-state. The odd word lines WLo0 to WLo2 of the odd word line WLo_2 or lower (WLo2 or lower) keep the voltage VCHPCH (the first voltage), and the memory cell transistors MT0*ob*2 to MT2*ob*2 and the memory cell transistors MT0*eb*1 to MT2*eb*1 are kept in the off-state.

In the write operation in the modification 1, at times T3 to T4, the odd word lines WLo3 to WLo7 (four signal lines) are supplied with the voltage VPASS from the voltage VNEG. In other words, the voltage of the odd word lines WLo3 to WLo7 is boosted from the voltage VNEG to the voltage VPASS. For example, the write operation in the modification 1 can reduce the number of the signal lines to be boosted compared to the operation for boosting the odd word lines WLo0 to WLo7 (seven signal lines). That is, by executing the write operation in the modification 1, the driving load of the semiconductor memory device 1 is reduced. As a result, the power consumption of the semiconductor memory device 1 is reduced as compared with the case where the number of signal lines to be boosted is large.

<2-4. Second Modification of Write Operation (Modification 2)>

The modification 2 of the data write operation in the semiconductor memory device 1 according to an embodiment will be described. In the modification 2, mainly, the voltage supplied to a part of the odd word lines WLo_n is different from the modification 1 described above. In the description of the modification 2, different points are mainly described with respect to the modification 1, and duplicate descriptions are added as necessary.

Figure 22:
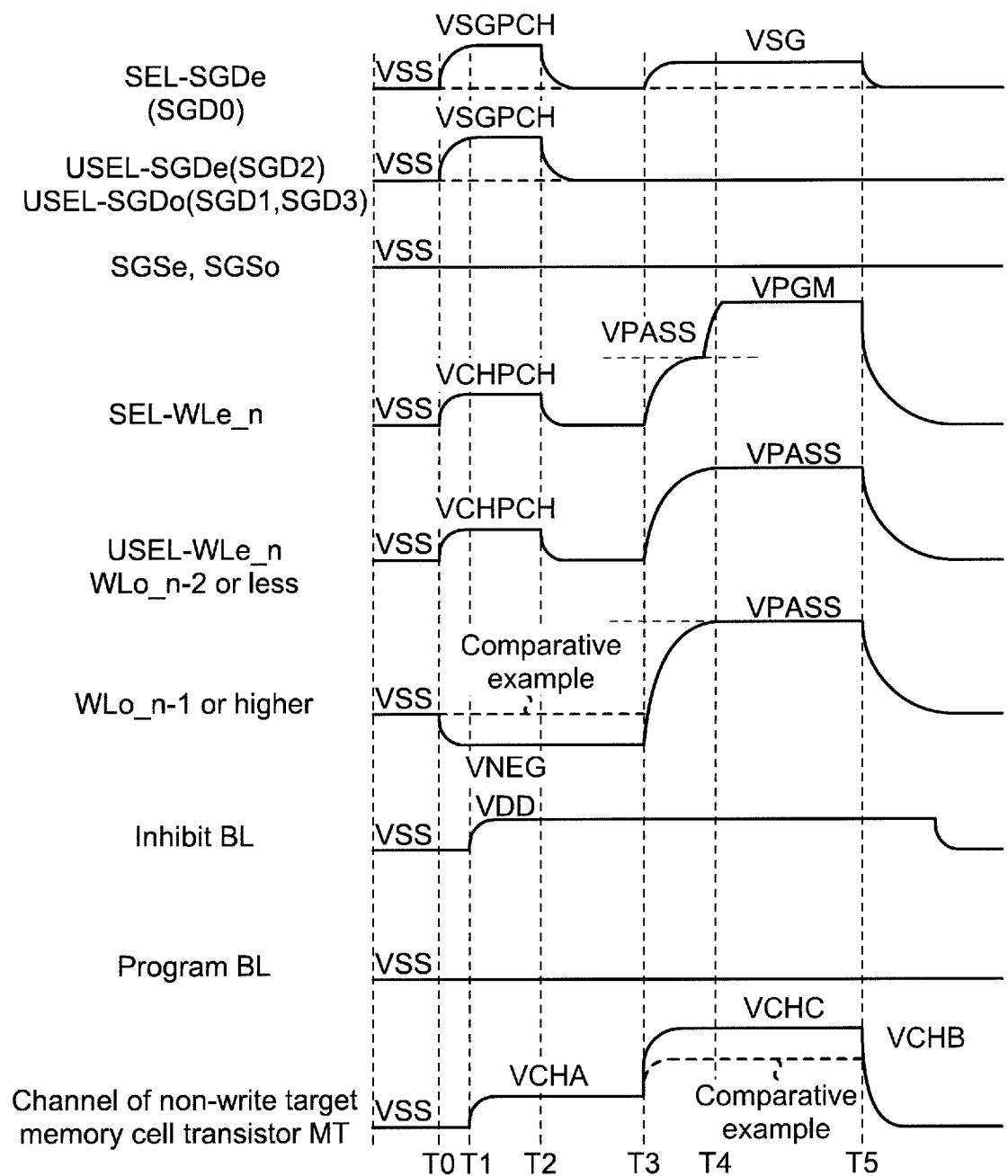
FIG. 22 is a diagram showing a second modification (modification 2) of the timing chart of various signals at the time of a data write operation in a semiconductor memory device according to an embodiment.
Figure 23:
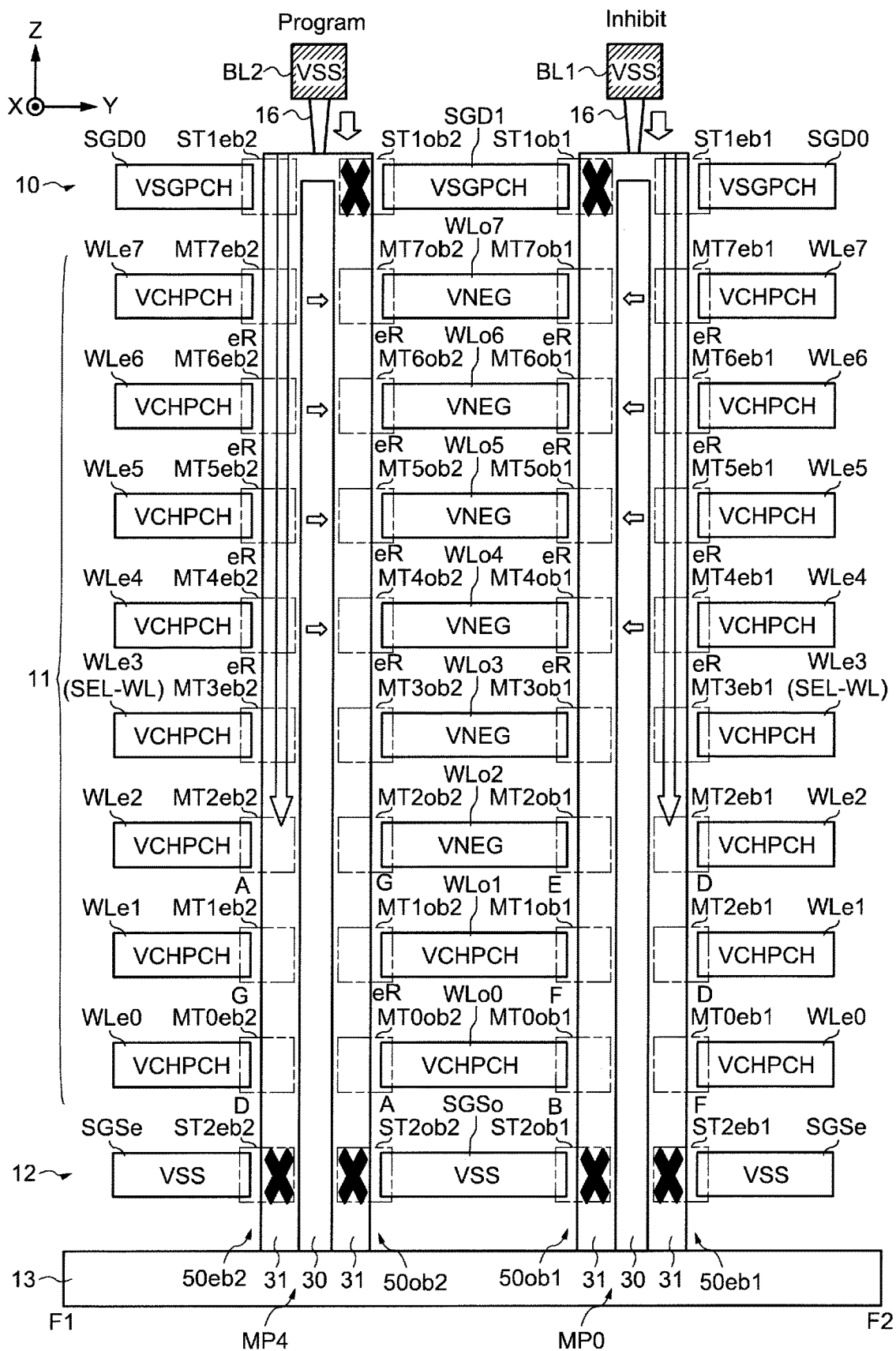
FIG. 23 is an end view of a cutting area of a semiconductor memory device according to an embodiment for explaining voltages supplied to various signal lines at time T1 shown in a timing chart shown in FIG. 22.
Figure 24:
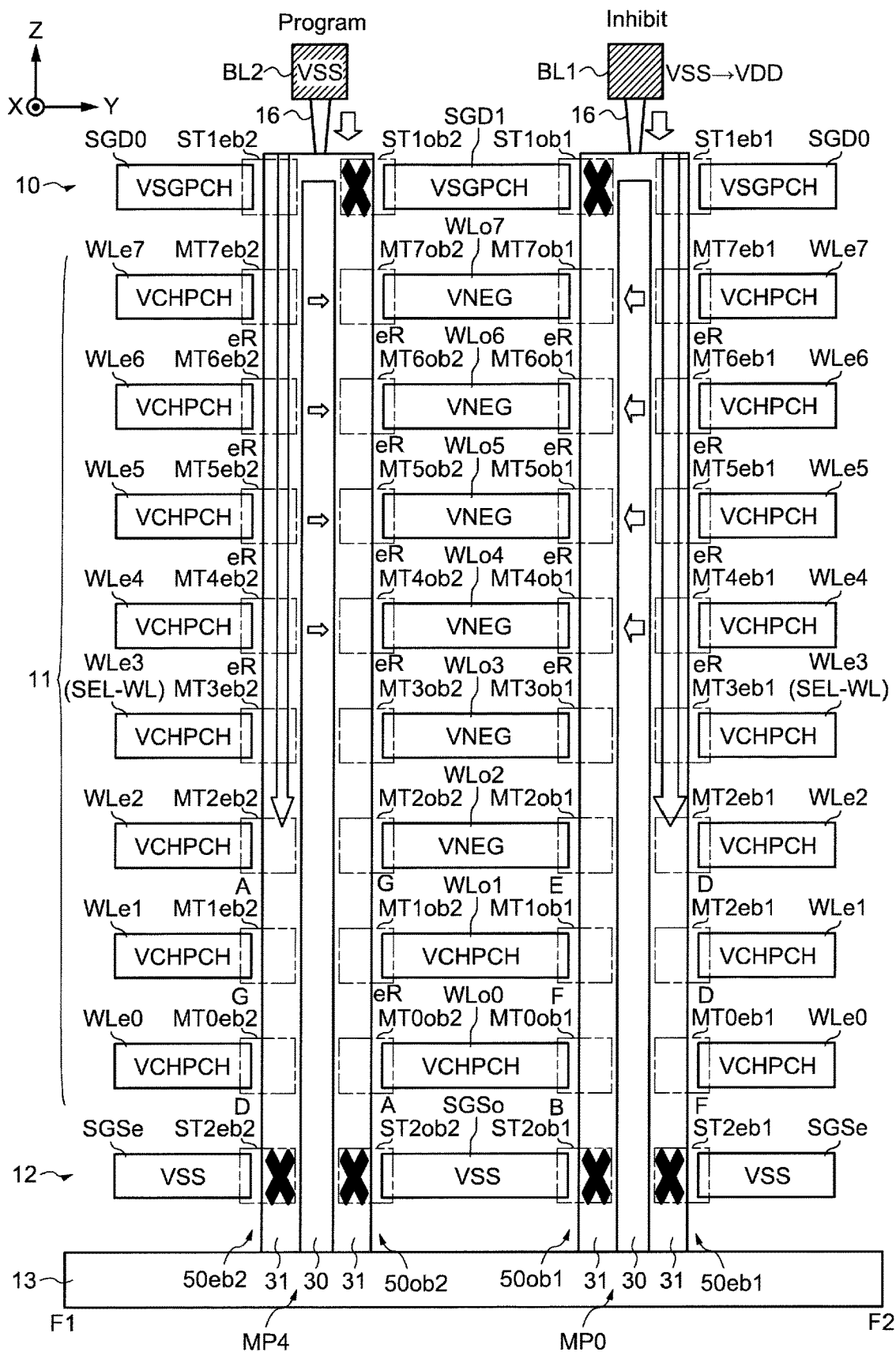
FIG. 24 is an end view of a cutting area of a semiconductor memory device according to an embodiment for explaining voltages supplied to various signal lines at times T1 to T2 shown in a timing chart shown in FIG. 22.

FIG. 22 is a diagram showing the modification 2 of the timing charts of various signals at time of the data write operation in the semiconductor memory device 1 according to an embodiment. FIG. 23 is an end view of a cutting area of the semiconductor memory device for explaining the voltages supplied to the various signal lines at time T1 of FIG. 22. FIG. 24 is an end view of a cutting area of the semiconductor memory device 1 for explaining the voltages supplied to the various signal lines at times T1 to T2 of FIG. 22. The timing chart of the modification 2 of the data write operation according to an embodiment and the configuration according to the timing chart is not limited to the timing chart of the data write operation shown in FIGS. 22 to 24 and the configuration according to the timing chart. In the descriptions of FIG. 22 to FIG. 24, descriptions of the same or similar structures as those of FIG. 1 to FIG. 21 may be omitted.

The configuration or function of the end view of a cutting area shown in FIG. 23 to FIG. 24 is similar to the configuration or function of the end view of a cutting area shown in FIG. 14 to FIG. 17. Therefore, the description of the same content as the description of the configuration or function of the end view of a cutting area shown in FIG. 14 to FIG. 17 is omitted here.

In the write operation in the modification 2, the odd word line WLo_n−2 or lower (WLo_n−2 or lower) whose numerical value n is equal to or lower than the numerical value n−2 is operated in the same manner as the unselected even word line USEL-WLe other than the selected even word line SEL-WLe_n, with respect to the example of the data write operation of the semiconductor memory device 1 according to an embodiment described above. The odd word line WLo_n−1 or higher (WLo_n−1 or higher) whose numerical value n is equal to or higher than the numerical value n−1 is operated in the same manner as the odd word lines WLo0 to WLo7. The operation of the signal lines and the like except for the part of the odd word lines WLo_n is the same as the data write operation of the semiconductor memory device 1 according to an embodiment described above.

That is, relative to the modification 1 described above, the write operation in the modification 2 is the operation similar to the case where the odd word line WLo_n−1 or lower (WLo_n−1 or lower) is replaced with the odd word line WLo_n−2 or lower (WLo_n−2 or lower), and the odd word line WLo_n or higher (WLo_n or higher) is replaced with the odd word line WLo_n−1 or higher (WLo_n−1 or higher).

In an embodiment, for example, the odd word line WLo_n is the word line WL facing the selected even word line SEL-WLe_n. For example, as shown in FIG. 22, in the write operation from times T0 to T1 in the modification 2, the voltage VCHPCH (the first voltage) is supplied from the voltage VSS to the odd word line WLo_n−2 or lower (WLo_n−2 or lower) similar to the unselected even word line USEL-WLe other than the selected even word line SEL-WLe_n. The odd word line WLo_n−1 or higher (WLo_n−1 or higher) is supplied with the voltage VNEG (the second voltage) from the voltage VSS.

As shown in FIG. 22, in the write operation in times T1 to timeT2 in the modification 2, the odd word line WLo_n−2 or lower (WLo_n−2 or lower) keeps the voltage VCHPCH (the first voltage) as in the case of the unselected even word line USEL-WLe other than the selected even word line SEL-WLe_n. The odd word line WLo_n−1 or higher (WLo_n−1 or higher) keeps the voltage VNEG (the second voltage).

For example, as shown in FIG. 23 to FIG. 24, when the numerical value n is 3, the odd word line WLo_n−1 or higher (WLo_n−1 or higher) is the odd word line WLo_2 or higher (WLo2 or higher), and the odd word line WLo_n−2 or lower (WLo_n−2 or lower) is the odd word line WLo_1 or lower (WLo1 or lower). That is, the odd word line WLo_2 or higher (WLo2 or higher) is the odd word lines WLo3 to WLo7 equal to or higher than the second odd word line WLo2, and the odd word line WLo_1 or lower (WLo1 or lower) is the odd word lines WLo0 to WLo1 equal to or lower than the first odd word line WLo1.

As shown in FIG. 23, at time T1, the odd word lines WLo2 to WLo7 of the odd word line WLo2 or higher are supplied with the voltage VNEG (the second voltage), and the memory cell transistors MT2$eb$1 to MT7$eb$7 and the memory cell transistors MT2$ob$1 to MT7$ob$7 are kept in the off-state. The odd word lines WLo0 to WLo1 of the odd word line WLo_1 or lower (WLo1 or lower) are supplied with the voltage VCHPCH (the first voltage). Since the voltage VCHPCH (the first voltage) is smaller than the voltage level for reading the threshold voltage equal to or higher than the "A" level, the memory cell transistors MT0$ob$2 to MT1 $ob$2 and the memory cell transistors MT0$eb$1 to MT1$eb$1 are turned off.

Next, as shown in FIG. 24, at times T1 to T2, the odd word lines WLo2 to WLo7 higher than or equal to the odd word line WLo2 keep the voltage VNEG (the second voltage), and the memory cell transistors MT2$eb$1 to MT7$eb$7 and the memory cell transistors MT2$ob$1 to MT7$ob$7 are kept in the off-state. The odd word lines WLo0 to WLo1 of the odd word line WLo_1 or lower (WLo1 or lower) keep the voltage VCHPCH (the first voltage), and the memory cell transistors MT0$ob$2 to MT1$ob$2 and the memory cell transistors MT0$eb$1 to MT1$eb$1 are kept in the off-state.

In the write operation in the modification 2, for example, at times T3 to T4, the odd word lines WLo2 to WLo7 are supplied with the voltage VPASS from the voltage VNEG (the voltage supplied with each of the odd word lines WLo2 to WLo7 is boosted from the voltage VNEG to the voltage VPASS). The odd word line WLo2 is a word line adjacent to the odd word line WLo3 facing the selected even word line WLe3 (the first word line). By boosting the voltage supplied with the odd word line WLo2 from the voltage VNEG to the voltage VPASS, for example, the boosting of the channels (the fourth channel) of the memory cell transistor MT3$b$ 1 (the fourth memory cell) electrically connected to the odd word line WLo3 can be assisted from an obliquely lower direction in the Z-direction with respect to the channels (the fourth channel) of the memory cell transistor MT3$ob$1 (the fourth memory cell).

Second Embodiment

Figure 25:
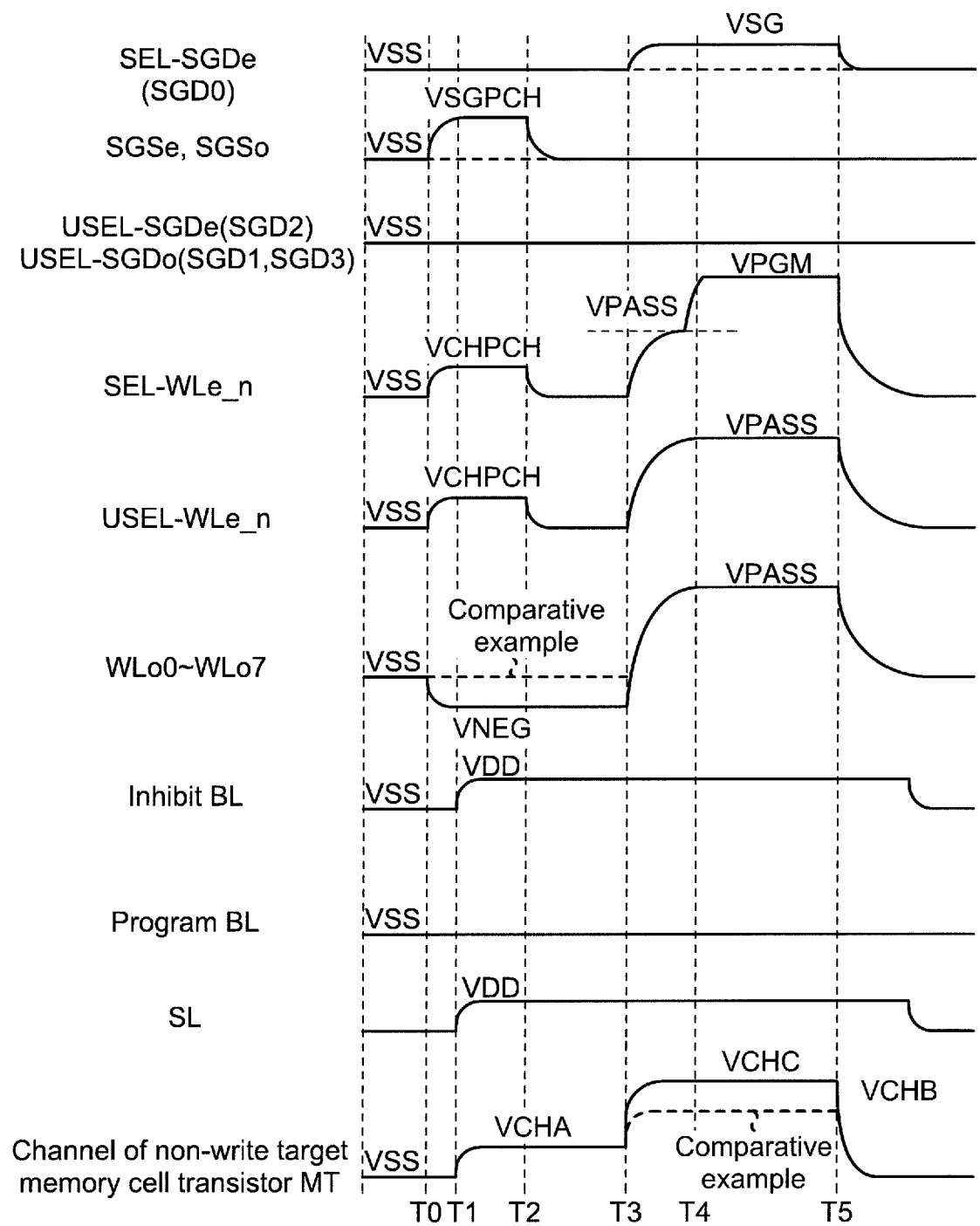
FIG. 25 is a diagram showing timing charts of various signals at the time of a data write operation in a semiconductor memory device according to an embodiment.
Figure 26:
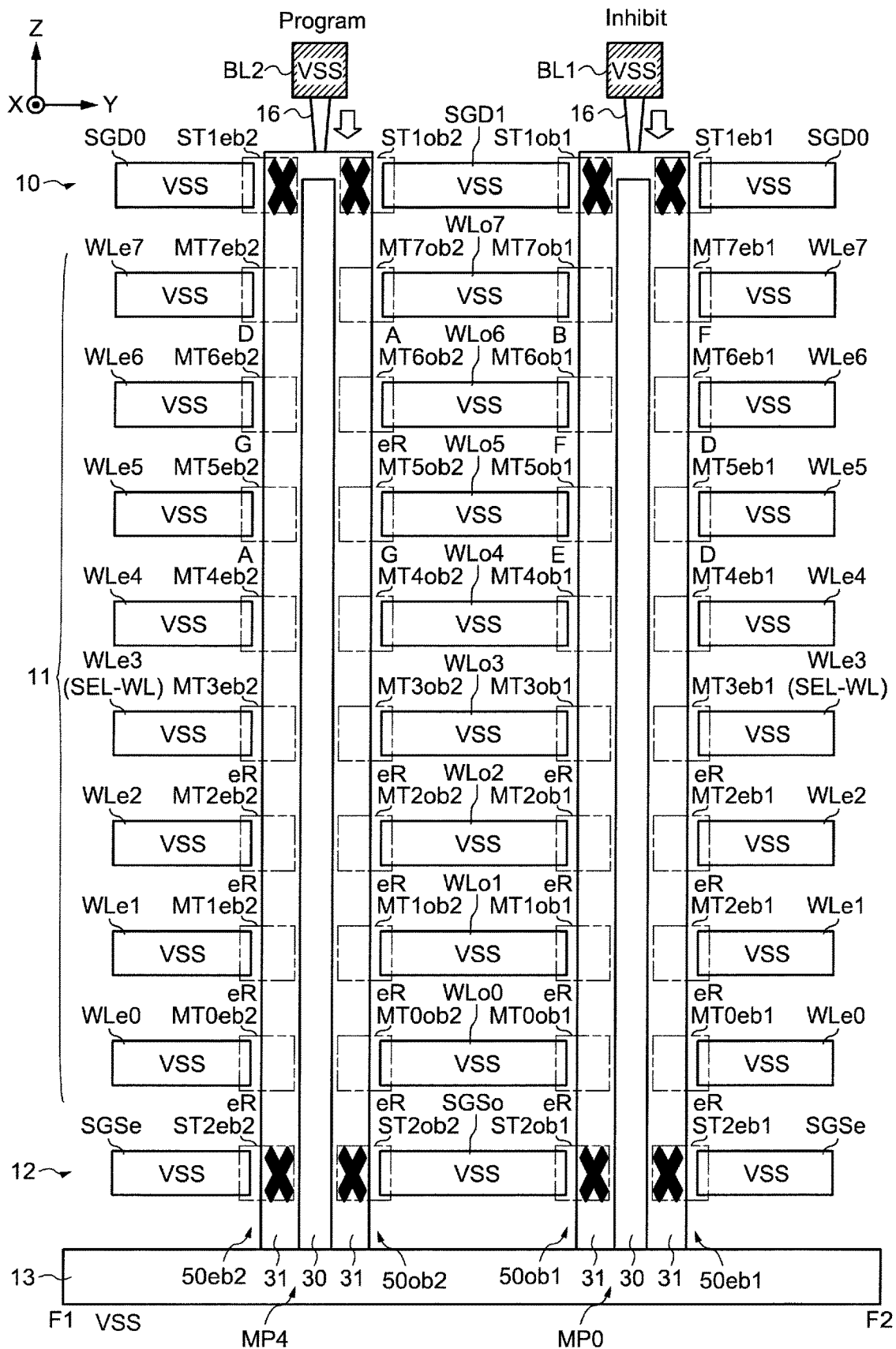
FIG. 26 is an end view of a cutting area of a semiconductor memory device according to an embodiment for explaining voltages supplied to various signal lines at time T0 shown in a timing chart shown in FIG. 25.
Figure 27:
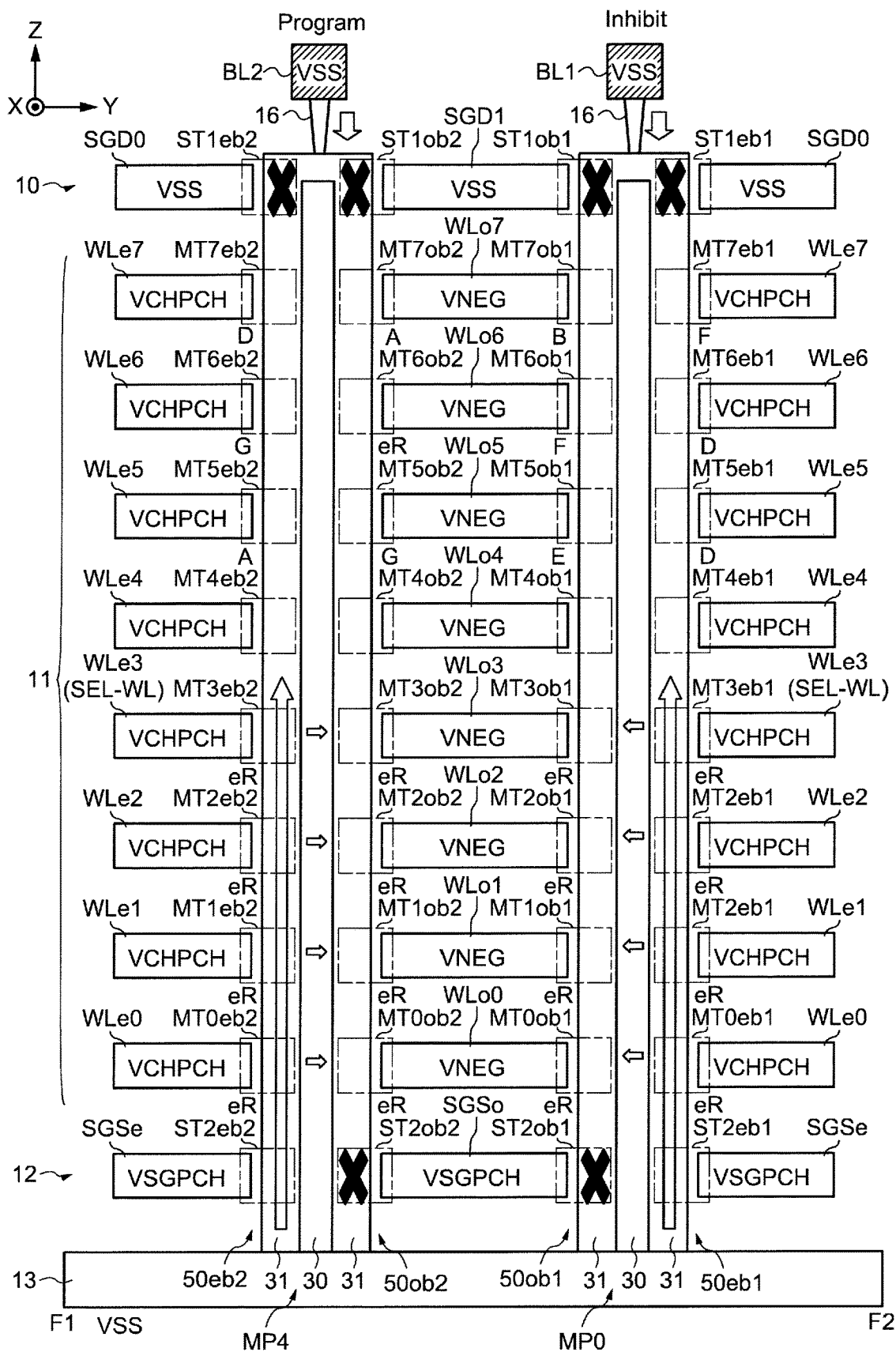
FIG. 27 is an end view of a cutting area of a semiconductor memory device according to an embodiment for explaining voltages supplied to various signal lines at time T1 shown in a timing chart shown in FIG. 25.
Figure 28:
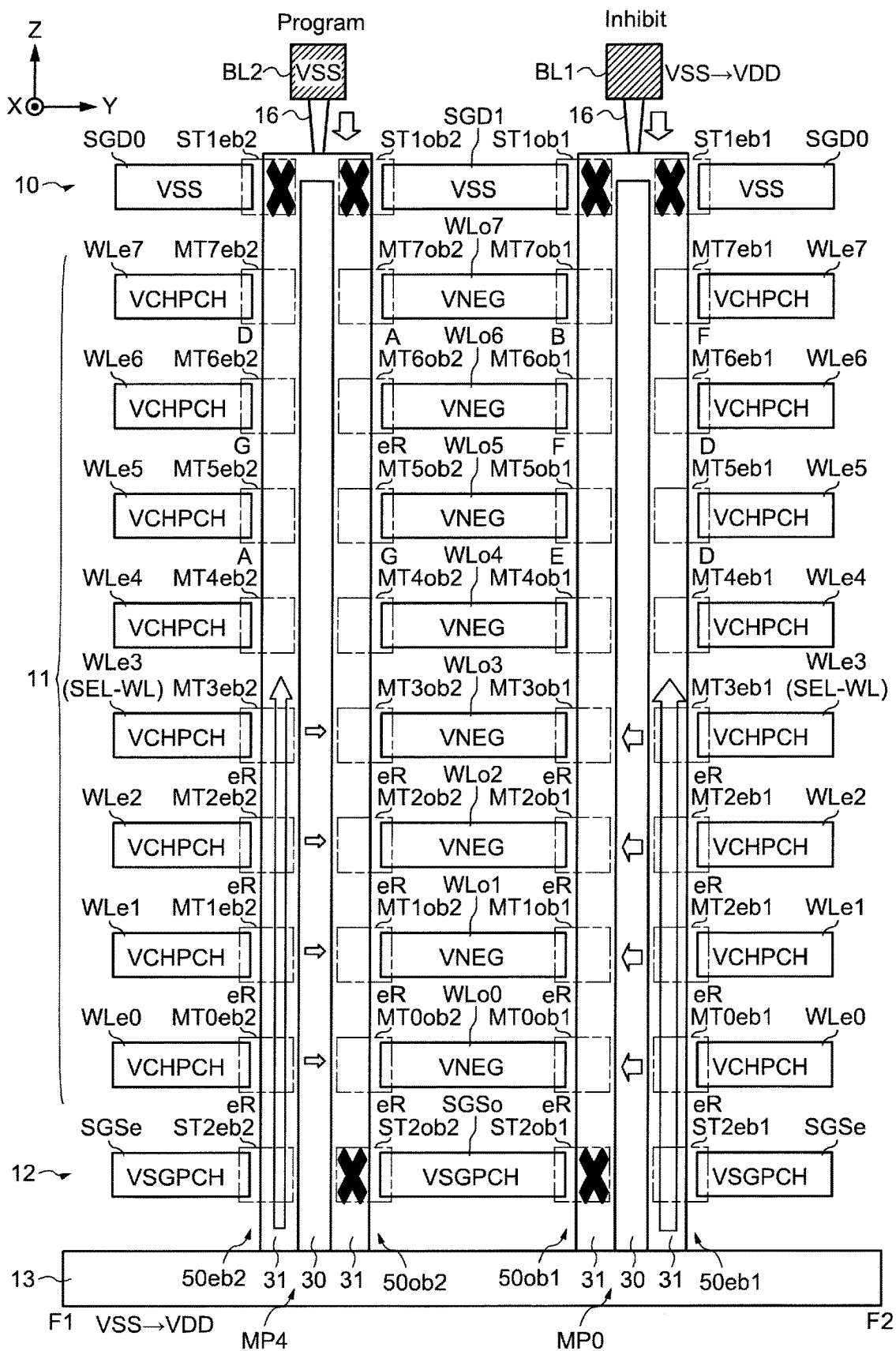
FIG. 28 is an end view of a cutting area of a semiconductor memory device according to an embodiment for explaining voltages supplied to various signal lines at times T1 to T2 shown in a timing chart shown in FIG. 25.
Figure 29:
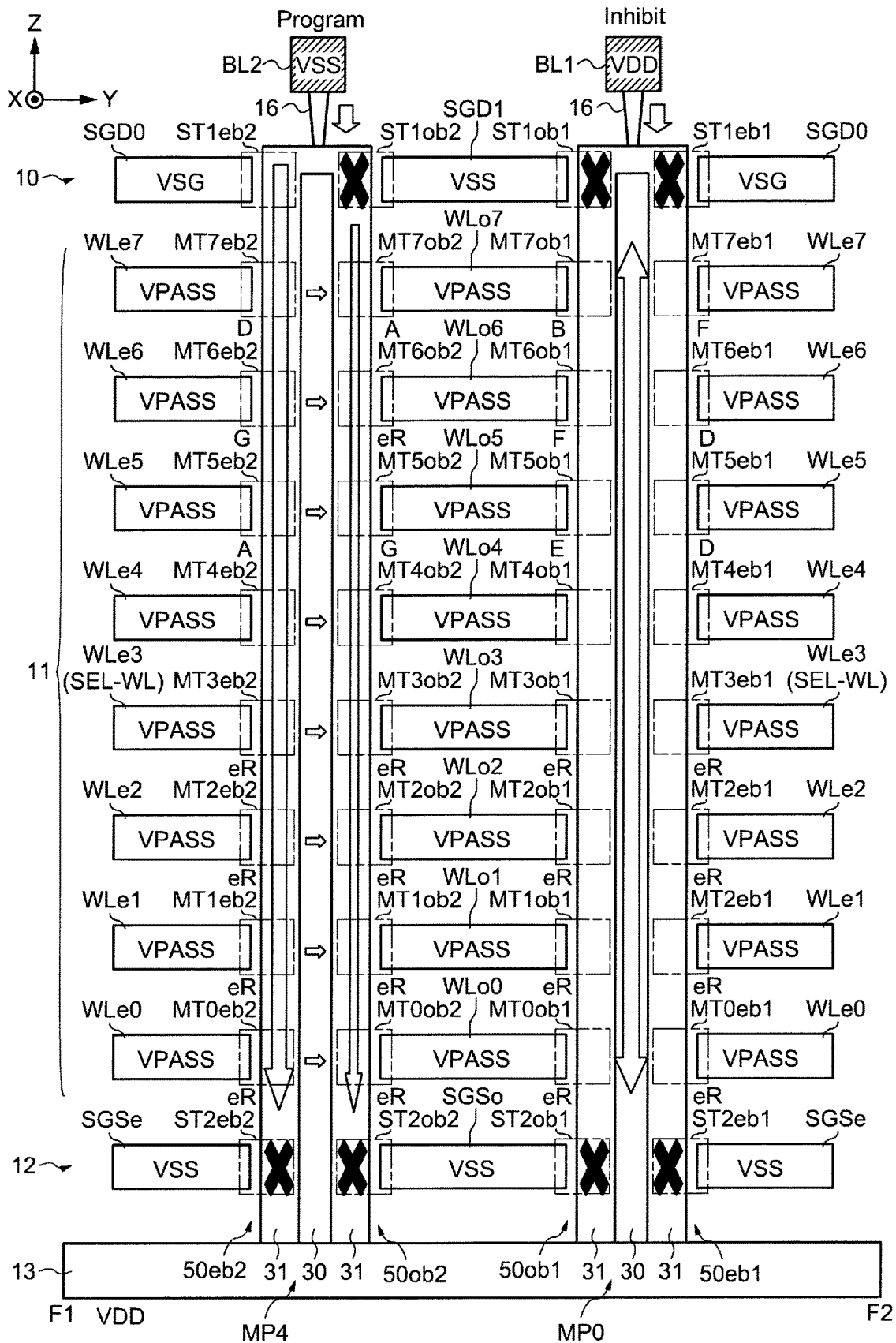
FIG. 29 is an end view of a cutting area of a semiconductor memory device according to an embodiment for explaining voltages supplied to various signal lines at times T3 to T4 shown in a timing chart shown in FIG. 25.

In the first embodiment, in the write operation, the channels of the non-write target memory cell transistor MT are pre-charged from the bit line BL side to the voltage VDD or the voltage VCHA. On the other hand, in the second embodiment, an example in which the channels of the non-write target memory cell transistor MT are pre-charged from the source line SL side will be described. FIG. 25 is a diagram showing a schematic diagram of timing charts of various signals at the time of the data write operation of the semiconductor memory device 1 according to an embodiment. FIG. 26 is an end view of a cutting area of the semiconductor memory device 1 for explaining the voltages supplied to the various signal lines at time T0 of FIG. 25. FIG. 27 is an end view of a cutting area of the semiconductor memory device 1 for explaining the voltages supplied to the various signal lines at time T1 of FIG. 25. FIG. 28 is an end view of a cutting area of the semiconductor memory device 1 for explaining the voltages supplied to various signal lines at times T1 to T2 of FIG. 25. FIG. 29 is an end view of a cutting area of the semiconductor memory device 1 for explaining the voltages supplied to various signal lines at times T3 to T4 of FIG. 25. FIG. 30 is a diagram showing an example of the order of the data writing to a memory cell according to an embodiment. The timing chart of the semiconductor memory device 1 according to an embodiment and the configuration of the timing chart are not limited to the timing chart shown in FIG. 25 to FIG. 30 and the configuration of the timing chart. In the descriptions of FIG. 25 to FIG. 30, descriptions of the same or similar structures as those of FIG. 1 to FIG. 24 may be omitted.

The timing chart shown in FIG. 25 is a diagram which shows that the source line SL is added to the selected even select gate line SEL-SGDe (SGD0), the unselected even select gate line USEL-SGDe (SGD2), the unselected odd select gate line USEL-SGDo (SGD1) facing the selected even select gate line SEL-SGDe, the unselected odd select gate line USEL-SGDo (SGD3) other than the unselected odd select gate line SGDo facing the selected even select gate line SEL-SGDe, the even select gate line SGSe, the odd select gate line SGSo, the bit line Inhibit BL (BL1), and the bit line Program BL (BL2) in the timing chart shown in FIG. 13. In the timing chart shown in FIG. 25, the voltage, configuration, and operation, and the like supplied to other signal lines are the same as in FIG. 13. The end view of a cutting area shown in FIG. 26 to FIG. 29 is similar to the end view of a cutting area shown in FIG. 13 to FIG. 17. In the description of the write operation according to the second embodiment, the same or similar description as that of the drawings shown in FIG. 13 to FIG. 17 and the description related to the drawings shown in FIG. 13 to FIG. 17 is omitted.

In FIG. 26 to FIG. 29, the threshold voltage written to (stored in) each memory cell transistor MT is shown downwardly with respect to the Z-direction of each memory cell transistor MT. Specifically, the threshold voltage "eR" level is written to the memory cell transistors MT0$eb$2 to MT3$eb$2, the memory cell transistor MT6$ob$2, the memory cell transistors MT0$ob$2 to MT3$ob$2, the memory cell transistors MT0$eb$1 to MT3$eb$1, and the memory cell transistors MT0$ob$1 to MT3$ob$1, the threshold voltage "A" level is written to the memory cell transistor MT5$eb$2 and the memory cell transistor MT7$ob$2, the threshold voltage "B" level is written to the memory cell transistor MT7$b$1, the threshold voltage "D" level is written to the memory cell transistor MT7$eb$2 and the memory cell transistors MT5$eb$1 to MT6$eb$1, the threshold voltage "E" level is written to the memory cell transistor MT5$ob$1, the threshold voltage "F" level is written to the memory cell transistor MT6$ob$1 and the memory cell transistor MT7*eb*1, and the threshold voltage "G" level is written to the memory cell transistor MT6*eb*2.

In the write operation according to the second embodiment, as an example, the write operation for writing predetermined data into the memory cell transistor MT4*eb*2 electrically connected to the selected even word line SEL-WLe-n (the selected word line WLe4 (n=4)) will be described. The state of the memory cell transistor MT to which data has already been written is the state in which data has been written using the write operation.

<1. Example of Write Operation Up to Time T0>

The write operation up to time T0 according to the second embodiment will be described with reference to FIG. 25 and FIG. 26. As shown in FIG. 25, the source line SL is supplied with the voltage VSS up to time T0. As described above, the voltage supplied to the other signal line, the configuration and operation, and the like are the same as the voltage supplied to each signal line, the configuration and operation, and the like in FIG. 13, or the voltage, the configuration and operation, and the like supplied to each signal line replaced in FIG. 13, so that descriptions thereof will be omitted.

<2. Example of Write Operation at Time T1>

The write operation at times T0 to T1 will be described with reference to FIG. 25 and FIG. 27. As shown in FIG. 25, at times T0 to T1, the select gate line SEL-SGD (SGD0) and the unselected select gate line SEL-SGD (SGD1, SGD2, SGD3) are supplied with the voltage VSS. The selected even word line SEL-WLe-n and the unselected even word line USEL-WLe are supplied with the voltage VCHPCH (the first voltage) from the voltage VSS. The even select gate line SGSe and the odd select gate line SGSo are supplied with the voltage VSGPCH from the voltage VSS. The odd word lines WLo0 to WLo7 are supplied with the voltage VNEG (the second voltage) from the voltage VSS. The source line SL is supplied with the voltage VSS. Thus, the channels of each memory cell transistor MT are supplied with the voltage VSS. In the second embodiment, similar to the first embodiment, the numerical value n is a positive integer, for example, 3. For example, when the numerical value n is 3, the selected even word line SEL-WLe-n is the even word line SEL-WLe3. The selected even word line SEL-WLe3 is the third even word line SEL-WLe3 of the plurality of selected even word lines SEL-WLe. The configuration of the odd word line WLo_n is the same configuration as the even word line WLe_n described above.

As shown in FIG. 27, at time T1, the even select gate line SGSe and the odd select gate line SGSo are supplied with the voltage VSGPCH, and the word lines WLe0 to WLe7 including the select word line WLe3 (the first word line) are supplied with the voltage VCHPCH, and the select transistors ST2*eb*2, ST2*ob*2, ST2*ob*1, ST2*eb*1, the memory cell transistors MT0*eb*2 to MT3*eb*2, and the memory cell transistors MT0*eb*1 to MT3*eb*1 are turned on. The word lines WLe4 to WLe7 are also supplied with the voltage VCHPCH, and the memory cell transistors MT4*eb*2 to MT7*eb*2, and the memory cell transistors MT4*eb*1 to MT7*eb*1 are turned on, depending on the magnitude of the voltage VCHPCH (the first voltage). The odd word lines WLo0 to WLo7 including the odd word line WLo3 (the second word line) are supplied with the voltage VNEG, and the memory cell transistors MT0*ob*2 to MT7*ob*2 and the memory cell transistors MT0*ob*1 to MT7*ob*7 are kept in the off-state. The select gate line SEL-SGDe (SGD0) and the unselected even select gate line USEL-SGDe (SGD1) are supplied with the voltage VSS, and the select transistors ST1*eb*2, ST1*ob*2, ST1*ob*1, ST1*eb*1 are kept in the off-state. The bit line BL1 and the bit line BL2 are supplied with the voltage VSS.

Consequently, as shown in FIG. 27, the voltage VSS supplied to the source line SL is supplied to the semiconductor layer 31 that functions as the respective channels (the first channel) of the select transistor ST2*eb*2 and the memory cell transistors MT0*eb*2 to MT3*eb*2 (the first memory cell), and the semiconductor layer 31 that functions as the respective channels (the third channel) of the select transistor ST2*eb*1 and the memory cell transistors MT0*eb*1 to MT3*eb*1 (the third memory cell).

A part of the respective channels (the second channel) of the memory cell transistors MT0*ob*2 to MT3*ob*2 (the second memory cell) is shared with the respective channels (the first channel) of the memory cell transistors MT0*eb*2 to MT3*eb*2 (the first memory cell), and a part of the respective channels (the fourth channel) of the memory cell transistors MT0*ob*1 to MT3*ob*1 (the fourth memory cell) is shared with the respective channels (the third channel) of the memory cell transistors MT0*eb*1 to MT3*eb*1 (the third memory cell).

As a result, the voltage of a part of the respective channels (the first channel) of the memory cell transistors MT0*eb*2 to MT3*eb*2 (the first memory cell), the voltage of a part of the respective channels (the second channel) of the memory cell transistors MT0*ob*2 to MT3*ob*2 (the second memory cell), the voltage of a part of the respective channels (the third channel) of the memory cell transistors MT0*eb*1 to MT3*eb*1 (the third memory cell), and the voltage of a part of the respective channels (the fourth channel) of the memory cell transistors MT0*ob*1 to MT3*ob*1 (the fourth memory cell) can be fixed to the voltage VSS.

<3. Example of Write Operation at Time T2>

The write operation from times T1 to T2 will be described with reference to FIG. 25 and FIG. 28. The write operation at times T1 to T2 is, for example, an operation in which the source line SL is supplied with the voltage VDD after the odd word lines WLo0 to WLo7 including the odd word line WLo3 (the second word line) are supplied with the voltage VNEG. In other words, the write operation at times T1 to T2 is the operation that supplies the voltage VDD to the source line SL and pre-charges the channels of the memory cell transistor MT to the voltage VDD or the voltage VCHA. As shown in FIG. 25, at times T1 to T2, the even select gate line SGSe and the odd select gate line SGSo are supplied with the voltage VSGPCH, the selected even word line SEL-WLe_n and the unselected even word line USEL-WLe other than the selected even word line SEL-WLe_n are supplied with the voltage VCHPCH, the odd word lines WLo0 to WLo7 are supplied with the voltage VNEG, and the source line SL is supplied with the voltage VDD (the third voltage) from the voltage VSS. The selected even select gate line SEL-SGDe (SGD0), and the unselected even select gate line USEL-SGDe (SGD2) and the unselected odd select gate lines USEL-SGDo (SGD1, SGD3) are supplied with the voltage VSS. Thus, the channels of the memory cell transistor MT are pre-charged from the voltage VSS to the voltage VCHA (the fourth voltage).

As shown in FIG. 28, from times T1 to T2, the even select gate line SGSe and the odd select gate line SGSo are supplied with the voltage VSGPCH, the select word line WLe3 (the first word line) and the unselected word lines WLe0 to WLe2 are supplied with the voltage VCHPCH, and the select transistors ST2*eb*2, ST2*ob*2, ST2*ob*1, ST2*eb*1, the memory cell transistors MT0*eb*2 to MT3*eb*2, and the memory cell transistors MT0*eb*1 to MT3*eb*1 are kept in the on-state. When the unselected word lines WLe4 to WLe7 are also supplied with the voltage VCHPCH, the memory cell transistors MT5*eb*2 to MT7*eb*2 and the memory cell transistors MT5*eb*1 to MT7*eb*1 are kept in the on-state, for example. The voltage VSS may be supplied to the word lines WLe4 to WLe7. The odd word lines WLo0 to WLo7 including the odd word line WLo3 (the second word line) are supplied with the voltage VNEG, and the memory cell transistors MT0*ob*2 to MT7*ob*2 and the memory cell transistors MT0*ob*1 to MT7*ob*7 are kept in the off-state. The selected even select gate line SEL-SGDe (SGD0), and the unselect even select gate line USEL-SGDe (SGD2) and the unselected odd select gate lines USEL-SGDo (SGD1, SGD3) are supplied with the voltage VSS, and the select transistors ST2*eb*2, ST2*ob*2, ST2*ob*1, ST2*eb*1, are kept in the off-state. The source line SL is supplied with the voltage VDD from the voltage VSS. The bit line Program BL is supplied with the voltage VSS, and the bit line Inhibit BL is supplied with the voltage VDD.

Consequently, as shown in FIG. 28, the voltage VCHA corresponding to the voltage VDD supplied to the source line SL is supplied to the semiconductor layer 31 functioning as the respective channels (the first channel) of the select transistor ST2*eb*2 and the memory cell transistors MT0*eb*2 to MT3*eb*2 (the first memory cell), and the semiconductor layer 31 functioning as the respective channels (the third channel) of the select transistor ST2*eb*1 and the memory cell transistors MT0*eb*1 to MT3*eb*1 (the third memory cell).

The voltage VCHA is supplied to a part of the respective channels (the second channel) of the memory cell transistors MT0*ob*2 to MT3*ob*2 (the second memory cell) via the memory cell transistors MT0*eb*2 to MT3*eb*2 (the first memory cell), and the voltage VCHA is supplied to a part of the respective channels (the fourth channel) of the memory cell transistors MT0*ob*1 to MT3*ob*1 (the fourth memory cell) via the memory cell transistors MT0*eb*1 to MT3*eb*1 (the third memory cell).

From times T2 to T3, as shown in FIG. 25, the even select gate line SGSe, and the odd select gate line SGSo are supplied with the voltage VSS from the voltage SGPCH, and the even word lines SEL-WLe0 to WLe7 are supplied with the voltage VSS from the voltage VCHPCH. The odd word lines WLo0 to WLo7 are supplied with the voltage VNEG, the source line SL is supplied with the voltage VDD, the selected even select gate line SEL-SGDe (SGD0), the unselected even select gate line USEL-SGDe (SGD0), and the unselected odd select gate lines USEL-SGDo (SGD1, SGD3) are supplied with the voltage VSS. The bit line Program BL is supplied with the voltage VSS, and the bit line Inhibit BL is supplied with the voltage VDD. From time T2 to time T3, each memory cell transistor MT is in the off-state, and the channels of the memory cell transistor MT keeps the voltage VCHA (the fourth voltage).

<4. Example of Write Operation at Times T3 to T4>

The write operation from times T3 to T4 will be described with reference to FIG. 25 and FIG. 29. The write operation of times T3 to T4, for example, it is an operation to boost the voltage of the channels of the non-write target memory cell transistor MT from the voltage VCHA (the fourth voltage) to the voltage VCHC (the sixth voltage). As shown in FIG. 25, at times T3 to T4, the selected even select gate line SEL-SGDe is supplied with the voltage VSG from the voltage VSS. The even word lines WLe0 to WLe7 including the selected even word line SEL-WLe_n is supplied with the voltage VPASS (the fifth voltage) from the voltage VSS, and the odd word lines WLe0 to WLe7 is supplied with the voltage VPASS (the fifth voltage) from the voltage VNEG (the second voltage). The bit line Inhibit BL is supplied with the voltage VDD (the third voltage), and the bit line Program BL is supplied with the voltage VSS. Thus, the channels of the (non-write target) memory cell transistor MT corresponding to the bit line Inhibit BL are boosted from the voltage VCHA (the fourth voltage) to the voltage VCHC (the sixth voltage).

As shown in FIG. 29, at times T3 to T4, the even word lines WLe0 to WLe7 including the selected word line WLe3 (the first word line) are supplied with the voltage VPASS from the voltage VSS, and the odd word lines WLe0 to WLe7 including the odd word line WLo3 (the second word line) are supplied with the voltage VPASS from the voltage VNEG.

Similar to the first embodiment, in the second embodiment, in a state where the semiconductor layer 31 functioning as the respective channels (the third channel) of the memory cell transistors MT0*ob*1 to MT7*ob*1 (the fourth memory cell), and the respective channels (the fourth channel) of the memory cell transistors MT0*ob*1 to MT7*ob*1 (the fourth memory cell) holds the voltage VCHA, and the odd word lines WLo0 to WLo7 including the odd word line WLo3 (the second word line) are supplied with the voltage VPASS from the voltage VNEG. That is, the semiconductor layer 31 functioning as the respective channels (the third channel) of the memory cell transistors MT0*eb*1 to MT7*eb*1 (the third memory cell) and the respective channels (the fourth channel) of the memory cell transistors MT0*ob*1 to MT7*ob*1 (the fourth memory cell) is in a floating state holding the voltage VCHA, and the odd word lines WLo0 to WLo7 including the odd word line WLo3 (the second word line) are supplied with the voltage VPASS from the voltage VNEG.

Consequently, similar to the first embodiment, in the second embodiment, by coupling the semiconductor layer 31 functioning as the channel with the odd word lines WLo0 to WLe7 including the odd word line WLo3 (the second word line), the voltage of the semiconductor layer 31 functioning as the channel is raised from the voltage VCHA to the voltage VCHC higher than the voltage VCHA. That is, the respective channels (the third channel) of the memory cell transistors MT0*eb*1 to MT7*eb*1 (the third memory cell) and the respective channels (the fourth channel) of the memory cell transistors MT0*ob*1 to MT7*ob*1 (the fourth memory cell) are boosted.

<5. Example of Write Operation from Times T4 to T5>

The write operation at times T4 to T5 will be described with reference to FIG. 25. As shown in FIG. 25, at times T4 to T5, the selected even select gate line SEL-SGDe (SGD0) is supplied with the voltage VSG, and the select transistor ST1*eb*1 connected to the bit line Program BL is kept in the on-state. On the other hand, the select transistor ST1*eb*1 connected to the bit line Inhibit BL is kept in the off-state. The selected even word line SEL-WLe-n (the selected word line WLe3 (the first word line)) is supplied with the voltage VPRG (the seventh voltage) from the voltage VPASS (the fifth voltage). Since the voltage VSS is supplied to the channels of the (write target) memory cell transistor MT3*eb*2 corresponding to the bit line Program BL, a large voltage difference is generated between the channel and the gate by the voltage VPRG (the seventh voltage) supplied to the selected word line WLe3 (the first word line) as the gate, and writing is performed. On the other hand, the voltage of the channel of the (non-write target) memory cell transistor MT3*eb*2 corresponding to the bit line Inhibit BL is electrically disconnected from the bit line Inhibit BL, so that the voltage of the channel is increased from the voltage VCHA to the voltage VCHC due to the voltage VPRG (the seventh voltage) supplied to the selected word line WLe3 (the first word line) as the gate. Therefore, the (non-write target) memory cell transistor MT3eb2 corresponding to the bit line Inhibit BL does not increase the voltage difference between the channel and the gate, and writing is not performed.

Even when the write operation of the semiconductor memory device 1 according to the second embodiment is used, before the voltage VPRG (the seventh voltage) is supplied to the selected word line WLe3 (the first word line), the channel of the (non-write target) memory cell transistor MT3eb1 corresponding to the bit line Inhibit BL can be raised to the voltage VCHC (the sixth voltage) higher than the voltage VCHB of the comparative example. Therefore, when the voltage VPRG (the seventh voltage) is supplied to the selected word line WLe3 (the first word line), erroneous writing to the (non-write target) memory cell transistor MT3eb1 corresponding to the bit line Inhibit BL can be suppressed.

Therefore, even when the write operation of the semiconductor memory device 1 according to the second embodiment is used, the same operation and effects as those of the first embodiment can be obtained.

<6. Example of Order of Data Writing to Memory Cell Transistor MT>

An example of the order of the writing data to the memory cell transistor MT according to the second embodiment will be described with reference to FIG. 30.

As shown in FIG. 30, for example, the word line WL7 to the word line WL0 are selected sequentially. When the word line WL7 is selected, the memory cell transistor MT7 included in the memory group MG0 and electrically connected to the word line WL7 is the first to be written with data. Next, the memory cell transistor MT7 included in the memory group MG1 and electrically connected to the word line WL7 is the second to be written with data. Next, the memory cell transistor MT7 included in the memory group MG2 and electrically connected to the word line WL7 is the third to be written with data, and the memory cell transistor MT7 included in the memory group MG3 and electrically connected to the word line WL7 is the fourth to be written with data.

That is, relative to the order of writing data to the memory cell transistor MT according to the first embodiment, the order of the writing data to the memory cell transistor MT according to the second embodiment is the same as the order of writing data to the memory cell transistor MT corresponding to the selected word line when the order of selecting the word line is set from the word line WL7 to the word line WL0.

Other Embodiments

The respective units described as the configurations included in the semiconductor memory device in the first embodiment and the second embodiment may be realized by either hardware or software or may be realized by combinations of hardware and software.

In the first embodiment and the second embodiment, when the same, substantially the same, or matching symbols are used, the same, substantially the same, or matching symbols may include a case where an error in the range of design is included.

While several embodiments of the present disclosure have been described above, these embodiments have been presented as examples and are not intended to limit the scope of the invention. These novel embodiments can be implemented in various other forms and may be implemented in combination as appropriate without departing from the spirit of the invention, and various omissions, substitutions, and modifications may be made. These embodiments and modifications thereof are included in the scope and gist of the invention and are also included in the scope of the invention described in the claims and the scope of equivalents thereof.

What is claimed is:

1. A semiconductor memory device comprising:
   a source line extending in a first direction and a second direction intersecting the first direction;
   a first semiconductor pillar having a first semiconductor layer extending in a third direction intersecting the first direction and the second direction and electrically connected to the source line;
   a second semiconductor pillar having a second semiconductor layer extending in the third direction and electrically connected to the source line;
   i first word lines (i is an integer of 4 or more) stacked in the third direction;
   i second word lines stacked in the third direction and having the same positions as the i first word lines with respect to the third direction, respectively; and
   a driver, wherein
   the first semiconductor pillar has a first string provided on a first side and a second string provided on a second side,
   the first string has i first memory cells,
   the i first memory cells are electrically connected in series, arranged along the third direction, and connected to the i first word lines, respectively,
   the second string has i second memory cells,
   the i second memory cells are electrically connected in series, arranged along the third direction, and connected to the i second word lines, respectively,
   the second semiconductor pillar has a third string provided on a third side and a fourth string provided on a fourth side,
   the third string has i third memory cells,
   the i third memory cells are electrically connected in series, arranged along the third direction, and connected to the i first word lines, respectively,
   the fourth string has i fourth memory cells,
   the i fourth memory cells are electrically connected in series, arranged along the third direction, and connected to the i second word lines, respectively,
   a position of the first of the first word line of the i first word lines is closest to a position of the source line, and a position of the i-th of the first word line of the i first word lines is farthest from the position of the source line,
   a position of the first of the second word line of the i second word lines is closest to the position of the source line, and the position of the i-th of the second word line of the i second word lines is farthest from the position of the source line,
   the i first memory cells and the i second memory cells share the first semiconductor layer,
   the i third memory cells and the i fourth memory cells share the second semiconductor layer,
   in writing data to the k-th (k is an integer smaller than i and greater than 1) first memory cell, in a first operation of the writing operation, the driver supplies the k-th first word line with a first voltage larger than a reference voltage, and supplies the k-th second word line with a second voltage smaller than the reference voltage, the first semiconductor pillar is electrically connected to a first bit line, the second semiconductor pillar is electrically connected to a second bit line, in the first operation, the driver supplies the reference voltage to the first bit line and the second bit line, and raises the voltage of a second bit line from the reference voltage to a third voltage larger than the reference voltage, and in the first operation, the driver supplies the first voltage to a k+1-th or higher of the first word line, supplies the second voltage to a k+1-th or higher of the second word line, a k-th or higher of the first memory cell and a k-th or higher of the third memory cell are turned on, and a k-th or higher of the second memory cell and a k-th or higher of the fourth memory cell are turned off.

2. The semiconductor memory device according to claim 1, wherein in the first operation, a voltage of each second channel of a k-th or higher of the second memory cell and a voltage of each fourth channel of a k-th or higher of the fourth memory cell rise to a fourth voltage higher than the reference voltage.

3. The semiconductor memory device according to claim 2, wherein in a second operation following the first operation, the driver supplies a fifth voltage higher than the first voltage to a k-th or higher of the first word line and a k-th or higher of the second word line, as a voltage of a k-th or higher of the second word line rises to the fifth voltage from the second voltage, a voltage of each fourth channel of a k-th or higher of the fourth memory cell rises to a sixth voltage higher than the fourth voltage from the fourth voltage.

4. The semiconductor memory device according to claim 3, wherein in the second operation, the driver supplies a seventh voltage higher than the fifth voltage to a k-th first word line, and the driver writes to a k-th first memory cell.

5. The semiconductor memory device according to claim 1, wherein in a second operation following the first operation, the driver supplies a fifth voltage higher than the first voltage to a k-th or higher of the first word line and a k-th or higher of the second word line.

6. The semiconductor memory device according to claim 5, wherein in a second operation, the driver supplies a seventh voltage higher than the fifth voltage to a k-th first word line, the driver writes to a k-th first memory cell.

7. The semiconductor memory device according to claim 5, wherein the reference voltage is 0 V.

8. A semiconductor memory device comprising:

a source line extending in a first direction and a second direction intersecting the first direction:

a first semiconductor pillar having a first semiconductor layer extending in a third direction intersecting the first direction and the second direction and electrically connected to the source line;

a second semiconductor pillar having a second semiconductor layer extending in the third direction and electrically connected to the source line;

i first word lines (i is an integer of 4 or more) stacked in the third direction;

i second word lines stacked in the third direction and having the same positions as the i first word lines with respect to the third direction, respectively; and a driver, wherein the first semiconductor pillar has a first string provided on a first side and a second string provided on a second side, the first string has i first memory cells, the i first memory cells are electrically connected in series, arranged along the third direction, and connected to the i first word lines, respectively, the second string has i second memory cells, the i second memory cells are electrically connected in series, arranged along the third direction, and connected to the i second word lines, respectively, the second semiconductor pillar has a third string provided on a third side and a fourth string provided on a fourth side, the third string has i third memory cells, the i third memory cells are electrically connected in series, arranged along the third direction, and connected to the i first word lines, respectively, the fourth string has i fourth memory cells, the i fourth memory cells are electrically connected in series, arranged along the third direction, and connected to the i second word lines, respectively, a position of the first of the first word line of the i first word lines is closest to a position of the source line, and a position of the i-th of the first word line of the i first word lines is farthest from the position of the source line, a position of the first of the second word line of the i second word lines is closest to the position of the source line, and the position of the i-th of the second word line of the i second word lines is farthest from the position of the source line, the i first memory cells and the i second memory cells share the first semiconductor layer, the i third memory cells and the i fourth memory cells share the second semiconductor layer, in writing data to the k-th (k is an integer smaller than i and greater than 1) first memory cell, in a first operation of the writing operation, the driver supplies the k-th first word line with a first voltage larger than a reference voltage, and supplies the k-th second word line with a second voltage smaller than the reference voltage, the first semiconductor pillar is electrically connected to a first bit line, the second semiconductor pillar is electrically connected to a second bit line, in the first operation, the driver supplies the reference voltage to the first bit line and the second bit line, and raises the voltage of a second bit line from the reference voltage to a third voltage larger than the reference voltage, and in the first operation, the driver supplies the first voltage to the first word line other than a k-th first word line and a k-1-th or lower of the second word line, and supplies the second voltage to the second word line of k+1-th or higher of the second word line, a k-th or higher of the first memory cell and a k-th or higher of the third memory cell are turned on, and a k-th or higher of the second memory cell and a k-th or higher of the fourth memory cell are turned off.

9. The semiconductor memory device according to claim 8, wherein in the first operation,
a voltage of each second channel of a k-th or higher of the second memory cell and a voltage of each fourth channel of a k-th or higher of the fourth memory cell rise to a fourth voltage higher than the reference voltage.

10. A semiconductor memory device comprising:
a source line extending in a first direction and a second direction intersecting the first direction;
a first semiconductor pillar having a first semiconductor layer extending in a third direction intersecting the first direction and the second direction and electrically connected to the source line;
a second semiconductor pillar having a second semiconductor layer extending in the third direction and electrically connected to the source line;
i first word lines (i is an integer of 4 or more) stacked in the third direction;
i second word lines stacked in the third direction and having the same positions as the i first word lines with respect to the third direction, respectively; and
a driver, wherein
the first semiconductor pillar has a first string provided on a first side and a second string provided on a second side,
the first string has i first memory cells,
the i first memory cells are electrically connected in series, arranged along the third direction, and connected to the i first word lines, respectively,
the second string has i second memory cells,
the i second memory cells are electrically connected in series, arranged along the third direction, and connected to the i second word lines, respectively,
the second semiconductor pillar has a third string provided on a third side and a fourth string provided on a fourth side,
the third string has i third memory cells,
the i third memory cells are electrically connected in series, arranged along the third direction, and connected to the i first word lines, respectively,
the fourth string has i fourth memory cells,
the i fourth memory cells are electrically connected in series, arranged along the third direction, and connected to the i second word lines, respectively,
a position of the first of the first word line of the i first word lines is closest to a position of the source line, and a position of the i-th of the first word line of the i first word lines is farthest from the position of the source line,
a position of the first of the second word line of the i second word lines is closest to the position of the source line, and the position of the i-th of the second word line of the i second word lines is farthest from the position of the source line,
the i first memory cells and the i second memory cells share the first semiconductor layer,
the i third memory cells and the i fourth memory cells share the second semiconductor layer,
in writing data to the k-th (k is an integer smaller than i and greater than 1) first memory cell, in a first operation of the writing operation, the driver supplies the k-th first word line with a first voltage larger than a reference voltage, and supplies the k-th second word line with a second voltage smaller than the reference voltage,
the first semiconductor pillar is electrically connected to a first bit line,
the second semiconductor pillar is electrically connected to a second bit line,
in the first operation, the driver supplies the reference voltage to the first bit line and the second bit line, and raises the voltage of a second bit line from the reference voltage to a third voltage larger than the reference voltage, and
in the first operation,
the driver supplies the first voltage to the first word line other than a k-th first word line and a k-2-th or lower of the second word line, and supplies a k-1-th or higher of the second word line,
a k-th or higher of the first memory cell and a k-th or higher of the third memory cell are turned on, and
a k-th or higher of the second memory cell and a k-th or higher of the fourth memory cell are turned off.

11. The semiconductor memory device according to claim 10, wherein in the first operation,
a voltage of each second channel of the k-th or higher of the second memory cell and a voltage of each fourth channel of the k-th or higher of the fourth memory cell rise to a fourth voltage higher than the reference voltage.

12. A semiconductor memory device comprising:
a source line extending in a first direction and a second direction intersecting the first direction;
a first semiconductor pillar having a first semiconductor layer extending in a third direction intersecting the first direction and the second direction and electrically connected to the source line;
a second semiconductor pillar having a second semiconductor layer extending in the third direction and electrically connected to the source line;
i first word lines (i is an integer of 4 or more) stacked in the third direction;
i second word lines stacked in the third direction and having the same positions as the i first word lines with respect to the third direction, respectively; and
a driver, wherein
the first semiconductor pillar has a first string provided on a first side and a second string provided on a second side,
the first string has i first memory cells,
the i first memory cells are electrically connected in series, arranged along the third direction, and connected to the i first word lines, respectively,
the second string has i second memory cells,
the i second memory cells are electrically connected in series, arranged along the third direction, and connected to the i second word lines, respectively,
the second semiconductor pillar has a third string provided on a third side and a fourth string provided on a fourth side,
the third string has i third memory cells,
the i third memory cells are electrically connected in series, arranged along the third direction, and connected to the i first word lines, respectively,
the fourth string has i fourth memory cells,
the i fourth memory cells are electrically connected in series, arranged along the third direction, and connected to the i second word lines, respectively,
a position of the first of the first word line of the i first word lines is closest to a position of the source line, and a position of the i-th of the first word line of the i first word lines is farthest from the position of the source line, a position of the first of the second word line of the i second word lines is closest to the position of the source line, and the position of the i-th of the second word line of the i second word lines is farthest from the position of the source line, the i first memory cells and the i second memory cells share the first semiconductor layer, the i third memory cells and the i fourth memory cells share the second semiconductor layer, in writing data to the k-th (k is an integer smaller than i and greater than 1) first memory cell, in a first operation of the writing operation, the driver supplies the k-th first word line with a first voltage larger than a reference voltage, and supplies the k-th second word line with a second voltage smaller than the reference voltage, the first semiconductor pillar and the second semiconductor pillar are electrically connected to the source line, in the first operation, the driver raises the voltage of a second bit line from the reference voltage to a third voltage larger than the reference voltage, and in the first operation, the driver supplies the first voltage to the k-th or lower of the first word line, and supplies the second voltage to the k-th or lower of the second word line, the k-th or lower of the first memory cell and the k-th or lower of the third memory cell are turned on, and the k-th or lower of the second memory cell and the k-th or lower of the fourth memory cell are turned off.

13. The semiconductor memory device according to claim 12, wherein in the first operation, a voltage of each second channel of the k-th or lower of the second memory cell and a voltage of each fourth channel of the k-th or lower of the fourth memory cell rise to a fourth voltage higher than the reference voltage.

* * * * *